United States Patent
Yamaguchi et al.

(10) Patent No.: US 7,856,463 B2
(45) Date of Patent: Dec. 21, 2010

(54) PROBABILITY DENSITY FUNCTION SEPARATING APPARATUS, PROBABILITY DENSITY FUNCTION SEPARATING METHOD, TESTING APPARATUS, BIT ERROR RATE MEASURING APPARATUS, ELECTRONIC DEVICE, AND PROGRAM

(75) Inventors: Takahiro Yamaguchi, Tokyo (JP); Harry Hou, Santa Clara, CA (US); Dave Armstrong, Santa Clara, CA (US)

(73) Assignee: Advantest Corporation, Tokyo (JP)

(*) Notice: Subject to any disclaimer, the term of this patent is extended or adjusted under 35 U.S.C. 154(b) by 1138 days.

(21) Appl. No.: 11/463,644

(22) Filed: Aug. 10, 2006

(65) Prior Publication Data

US 2008/0098055 A1 Apr. 24, 2008

Related U.S. Application Data

(60) Provisional application No. 60/783,820, filed on Mar. 21, 2006.

(51) Int. Cl.
G06F 17/10 (2006.01)
(52) U.S. Cl. ...................................... 708/300
(58) Field of Classification Search ................ None
See application file for complete search history.

(56) References Cited

U.S. PATENT DOCUMENTS

| | | | |
|---|---|---|---|
| 7,191,080 B2* | 3/2007 | Stephens | 702/69 |
| 2002/0120420 A1 | 8/2002 | Wilstrup et al. | |
| 2002/0150303 A1* | 10/2002 | Russell | 382/257 |
| 2003/0115017 A1 | 6/2003 | Sun et al. | |
| 2006/0229836 A1* | 10/2006 | Stephens | 702/69 |
| 2007/0299635 A1* | 12/2007 | Lang et al. | 702/190 |
| 2008/0077357 A1* | 3/2008 | Yamaguchi et al. | 702/181 |
| 2008/0189064 A1* | 8/2008 | Yamaguchi et al. | 702/69 |
| 2009/0043537 A1* | 2/2009 | Yamaguchi et al. | 702/181 |
| 2009/0182530 A1* | 7/2009 | Yamaguchi et al. | 702/181 |

(Continued)

FOREIGN PATENT DOCUMENTS

JP 2002502041 T 1/2002

(Continued)

OTHER PUBLICATIONS

International Search Authority/JP. International Search Report dated Aug. 10, 2006. International Application No. PCT/JP2007/065718. International Filing Date: Aug. 10, 2007. Form PCT/ISA/210. Japanese Language. 3 pages.

(Continued)

Primary Examiner—David H Malzahn
(74) Attorney, Agent, or Firm—Sterne, Kessler, Goldstein & Fox P.L.L.C.

(57) ABSTRACT

There is provided a probability density function separating apparatus that separates a predetermined component from a given probability density function. The apparatus includes: a domain transforming section that is supplied with the probability density function and transforms the probability density function into a spectrum in a frequency domain; and a deterministic component computing section that multiplies a multiplier coefficient according to a type of distribution of a deterministic component included in the given probability density function by a first null frequency of the spectrum in the frequency domain and computes a peak to peak value of the probability density function with the deterministic component.

29 Claims, 44 Drawing Sheets

U.S. PATENT DOCUMENTS

| | | | |
|---|---|---|---|
| 2009/0234604 A1* | 9/2009 | Hou et al. | 702/69 |
| 2009/0326845 A1* | 12/2009 | Yamaguchi et al. | 702/76 |
| 2010/0080274 A1* | 4/2010 | Ishida | 375/226 |

FOREIGN PATENT DOCUMENTS

| | | |
|---|---|---|
| JP | 2003-57280 | 2/2003 |
| JP | 2004-125552 | 4/2004 |
| JP | 2005-513841 | 5/2005 |
| WO | WO 03/052670 | 6/2003 |

OTHER PUBLICATIONS

International Search Authority/JP. International Search Report dated Aug. 10, 2006. International Application No. PCT/JP2007/065718. International Filing Date: Aug. 10, 2007. Form PCT/ISA/237. Japanese Language. 3 pages.

Japan Patent Office. Japanese Search Report. International Application No. JP2007/055761. International Filing Date: Mar. 20, 2007. Japanese Language. 5 pages.

Japan Patent Office. Japanese Search Report. International Application No. JP2007/055761. International Filing Date: Mar. 20, 2007. English Language Translation. 1 page.

Li, Mike P. et al. A New Method for Jitter Decomposition Through Its Distribution Tall Fitting. Wavecrest Corportion. ITC International Test Conference. Copyright 1999 IEEE. Paper 302. pp. 788-794.

Hänsel, Gert et al. Implementation of an Economic Jitter Compliance Test for a Multi-Gigabit Device on ATE. Agilent Technologies, Böblingen, Germany. ITC International Test Conferene. Copyright 2004 IEEE. Paper 46.2. pp. 1303-1312.

Li, Mike et al. "Paradignm Shift for Jitter and Noise in Design and Test > GB/8 Communication Systems." (An Invited Paper for ICCD 2003). Wavecrest Corporation. Proceedings of the $21^{st}$ International Conference on Computer Design (ICCO'03). © 2003 IEEE. pp. 1-6.

German Patent & Trademark Office. File No. 11 2007 001 890.9-35. Applicant Name: Advantest Corporation. German Office Action dated Jun. 7, 2010. English Language Translation. 11 pages.

German Patent & Trademark Office. File No. 11 2007 001 890.9-35. Applicant Name: Advantest Corporation. German Office Action dated Jun. 7, 2010. German Language. 8 pages.

German Patent & Trademark Office. File No. 11 2007 001 891.7-35. Applicant Name: Advantest Corporation. German Office Action dated Apr. 14, 2010. English Language Translation. 11 pages.

German Patent & Trademark Office. File No. 11 2007 001 891.7-35. Applicant Name: Advantest Corporation. German Office Action dated Apr. 14, 2010. German Language. 7 pages.

\* cited by examiner

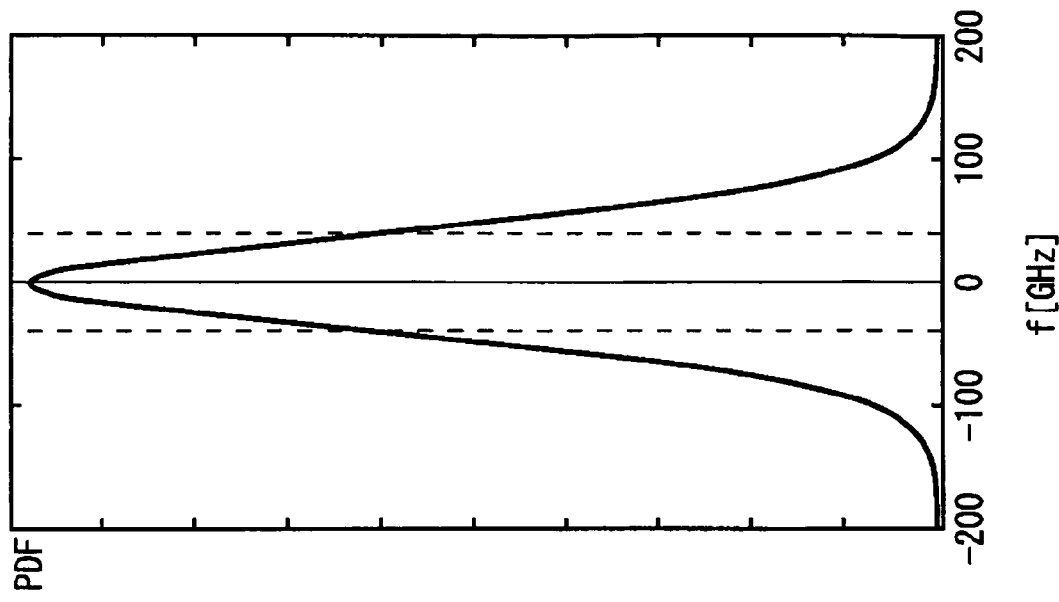
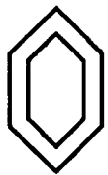
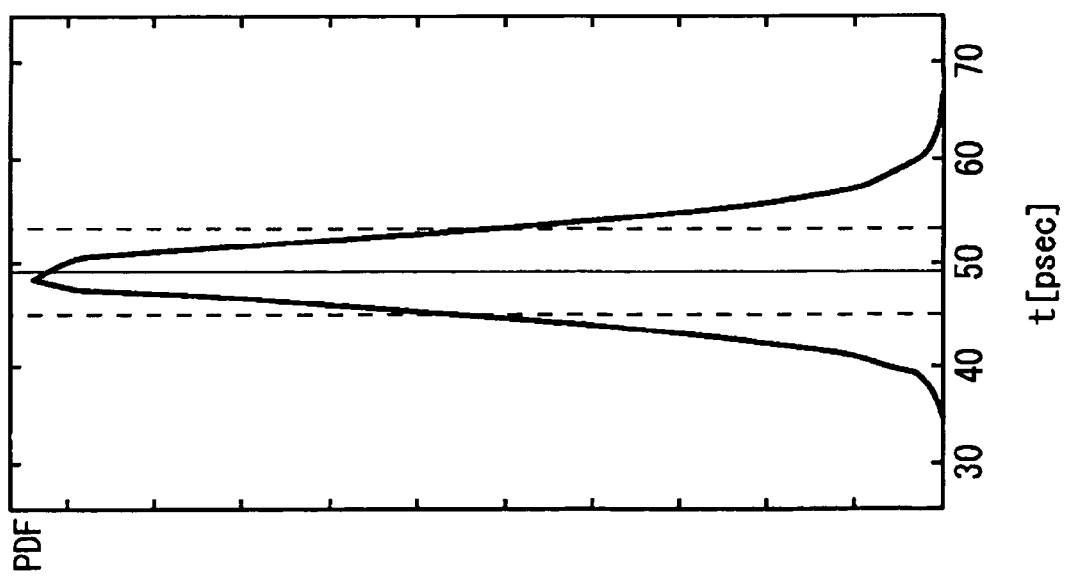
FIG. 3

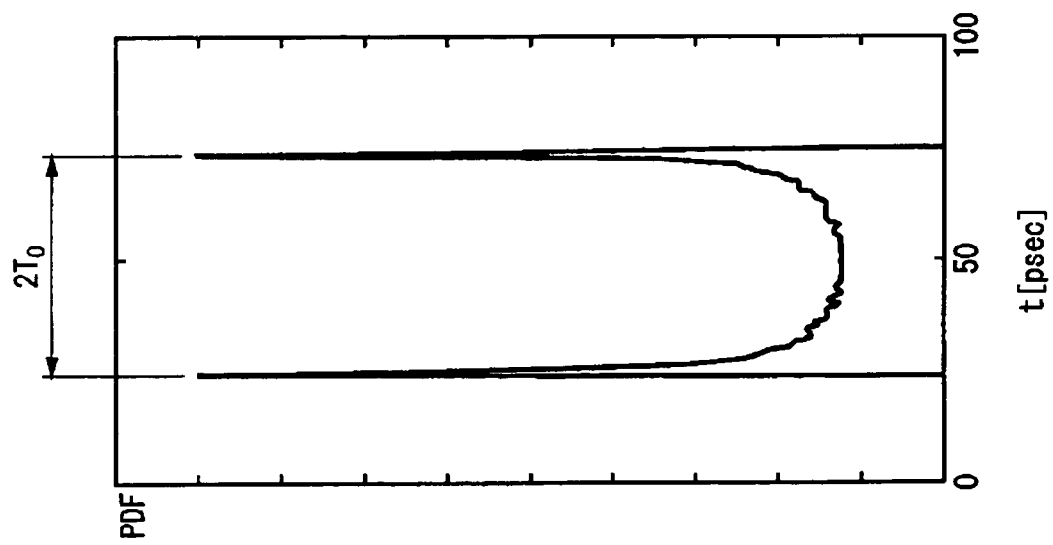
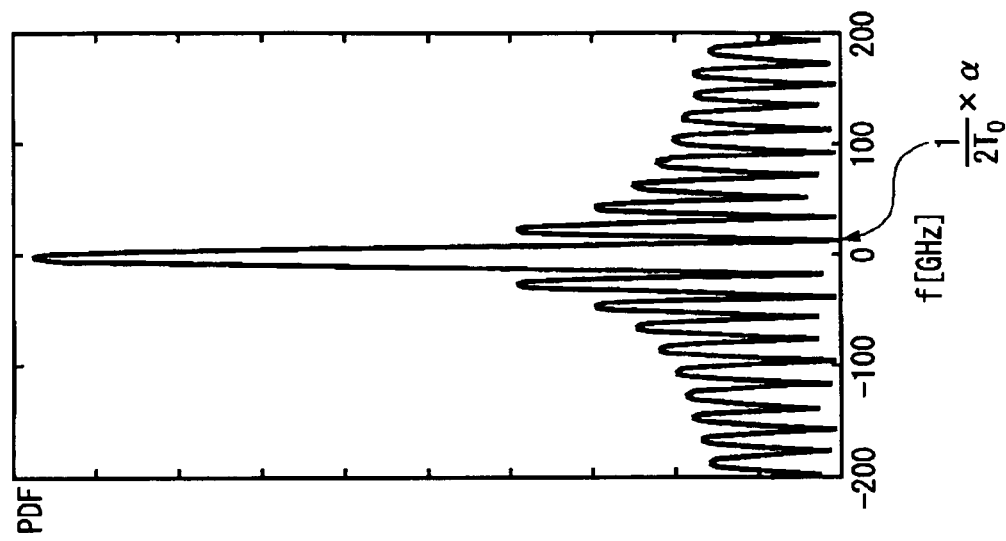
FIG. 4A

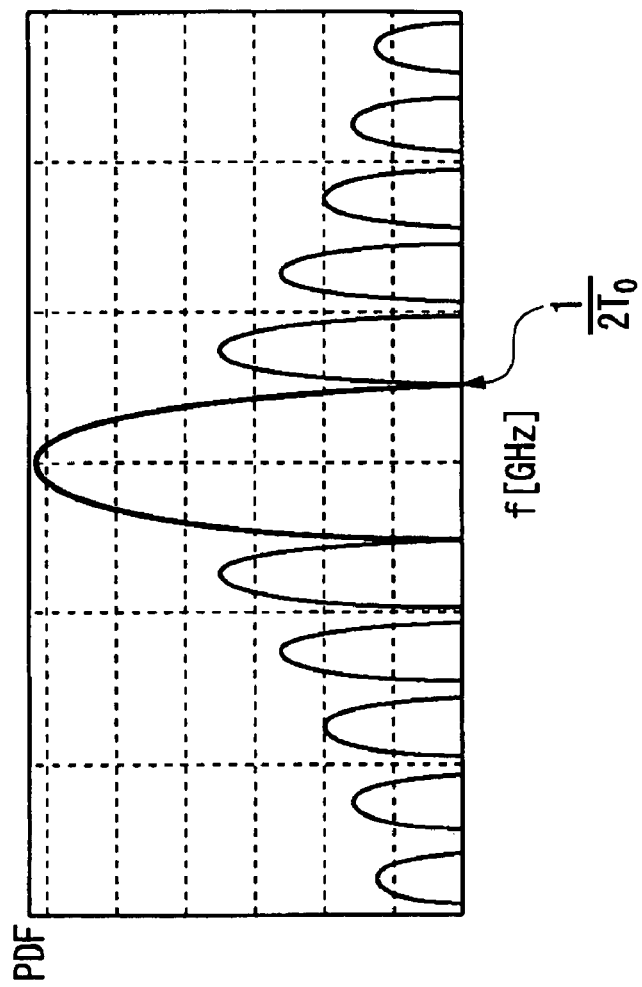
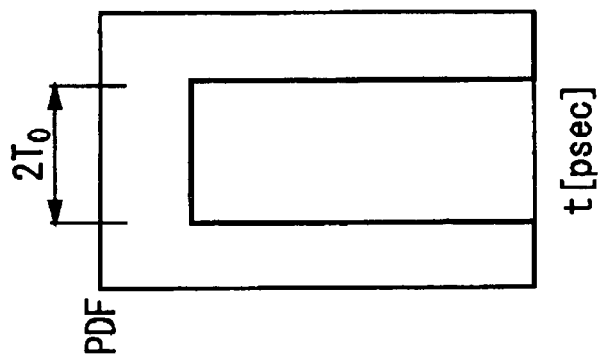
FIG. 4B

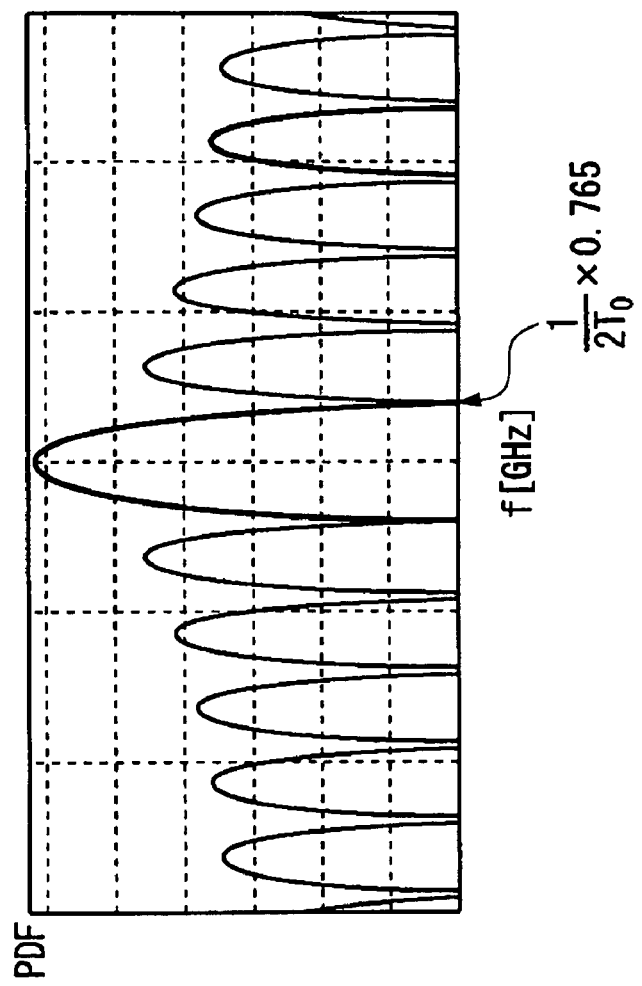
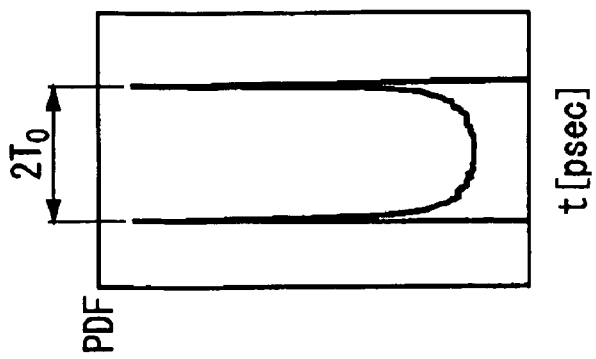
FIG. 4C

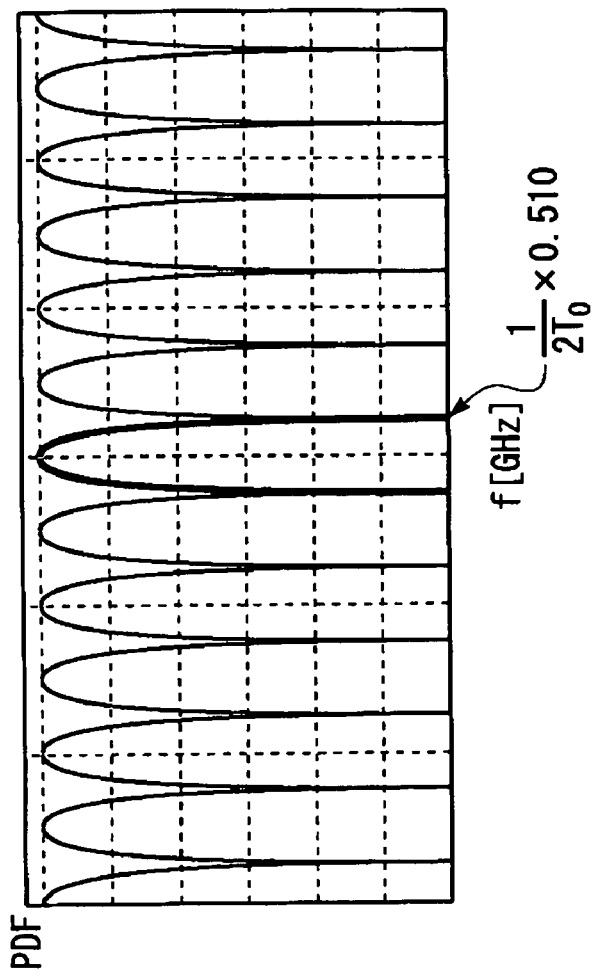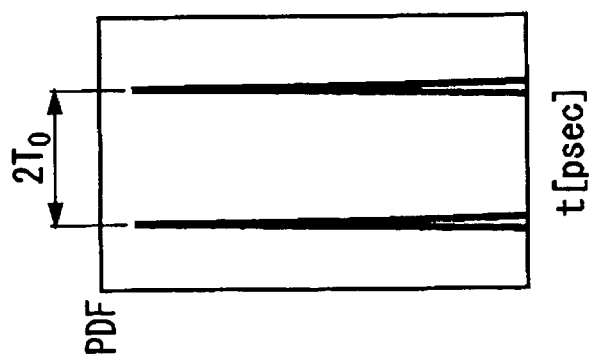
FIG. 4D

|  | EXPECTED VALUE | CONVENTIONAL METHOD | PROBABILITY DENSITY FUNCTION SEPARATING APPARATUS 100 |
|---|---|---|---|
| WITHOUT TIMING ERROR | DJ | 50ps | 44.5ps (11%) | 49.9ps (0.2%) |
| | RJ | 4.02ps | 4.89ps (22%) | 4.22ps (5.0%) |
| WITH TIMING ERROR | DJ | 50ps | 44.9ps (10%) | 49.9ps (0.2%) |
| | RJ | 4.02ps | 4.78ps (19%) | 4.02ps (0.0%) |

FIG. 10

| JITTER AMPLITUDE | EXPECTED VALUE | CONVENTIONAL METHOD | PROBABILITY DENSITY FUNCTION SEPARATING APPARATUS 100 |
|---|---|---|---|
| 10mV | 12ps | 10.3ps (14%) | 9.77ps (19%) |
| 50mV | 62ps | 69.3ps (12%) | 60.5ps (2.4%) |
| 100mV | 120ps | 139ps (16%) | 126ps (5.0%) |

FIG. 15

10.1GHz

| Bench-marking | Expected Values [d] | | Conventional Method | Proposed Method |
|---|---|---|---|---|
| SJ*SmallSJ | DJ | 50 ps | — | 49.0 ps |
| SJ*SJ | DJ | 100 ps | 80.5 ps | 99.0 ps |
| | Number of DJ? | | Impossible | Possible |
| | Number of DJ | 2 | — | 2 |

FIG. 22

| Bench-marking | Expected Values [c] | | Conventional Method | Proposed Method |
|---|---|---|---|---|
| RJ only | DJ | 0.00 ps | 0.00 ps | 0.00 ps |
| | RJ | 4.02 ps | 4.54 ps rms | 3.82 ps rms |
| RJ&SJ | DJ | 50 ps | 44.5 ps | 51.2 ps |
| | RJ | 4.02 ps | 4.89 ps rms | 3.72 ps rms (3.72 ps rms) |
| RJ&SJ with Timing Error | DJ | 50 ps | 44.9 ps | 51.2 ps |
| | RJ | 4.02 ps | 4.78 ps rms | 3.58 ps rms (3.67 ps rms) |

FIG. 30

|  | Small DJ | | Large DJ | |
| --- | --- | --- | --- | --- |
|  | RJ $\sigma$ | DJ pk-to-pk | RJ $\sigma$ | DJ pk-to-pk |
| TESTING APPARATUS 300 | 1.1% | 7.3% | 2.8% | 2.7% |
| CONVENTIONAL METHOD | 17.0% | 20.0% | 23.0% | 6.9% |

FIG. 34

PROBABILITY DENSITY FUNCTION SEPARATING APPARATUS, PROBABILITY DENSITY FUNCTION SEPARATING METHOD, TESTING APPARATUS, BIT ERROR RATE MEASURING APPARATUS, ELECTRONIC DEVICE, AND PROGRAM

CROSS REFERENCE TO RELATED APPLICATION

The present application claims priority from a U.S. Provisional Application(s) No. 60/783,820 filed on Mar. 21, 2006, the contents of which are incorporated herein by reference.

BACKGROUND OF THE INVENTION

1. Field of the Invention

The present invention relates to a probability density function separating apparatus, a probability density function separating method, a testing apparatus, a bit error rate measuring apparatus, an electronic device, and a program. More particularly, the present invention relates to an apparatus and a method for separating a deterministic component and a random component from a probability density function.

2. Related Art

A method for separating a probability density function with a deterministic component and a probability density function with a random jitter component can be used in an oscilloscope, a time interval analyzer, a universal time frequency counter, automated test equipment, a spectrum analyzer, a network analyzer, and so on. A measured signal may be an electrical signal or an optical signal.

When amplitude of the measured signal is degraded, a probability by which a reception bit one is erroneously decided to a bit zero is increased. Similarly, when a timing of the measured signal is degraded, a probability of an erroneous decision is increased in proportion to the degradation. It takes longer observation time than $T_b/P_e$ to measure these bit error rates $P_e$ (however, $T_b$ shows a bit rate). As a result, it takes long measurement time to measure an extremely small bit error rate.

For this reason, as measures against amplitude degradation, there has been used a method for setting a bit decision threshold value to a comparatively large value to measure a bit error rate and extrapolate it into an area with an extremely small bit error rate. A deterministic component of a probability density function is bounded and causes a bounded bit error rate. On the other hand, a random component of a probability density function is unbounded. Therefore, a technique for accurately separating a deterministic component and a random component included in measured probability density function and causing bit error rate becomes important.

Conventionally, as a method for separating a deterministic component and a random component included in a probability density function or the like, for example, the invention disclosed in US 2002/0120420 has been known. According to this method, an estimate of variance of a probability density function over a predetermined time interval is computed and the computed estimate of variance is transformed into a frequency domain, in order to determine a random component and a period component constituting the variance. The method uses changing a measured time interval from one cycle to N cycles to measure an autocorrelation function of a period component and an autocorrelation function of a random component and making the Fourier transform respectively correspond to a line spectrum and a white noise spectrum. Here, the variance is a sum of a correlation coefficient of a period component and a correlation coefficient of a random component.

However, a probability density function is given by convolution integrating a deterministic component and a random component. Therefore, according to this method, it is not possible to separate a deterministic component and a random component from a probability density function.

Moreover, as another method for separating a deterministic component and a random component included in a probability density function or the like, for example, the invention disclosed in US2005/0027477 has been known. As shown in FIG. 2 to be described below, according to this method, both tails of a probability density function are fitted to Gaussian distribution in order to separate two random components from the probability density function. In this method, random components and a deterministic component are performed fit of Gaussian curves under the assumption that both components do not interfere with each other, in order to separate a random component corresponding to Gaussian distribution.

However, it is generally difficult to uniquely determine a boundary between a random component and a deterministic component, and it is difficult to separate a random component with high precision in this method.

Moreover, as shown in FIG. 2 to be described below, according to this method, a deterministic component is computed based on a difference $D(\delta\delta)$ between two time instants corresponding to a mean value of each random component.

However, for example, when a deterministic component is a sine wave or the like, it is experimentally confirmed that this difference $D(\delta\delta)$ shows a smaller value than $D(p-p)$ of a true value. In other words, according to this method, since only an ideal deterministic component by a square wave can be approximated, various deterministic components such as a deterministic component of a sine wave are not measured. Furthermore, a measurement error of a random component is also large.

Moreover, about a probability density function of which a plurality of deterministic components are convolution integrated, a method by which each component can be separated from the function does not exist.

SUMMARY OF THE INVENTION

Therefore, it is an object of the present invention to provide a probability density function separating apparatus, a probability density function separating method, a noise separating apparatus, a noise separating method, a testing apparatus, and a testing method that can solve the foregoing problems. The above and other objects can be achieved by combinations described in the independent claims. The dependent claims define further advantageous and exemplary combinations of the present invention.

That is, according to the first aspect of the present invention, there is provided a probability density function separating apparatus that separates a predetermined component from a given probability density function. The probability density function separating apparatus includes: a domain transforming section that is supplied with the probability density function and transforms the probability density function into a spectrum in a frequency domain; and a determinate component computing section that multiplies a multiplier coefficient according to a type of distribution of a determinate component included in the given probability density function by a first null frequency of the spectrum in the frequency domain and computes a peak to peak value of the probability density function with the determinate component.

The probability density function separating apparatus may previously store the multiplier coefficient every type of distribution of the determinate component and compute the peak to peak value by means of the multiplier coefficient corresponding to the reported type of distribution of the determinate component.

The probability density function separating apparatus may further include a standard deviation computing section that computes standard deviation of a random component included in the probability density function based on the spectrum.

The standard deviation computing section may compute the standard deviation based on a level of a predetermined frequency component of the spectrum.

The standard deviation computing section may compute the standard deviation based on a ratio between a level of a first frequency component and a level of a second frequency component of the spectrum.

The standard deviation computing section may calculate a value obtained by dividing the ratio between the level of the first frequency component and the level of the second frequency component of the spectrum by a ratio between a level of the first frequency component and a level of the second frequency component of a spectrum of the determinate component, and compute the standard deviation based on this value.

The probability density function separating apparatus may further include a random component computing section that computes a probability density function with a random component based on the standard deviation.

The determinate component computing section may include: a candidate value computing section that previously stores the multiplier coefficient every type of distribution of the determinate component and computes each peak to peak value when each multiplier coefficient is used; a candidate function computing section that respectively computes a probability density function with the determinate component based on each peak to peak value computed from the candidate value computing section; a synthesizing section that respectively generates composite probability density functions made by respectively synthesizing each probability density function with the determinate component computed from the candidate function computing section and the probability density function with the random component computed from the random component computing section; and a selecting section that compares each composite probability density function generated from the synthesizing section with the given probability density function and selects one peak to peak value from the plurality of peak to peak values computed from the candidate value computing section based on the comparison result.

The determinate component computing section may detect the first null frequency of the spectrum based on a peak of a waveform obtained by second-order differentiating the spectrum output from the domain transforming section by frequency.

According to the second aspect of the present invention, there is provided a probability density function separating apparatus that separates a predetermined component from a given probability density function. The probability density function separating apparatus includes: a domain transforming section that is supplied with the probability density function and transforms the probability density function into a spectrum in a frequency domain; a standard deviation computing section that computes standard deviation of a random component included in the probability density function based on the spectrum; a random component computing section that computes an absolute value (Magnitude Spectra) of a probability density function in a frequency domain with a random component based on the standard deviation; and a determinate component computing section that divides the spectrum transformed by the domain transforming section by the absolute value of the probability density function in the frequency domain with the random component computed from the random component computing section and computes a determinate component included in the given probability density function.

The determinate component computing section may divide the spectrum transformed by the domain transforming section by the absolute value of the probability density function in the frequency domain with the random component computed from the random component computing section and transform a spectrum in a predetermined frequency range into a function in a time domain among the division results, in order to compute a probability density function in a time domain with the determinate component.

According to the third aspect of the present invention, there is provided a probability density function separating method for separating a predetermined component from a given probability density function. The probability density function separating method includes: a domain transforming step of being supplied with the probability density function and transforming the probability density function into a spectrum in a frequency domain; and a determinate component computing step of multiplying a multiplier coefficient according to a type of distribution of a determinate component included in the given probability density function by a first null frequency of the spectrum in the frequency domain and computing a peak to peak value of the probability density function with the determinate component.

The probability density function separating method may further include a standard deviation computing step of computing standard deviation of a random component included in the probability density function based on the spectrum.

According to the fourth aspect of the present invention, there is provided a probability density function separating method for separating a predetermined component from a given probability density function. The probability density function separating method includes: a domain transforming step of being supplied with the probability density function and transforming the probability density function into a spectrum in a frequency domain; a standard deviation computing step of computing standard deviation of a random component included in the probability density function based on the spectrum; a random component computing step of computing an absolute value (Magnitude Spectra) of a probability density function in a frequency domain with a random component based on the standard deviation; and a determinate component computing step of dividing the spectrum transformed in the domain transforming step by the absolute value of the probability density function in the frequency domain with the random component computed in the random component computing step and computing a determinate component included in the given probability density function.

According to the fifth aspect of the present invention, there is provided a program making a computer function as a probability density function separating apparatus that separates a predetermined component from a given probability density function. The program makes the computer function as: a domain transforming section that is supplied with the probability density function and transforms the probability density function into a spectrum in a frequency domain; and a determinate component computing section that multiplies a multiplier coefficient according to a type of distribution of a determinate component included in the given probability density function by a first null frequency of the spectrum in the frequency domain and computes a peak to peak value of the probability density function with the determinate component.

The program may further make the computer function as a standard deviation computing section that computes standard deviation of a random component included in the probability density function based on the spectrum.

The program may make the computer function as the standard deviation computing section that calculates a value obtained by dividing a ratio between a level of the first frequency component and a level of the second frequency component of the spectrum by a ratio between a level of the first frequency component and a level of the second frequency component of a spectrum of the determinate component and computes the standard deviation based on this value.

According to the sixth aspect of the present invention, there is provided a program making a computer function as a probability density function separating apparatus that separates a predetermined component from a given probability density function. The program makes the computer function as: a domain transforming section that is supplied with the probability density function and transforms the probability density function into a spectrum in a frequency domain; a standard deviation computing section that computes standard deviation of a random component included in the probability density function based on the spectrum; a random component computing section that computes an absolute value (Magnitude Spectra) of a probability density function in a frequency domain with a random component based on the standard deviation; and a determinate component computing section that divides the spectrum transformed by the domain transforming section by the absolute value of the probability density function in the frequency domain with the random component computed from the random component computing section and computes a determinate component included in the given probability density function.

According to the seventh aspect of the present invention, there is provided a testing apparatus that tests a device under test. The testing apparatus includes: a level comparing section that compares a level of an output signal output from the device under test with a given reference value and outputs a comparison result; a timing comparing section that samples the comparison result according to a given timing signal and converts the sampled result into digital data; a probability density function computing section that computes a probability density function of the output signal based on the digital data; and a probability density function separating apparatus that separates a predetermined component from the probability density function, in which the probability density function separating apparatus includes: a domain transforming section that is supplied with the probability density function and transforms the probability density function into a spectrum in a frequency domain; and a determinate component computing section that multiplies a multiplier coefficient according to a type of distribution of a determinate component included in the given probability density function by a first null frequency of the spectrum in the frequency domain and computes a peak to peak value of the probability density function with the determinate component.

The probability density function separating apparatus may further include a standard deviation computing section that computes standard deviation of a random component included in the probability density function based on the spectrum.

The standard deviation computing section may calculate a value obtained by dividing a ratio between a level of the first frequency component and a level of the second frequency component of the spectrum by a ratio between a level of the first frequency component and a level of the second frequency component of a spectrum of the determinate component and compute the standard deviation based on this value.

The level comparing section may be supplied with the reference value with a constant value, the timing comparing section may sample the comparison result according to the timing signal of which a phase for the output signal is sequentially changed, and the probability density function computing section may compute a probability density function with a jitter component included in the output signal based on the digital data.

The level comparing section may be sequentially supplied with the different reference values, the timing comparing section may sample the comparison result according to the timing signal substantially synchronized with the output signal, and the probability density function computing section may compute a probability density function with an amplitude degradation component of the output signal based on the digital data.

According to the eighth aspect of the present invention, there is provided a bit error rate measuring apparatus that measures a bit error rate of output data from a device under test. The bit error rate measuring apparatus includes: a sampling section that samples a data value of the output data according to a given timing signal; an expected value comparing section that compares a sampling result by the sampling section with a given expected value; a probability density function computing section that computes a probability density function of the output data based on the comparison result by the expected value comparing section; and a probability density function separating apparatus that separates a predetermined component from the probability density function, in which the probability density function separating apparatus includes: a domain transforming section that is supplied with the probability density function and transforms the probability density function into a spectrum in a frequency domain; and a determinate component computing section that multiplies a multiplier coefficient according to a type of distribution of a determinate component included in the given probability density function by a first null frequency of the spectrum in the frequency domain and computes a peak to peak value of the probability density function with the determinate component.

The probability density function separating apparatus may further include a standard deviation computing section that computes standard deviation of a random component included in the probability density function based on the spectrum.

According to the ninth aspect of the present invention, there is provided a testing apparatus that tests a device under test. The testing apparatus includes: a level comparing section that compares a level of an output signal output from the device under test with a given reference value and outputs a comparison result; a timing comparing section that samples the comparison result according to a given timing signal and converts the sampled result into digital data; a probability density function computing section that computes a probability density function of the output signal based on the digital data; and a probability density function separating apparatus that separates a predetermined component from the probability density function, in which the probability density function separating apparatus includes: a domain transforming section that is supplied with the probability density function and transforms the probability density function into a spectrum in a frequency domain; a standard deviation computing section that computes standard deviation of a random component included in the probability density function based on the spectrum; a random component computing section that computes an absolute value of a probability density function in a frequency domain with a random component based on the standard deviation; and a determinate component computing section that divides the spectrum transformed by the domain transforming section by the absolute value of the probability density function in the frequency domain with the random component computed from the random component computing section and computes a determinate component included in the given probability density function.

According to the tenth aspect of the present invention, there is provided a bit error rate measuring apparatus that measures a bit error rate of output data from a device under test. The bit error rate measuring apparatus includes: a sampling section that samples a data value of the output data according to a given timing signal; an expected value comparing section that compares the sampling result by the sampling section with a given expected value; a probability density function computing section that computes a probability density function of the output data based on the comparison result by the expected value comparing section; and a probability density function separating apparatus that separates a predetermined component from the probability density function, in which the probability density function separating apparatus includes: a domain transforming section that is supplied with the probability density function and transforms the probability density function into a spectrum in a frequency domain; a standard deviation computing section that computes standard deviation of a random component included in the probability density function based on the spectrum; a random component computing section that computes an absolute value of a probability density function in a frequency domain with a random component based on the standard deviation; and a determinate component computing section that divides the spectrum transformed by the domain transforming section by the absolute value of the probability density function in the frequency domain with the random component computed from the random component computing section and computes a determinate component included in the given probability density function.

According to the eleventh aspect of the present invention, there is provided an electronic device that generates a predetermined signal. The electronic device includes: an operation circuit that generates the predetermined signal to output it; a probability density function computing section that measures the predetermined signal and computes a probability density function of the predetermined signal; and a probability density function separating apparatus that separates a predetermined component from the probability density function, in which the probability density function separating apparatus includes: a domain transforming section that is supplied with the probability density function and transforms the probability density function into a spectrum in a frequency domain; and a determinate component computing section that multiplies a multiplier coefficient according to a type of distribution of a determinate component included in the given probability density function by a first null frequency of the spectrum in the frequency domain and computes a peak to peak value of the probability density function with the determinate component.

The probability density function separating apparatus may further include a standard deviation computing section that computes standard deviation of a random component included in the probability density function based on the spectrum.

According to the twelfth aspect of the present invention, there is provided an electronic device that generates a predetermined signal. The electronic device includes: an operation circuit that generates the predetermined signal to output it; a probability density function computing section that measures the predetermined signal and computes a probability density function of the predetermined signal; and a probability density function separating apparatus that separates a predetermined component from the probability density function, in which the probability density function separating apparatus includes: a domain transforming section that is supplied with the probability density function and transforms the probability density function into a spectrum in a frequency domain; a standard deviation computing section that computes standard deviation of a random component included in the probability density function based on the spectrum; a random component computing section that computes an absolute value of a probability density function in a frequency domain with a random component based on the standard deviation; and a determinate component computing section that divides the spectrum transformed by the domain transforming section by the absolute value of the probability density function in the frequency domain with the random component computed from the random component computing section and computes a determinate component included in the given probability density function.

The summary of the invention does not necessarily describe all necessary features of the present invention. The present invention may also be a sub-combination of the features described above.

BRIEF DESCRIPTION OF THE DRAWINGS

FIG. 3 is a view exemplary showing a probability density function with a random component and a spectrum thereof.

FIG. 4A is a view exemplary showing a probability density function with a deterministic component and a spectrum thereof.

FIG. 4B is a view exemplary showing a probability density function with a deterministic component of uniform distribution.

FIG. 4C is a view exemplary showing a probability density function with a deterministic component of sine wave distribution.

FIG. 4D is a view exemplary showing a probability density function with a deterministic component of dual Dirac distribution.

FIG. 10 is a view exemplary showing a measurement result by a probability density function separating apparatus 100 described with reference to FIG. 1 and a measurement result by a conventional curve fitting method described in FIG. 2.

FIG. 15 is a view exemplary showing a measurement result by a probability density function separating apparatus 100 described with reference to FIG. 13 and a measurement result by a conventional curve fitting method described in FIG. 2.

FIG. 22 shows values of D(p-p) measured by a threshold process and D(δδ) measured by a conventional method for a probability density function including a plurality of deterministic jitters.

FIG. 30 is a view exemplary showing a measurement result of jitter by a jitter separating apparatus 200 and a measurement result of jitter by a conventional method.

FIG. 34 is a view exemplary showing a measurement result by a testing apparatus 300 described with reference to FIG. 33 and a measurement result by a conventional curve fitting method described with reference to FIG. 2.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
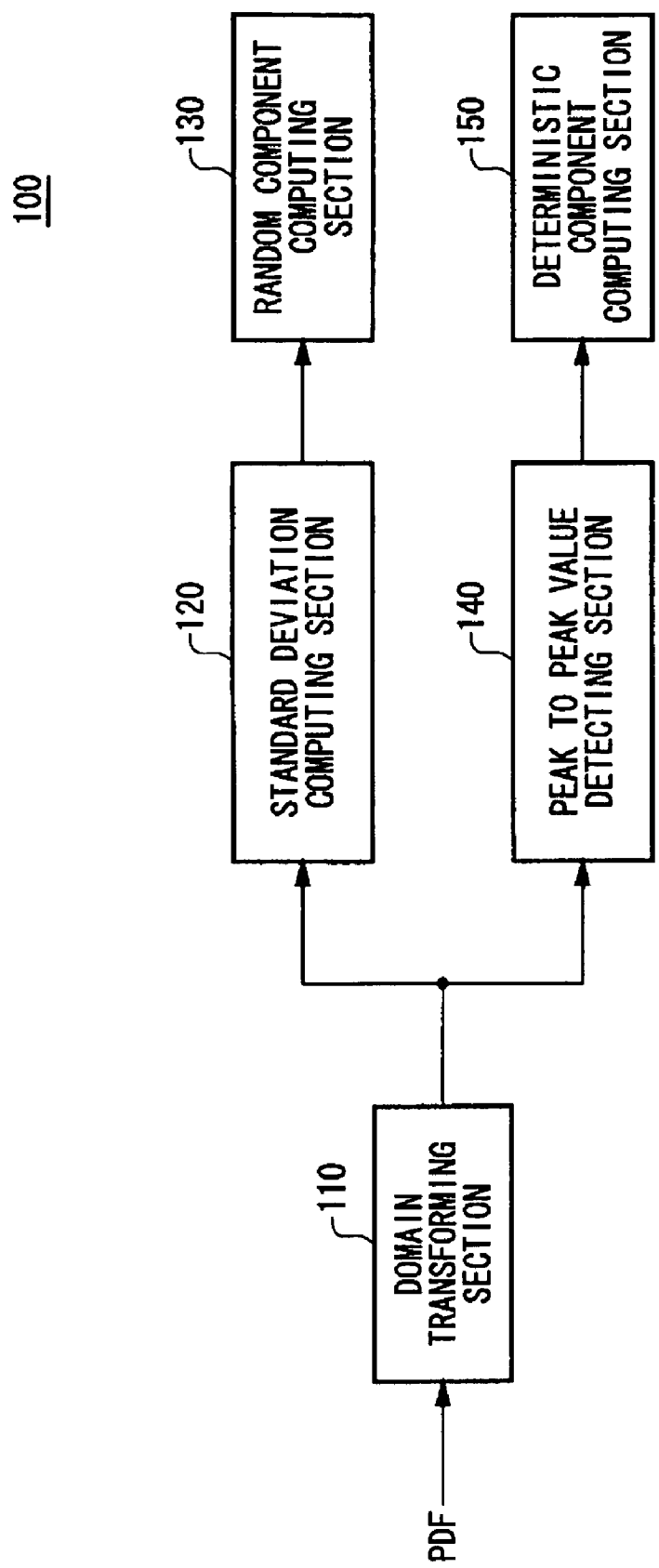
FIG. 1 is a view exemplary showing configurations of a probability density function separating apparatus 100 according to an embodiment of the present invention.

FIG. 1 is a view exemplary showing configurations of a probability density function separating apparatus 100 according to an embodiment of the present invention. The probability density function separating apparatus 100 is an apparatus that separates a predetermined component from a given probability density function, and includes an domain transforming section 110, a standard deviation computing section 120, a random component computing section 130, a peak to peak value detecting section 140, and a deterministic component computing section 150. The probability density function separating apparatus 100 according to the present example separates a random component and a deterministic component from a given probability density function (hereinafter, referred to as an input PDF). Moreover, the probability density function separating apparatus 100 may separate either of a random component or a deterministic component from an input PDF. In this case, the probability density function separating apparatus 100 may have either combination of the standard deviation computing section 120 and the random component computing section 130 or the peak to peak value detecting section 140 and the deterministic component computing section 150.

The domain transforming section 110 is supplied with an input PDF, and transforms the input PDF into a spectrum of a frequency domain. For example, an input PDF may be a function showing probability by which a predetermined signal is likely to have an edge for each of timing. In this case, the probability density function separating apparatus 100 separates a random jitter component and a deterministic jitter component included in this signal. In addition, an input PDF is not limited to the function of a time variable. When the domain transforming section 110 receives an input PDF with a predetermined variable, the domain transforming section 110 may consider this variable as a time variable and generate a spectrum of a frequency domain of the input PDF. That is to say, the present invention relates to an apparatus, a method and so on for separating a predetermined component from an input PDF that is not a time-variable function.

Moreover, the domain transforming section 110 may compute a spectrum of a frequency domain by performing Fourier transform on the input PDF. Moreover, an input PDF may be digital data, and the domain transforming section 110 may have means for transforming an input PDF with an analog signal into a digital signal.

The standard deviation computing section 120 computes standard deviation of a random component included in the input PDF based on a spectrum output from the domain transforming section 110. Since the random component included in the input PDF follows Gaussian distribution, the standard deviation computing section 120 computes standard deviation of this Gaussian distribution. A concrete computation method will be below described in FIGS. 2 to 7.

The random component computing section 130 computes a probability density function of a random component based on the standard deviation computed from the standard deviation computing section 120. For example, according to the probability density function separating apparatus 100 in the present example as described below in FIGS. 2 to 7, it is possible to uniquely determine a random component (Gaussian distribution) included in the input PDF based on the standard deviation. The random component computing section 130 may output Gaussian distribution based on standard deviation, or may output this standard deviation. Moreover, the random component computing section 130 may output this Gaussian distribution or this standard deviation in a time domain.

The peak to peak value detecting section 140 detects a peak to peak value of the input PDF based on the spectrum output from the domain transforming section 110. A concrete computation method will be below described in FIGS. 2 to 7.

The deterministic component computing section 150 computes a deterministic component of the input PDF based on the peak to peak value detected from the peak to peak value detecting section 140. A concrete computation method will be below described in FIGS. 2 to 7. The deterministic component computing section 150 may output a probability density function with a deterministic component in a time domain, or may output this peak to peak value.

Figure 2:
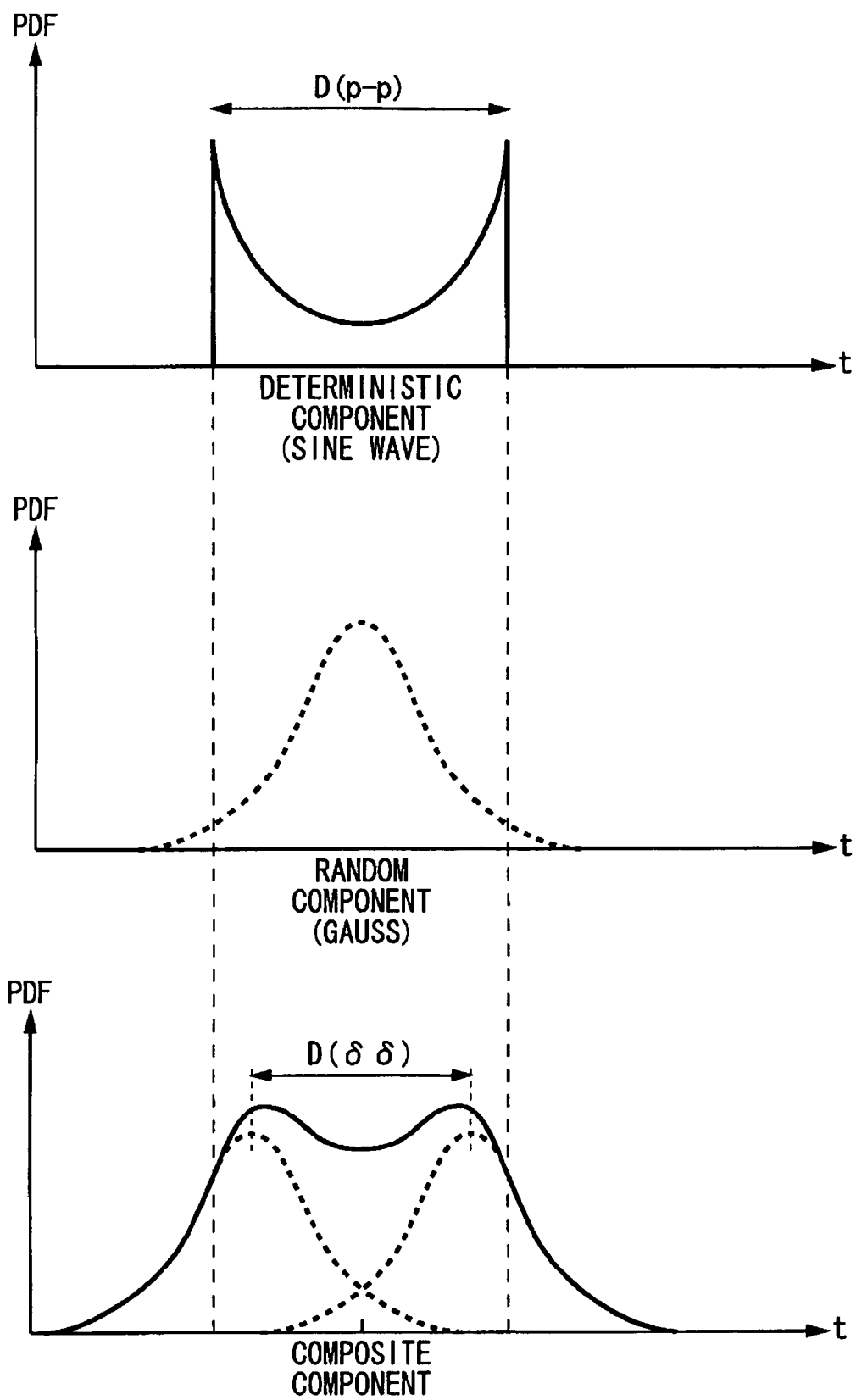
FIG. 2 is a view exemplary showing a waveform of an input PDF.

FIG. 2 is a view exemplary showing a waveform of an input PDF. In the present example, an input PDF includes a probability density function of a sine wave as a deterministic component. However, a deterministic component included in the input PDF is not limited to a sine wave. A deterministic component may be a probability density function with uniform distribution, triangular distribution, a probability density function with a dual Dirac model, a waveform prescribed by the other predetermined function. Moreover, a probability density function with a random component included in the input PDF follows Gaussian distribution.

Moreover, a deterministic component is determined by a peak interval D(p-p) of the probability density function. For example, when a deterministic component is a sine wave, a peak appears at a position according to amplitude of a sine wave in the probability density function. Moreover, when a deterministic component is a square wave, a peak appears at a position according to amplitude of a square wave in the probability density function. Moreover, when a probability density function with a deterministic component is expressed by a dual Dirac model, a deterministic component is defined by an interval D(p-p) between two delta functions.

A composite component (an input PDF) obtained by convolving a deterministic component and a random component is given by a convolution integral of a probability density function with a deterministic component and a probability density function with a random component as shown in FIG. 2. For this reason, a peak interval $D(\delta\delta)$ of a composite component becomes smaller than the peak interval D(p-p) of a deterministic component. According to a conventional curve fitting method, $D(\delta\delta)$ is detected as a interval between two peaks determining a deterministic component. However, as described above, since $D(\delta\delta)$ becomes a value smaller than D(p-p) of a true value, the separated deterministic component causes an error.

FIG. 3 is a view exemplary showing a probability density function with a random component. A left waveform shown in FIG. 3 shows a probability density function with a random component in a time domain and a right waveform shown in FIG. 3 shows a probability density function with a random component in a frequency domain. A random component p(t) in a time domain is Gaussian distribution and is shown by the following Expression.

$$p(t) = \frac{1}{\sigma\sqrt{2\pi}} e^{-(t-u)^2/(2\sigma^2)} \qquad \text{Expression (1)}$$

Here, $\sigma$ shows standard deviation of Gaussian distribution, u shows time at which Gaussian distribution shows a peak.

Then, a random component P(f) in a frequency domain obtained by performing Fourier transform on the random component p(t) in a time domain is shown by the following Expression.

$$P(f) = Ce^{-f^2/2\sigma^2} \qquad \text{Expression (2)}$$

As shown in Expression (2), the result obtained by performing Fourier transform on Gaussian distribution also shows Gaussian distribution. At this time, Gaussian distribution in a frequency domain has a peak at zero frequency.

FIG. 4A is a view exemplary showing a probability density function with a deterministic component. A left waveform shown in FIG. 4A shows a probability density function with a deterministic component in a time domain and a right waveform shown in FIG. 4A shows a probability density function with a deterministic component in a frequency domain. Moreover, it is assumed that a peak interval of a probability density function with a deterministic component in a time domain is $2T_0$.

A spectrum obtained by performing Fourier transform on a waveform in this time domain has a first null at frequency obtained by multiplying a predetermined multiplier coefficient α by $1/(2T_0)$. That is to say, it is possible to obtain a peak interval $2T_0$ defining a deterministic component by detecting a first null frequency of a spectrum in a frequency domain. In addition, a multiplier coefficient α can be determined according to the type of distribution of a deterministic component included in a probability density function.

FIG. 4B is a view exemplary showing a probability density function with a deterministic component of uniform distribution. Moreover, FIG. 4C is a view exemplary showing a probability density function with a deterministic component of sine wave distribution. Moreover, FIG. 4D is a view exemplary showing a probability density function with a deterministic component of dual Dirac distribution. Left waveforms of FIG. 4B, FIG. 4C, and FIG. 4D show a probability density function with a deterministic component in a time domain and right spectra of FIG. 4B, FIG. 4C, and FIG. 4D shows a probability density function with a deterministic component in a frequency domain. Moreover, it is considered that a peak interval of a probability density function with a deterministic component in a time domain is $2T_0$.

As shown in FIG. 4B, a first null frequency of a spectrum obtained by performing Fourier transform on a probability density function with a deterministic component of uniform distribution is substantially $1/2T_0$. That is to say, it is possible to compute a peak interval $2T_0$ by multiplying a multiplier coefficient α=1 by an reciprocal number of the first null frequency.

Moreover, as shown in FIG. 4C, a first null frequency of a spectrum obtained by performing Fourier transform on a probability density function with a deterministic component of sine wave distribution is substantially $0.765/2T_0$. That is to say, it is possible to compute a peak interval $2T_0$ by multiplying a multiplier coefficient α=0.765 by an reciprocal number of the first null frequency.

Furthermore, as shown in FIG. 4D, a first null frequency of a spectrum obtained by performing Fourier transform on a probability density function with a deterministic component of dual Dirac distribution is substantially $0.510/2T_0$. That is to say, it is possible to compute a peak interval $2T_0$ by multiplying a multiplier coefficient α=0.510 by an reciprocal number of the first null frequency.

Figure 5:
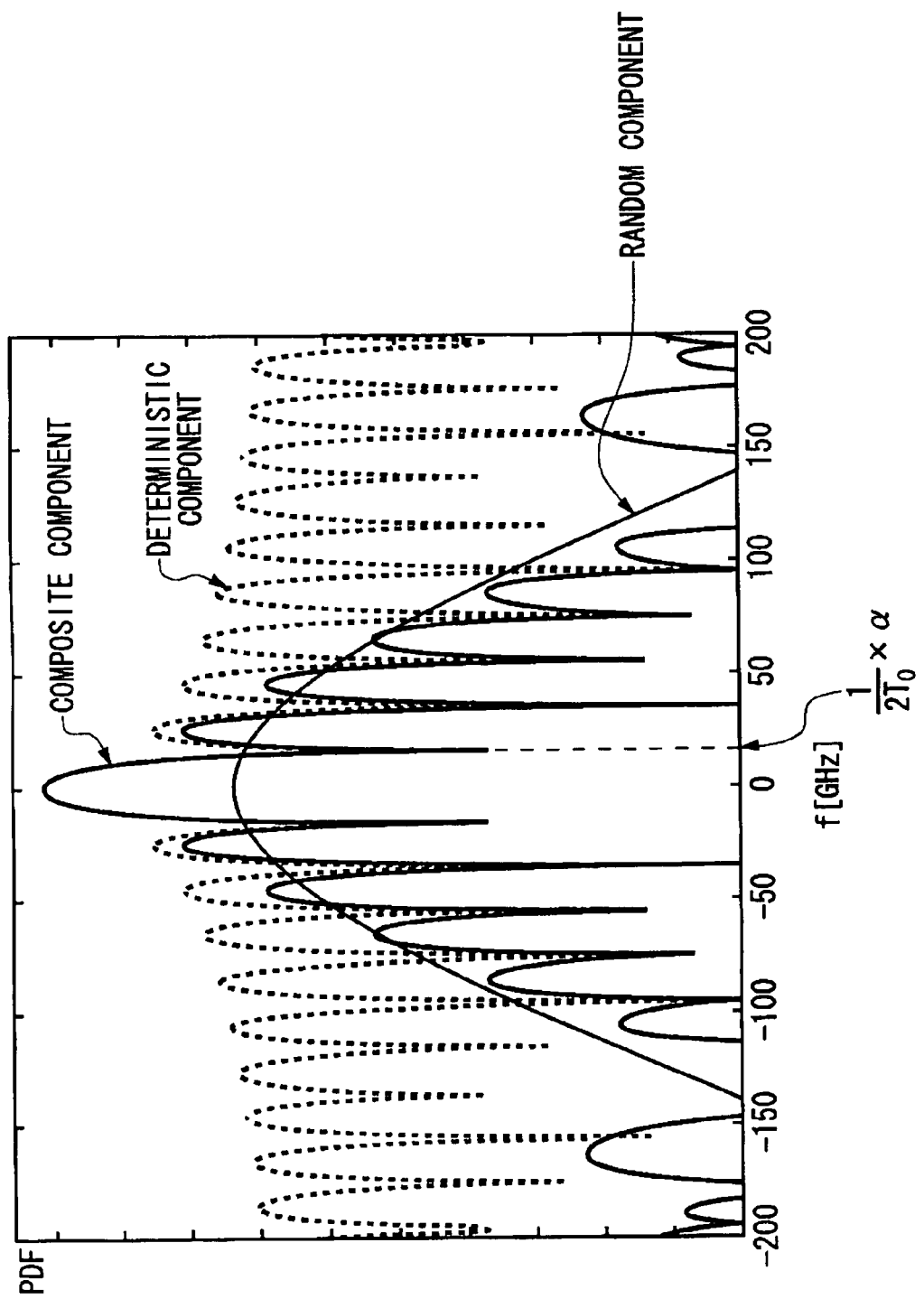
FIG. 5 is a view exemplary showing a spectrum of a probability density function obtained by convolving a deterministic component and a random component.

FIG. 5 is a view exemplary showing a spectrum of a probability density function obtained by convolving a deterministic component and a random component. A function obtained by convolving (a convolution integral) a probability density function with a deterministic component and a probability density function with a random component in a time domain becomes an input PDF. Moreover, a convolution integral in a time domain is multiplication of spectrums in a frequency domain. That is to say, a spectrum of an input PDF is shown by a product of a spectrum of a probability density function with a deterministic component and a spectrum of a probability density function with a random component.

In FIG. 5, a deterministic component is shown with a dashed line and a random component is shown with a Gaussian curve of a solid line. When a random component is multiplied by a deterministic component, each peak spectrum of the deterministic component is attenuated in proportion to loss of a Gaussian curve. For this reason, it is possible to obtain a Gaussian curve that provides a random component in a frequency domain by detecting an input PDF, i.e., a level of predetermined frequency of a spectrum of a composite component.

The standard deviation computing section 120 may compute standard deviation for a Gaussian curve based on the level of the predetermined frequency of the spectrum of the input PDF. The random component computing section 130 may compute a Gaussian curve in a frequency domain as shown in FIG. 5. At this time, as described in FIG. 3, a Gaussian curve in a frequency domain uses zero frequency as a reference. For this reason, the random component computing section 130 can easily compute this Gaussian curve based on the standard deviation computed from the standard deviation computing section 120.

Moreover, as described in FIG. 4, $D(p-p)=2T_0$ defining a deterministic component can be obtained from the first null frequency of the spectrum of the deterministic component. Since a peak to peak value of the spectrum of the deterministic component is preserved even when multiplying a Gaussian curve, a value of $D(p-p)$ can be computed from the first null frequency of the spectrum of the input PDF.

The peak to peak value detecting section 140 detects a peak to peak value from the first null frequency of the spectrum of the input PDF. As described above, the peak to peak value detecting section 140 may multiply a multiplier coefficient α according to the type of distribution of a deterministic component included in a given probability density function by the first null frequency of the spectrum of the probability density function and compute a peak to peak value of the probability density function with the deterministic component.

Moreover, the peak to peak value detecting section 140 may previously store a multiplier coefficient every type of distribution of a deterministic component and compute a peak to peak value by means of a multiplier coefficient corresponding to the reported type of distribution of the deterministic component. For example, the peak to peak value detecting section 140 may previously store a multiplier coefficient α for distribution of each deterministic component such as a sine wave, uniform distribution, triangular distribution, or a dual Dirac model. A multiplier coefficient α for each deterministic component can be previously obtained, for example, by performing Fourier transform on a probability density function with a deterministic component of which a peak to peak value has been known and detecting the first null frequency of the spectrum.

Moreover, the peak to peak value detecting section 140 may compute a peak to peak value when using each previously given multiplier coefficient α. The deterministic component computing section 150 may select a value that seems to be the most definite among the peak to peak values computed from the peak to peak value detecting section 140. For example, the deterministic component computing section 150 may respectively compute a probability density function with a deterministic component based on each peak to peak value and compare the computed probability density function with the given probability density function, in order to select a peak to peak value.

Moreover, the deterministic component computing section 150 may compare a composite probability density function obtained by synthesizing a probability density function corresponding to each peak to peak value and a probability density function with a random component computed from the random component computing section 130 and the given probability density function, in order to select a peak to peak value.

Since a null value of a spectrum is sharply changed in comparison with a peak of a spectrum, it is possible to detect a peak to peak value with high precision in comparison with when a peak to peak value is computed based on peak frequency of a spectrum. Moreover, as an absolute value of frequency becomes large, null frequency has a large error for a peak to peak value. For this reason, it is possible to detect a peak to peak value with high precision by detecting a peak to peak value based on a first null frequency of which an absolute value is the smallest. However, when detecting a peak to peak value, frequency is not limited to null frequency of which an absolute value is the smallest. For example, a peak to peak value may be detected based on at least one null frequency that is selected from the predetermined number of frequency having a small absolute value. Moreover, a multiplier coefficient α is not limited to a value described in FIG. 4B, FIG. 4C, and FIG. 4D. The peak to peak value detecting section 140 can appropriately use a multiplier coefficient α substantially equal to this value.

Moreover, the peak to peak value detecting section 140 may differentiate a spectrum of a probability density function by frequency and detect a first null frequency based on a differential result.

Figure 6:
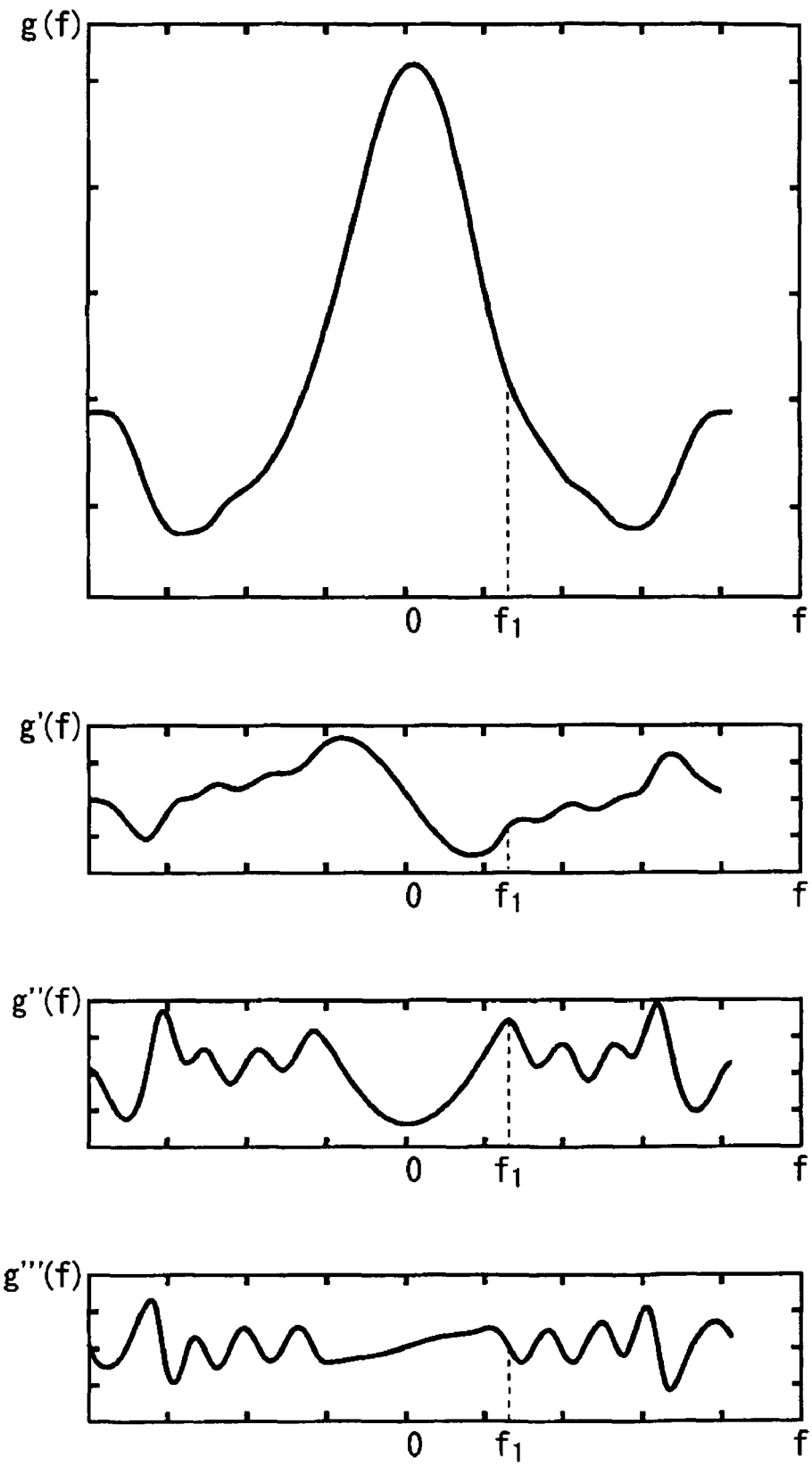
FIG. 6 is a view exemplary showing a result obtained by differentiating a spectrum of a probability density function with respect to frequency.

FIG. 6 is a view exemplary showing a result obtained by differentiating a spectrum of a probability density function with respect to frequency. In the present example, it is considered that a first null frequency of a spectrum is f1. As shown in FIG. 4A, when a given probability density function has a few noises, the first null frequency of a spectrum can be precisely detected. Correspondingly, when a given probability density function has noises, as shown in a spectrum g(f) in FIG. 6, the first null may not be detected from frequency f1 to be detected.

In this case, as shown in FIG. 6, it is possible to detect the first null frequency with high precision by differentiating this spectrum with respect to frequency. As shown in FIG. 6, a peak of a second-order derivative spectrum g"(f) of this spectrum corresponds to a null of the spectrum g(f). For this reason, the peak to peak value detecting section 140 may second-order differentiate a spectrum of a probability density function and detect the first null frequency based on peak frequency of the derivative spectrum.

Figure 7:
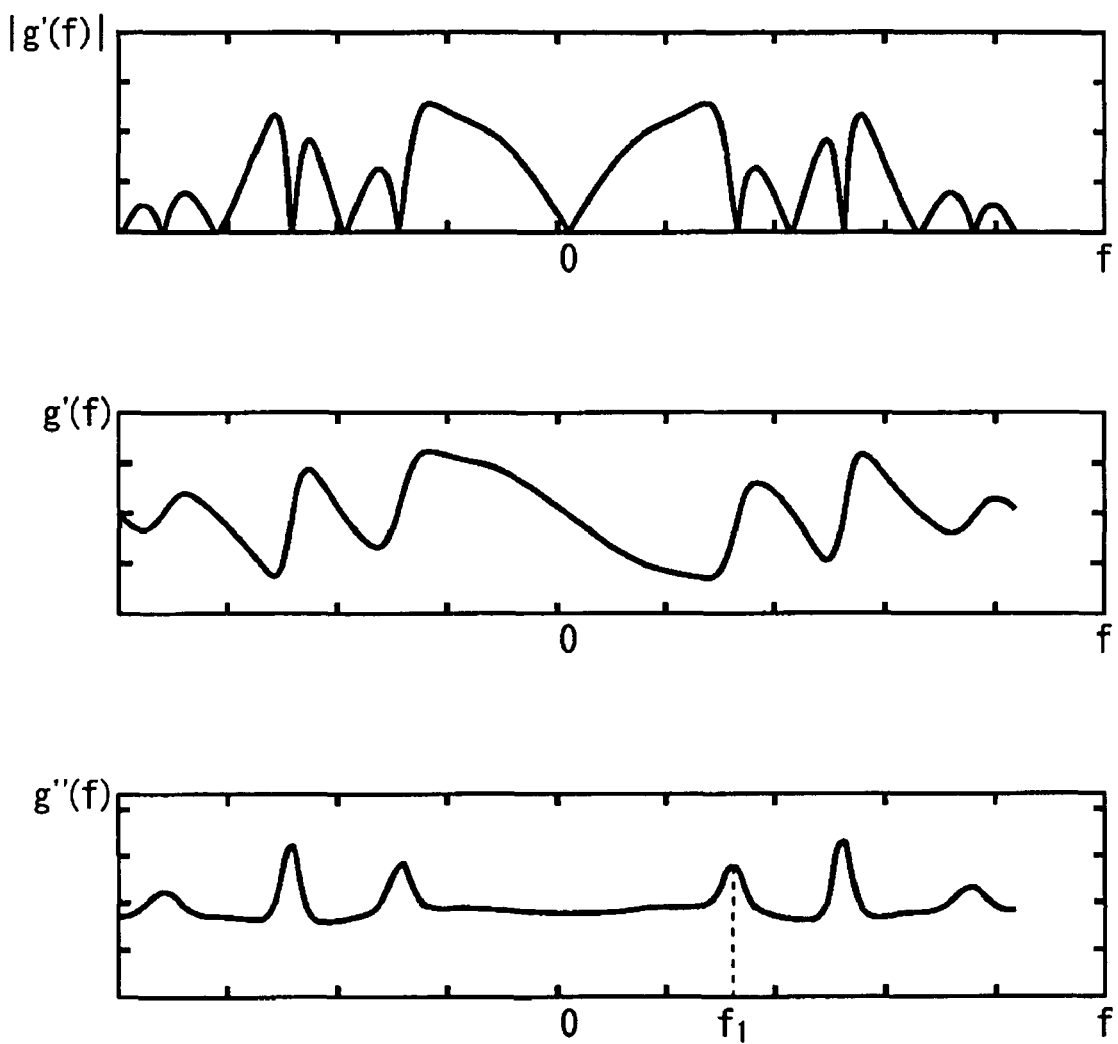
FIG. 7 is a view showing another example of a result obtained by differentiating a spectrum of a probability density function with respect to frequency.

FIG. 7 is a view showing another example of a result obtained by differentiating a spectrum of a probability density function with respect to frequency. In this example, there is shown a result obtained by differentiating a spectrum of a probability density function without noises as shown in FIG. 4A.

Since a null of a spectrum is a point at which an inclination of an envelope curve of a spectrum change from a negative to a positive, it is possible to detect a null of a spectrum by detecting a peak of a second-order derivative spectrum g"(f).

By such a method, as shown in FIG. 6, it is possible to more precisely detect the first null frequency even if noises are large. The peak to peak value detecting section 140 may detect frequency of which an absolute value is the smallest as the first null frequency among peaks of the second-order derivative spectrum g"(f) of a spectrum.

Figure 8:
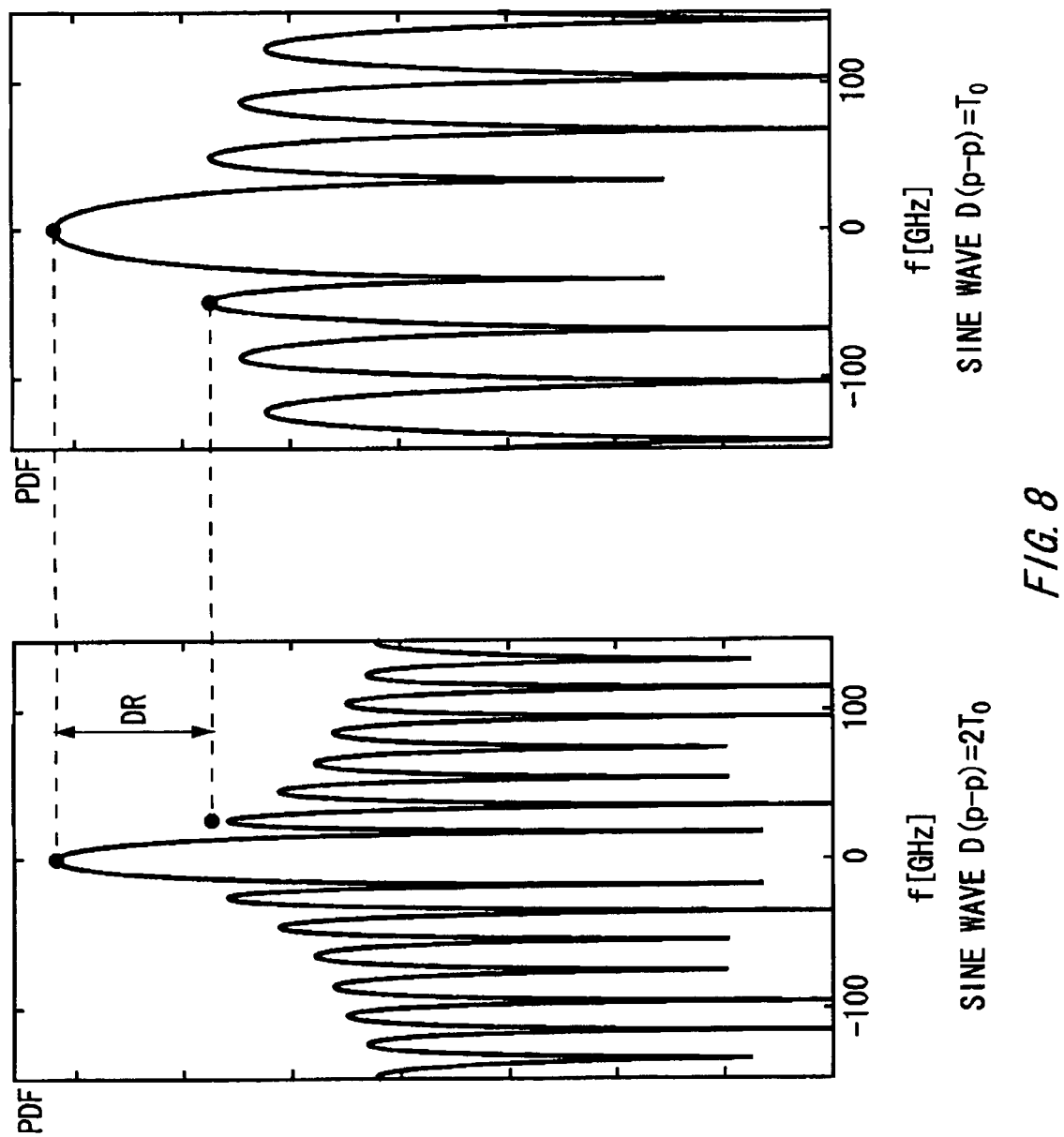
FIG. 8 is a view exemplary showing a spectrum of a deterministic component of which a value of D(p-p) is different.

FIG. 8 is a view exemplary showing a spectrum of a deterministic component of which a value of D(p-p) is different. A left waveform shown in FIG. 8 shows a spectrum in case of D(p-p)=2T₀ and a right waveform shown in FIG. 8 shows a spectrum in case of D(p-p)=T₀. Although the value of D(p-p) changes, a ratio between a level of a main lobe of zero frequency and a peak level of each side lobe does not change. That is to say, relative level of each spectrum of a probability density function with a deterministic component is uniquely determined according to whether the deterministic component is a sine wave, uniform distribution, triangular distribution, or a dual Dirac model. For this reason, it is possible to obtain a spectrum of a random component by detecting a ratio between corresponding peak levels in a spectrum of a deterministic component and a spectrum of an input PDF. Here, it is noted that this level ratio depends on attenuation of a spectrum of a deterministic component caused by a random component.

Figure 9:
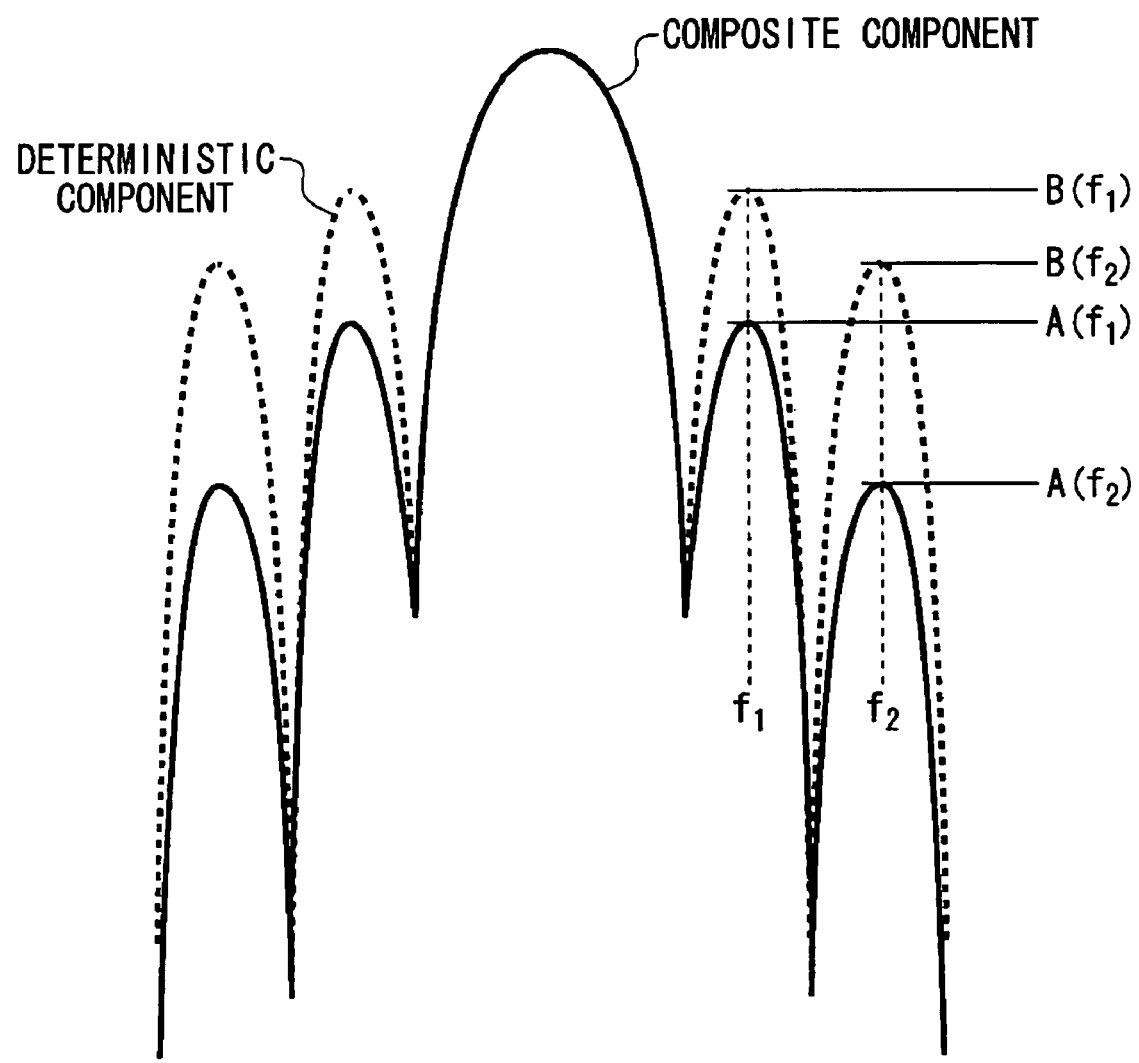
FIG. 9 is a view exemplary explaining a procedure for computing standard deviation of a random component.

FIG. 9 is a view exemplary explaining a method for computing standard deviation of a random component. A Gaussian curve in a frequency domain showing a random component is given by Expression (2). When a base takes a logarithm of e for Expression (2), a quadratic function of f is obtained like Expression (3).

$$\log_e P(f) = \log_e C e^{-f^2/2\sigma^2} \quad \text{Expression (3)}$$
$$= \log_e C - \frac{f^2}{2\sigma^2}$$

Here, as shown in FIG. 9, it is assumed that frequency of a first peak of a spectrum (a composite component) of an input PDF is f1 and a level is A(f1) and that frequency of a second peak is f2 and a level is A(f2). At this time, a level ratio between the first peak and the second peak is expressed by Expression (4).

$$\log_e \frac{A(f_2)}{A(f_1)} = \log_e A(f_2) - \log_e A(f_1) \quad \text{Expression (4)}$$
$$= -\frac{f_2^2 - f_1^2}{2\sigma^2}$$

For this reason, it is possible to compute standard deviation based on a level ratio between two frequency components of a spectrum of an input PDF. The standard deviation computing section 120 may compute standard deviation based on a level ratio between a first frequency component and a second frequency component of the spectrum of the input PDF. According to Expression (4), precise measurement for dual Dirac is given. Moreover, an approximate solution for other deterministic components is given.

Moreover, it is preferable that these two frequency components are peaks of the spectrum of the input PDF. The standard deviation computing section 120 may compute standard deviation based on a level ratio between any two peaks of the input PDF.

A level of the peak of the spectrum of the input PDF shows resultant attenuation in a peak level of a spectrum of a deterministic component caused by a spectrum of a random component. For this reason, when a level of each peak of the spectrum of the deterministic component is constant, it is possible to compute standard deviation with high precision based on Expression (4). Moreover, when a level of each peak of the spectrum of the deterministic component is not constant, the standard deviation computing section 120 may compute standard deviation further based on the level of the peak of the spectrum of the deterministic component. That is to say, the standard deviation computing section 120 may compute standard deviation based on a level ratio between a predetermined frequency component of the spectrum of the input PDF and a frequency component corresponding to a spectrum obtained by transforming a probability density function with a deterministic component into a frequency domain. In this case, the standard deviation computing section 120 may compute standard deviation based on Expression (5). Here, B(f1) is a level of the first peak of the spectrum of the deterministic component, and B(f2) is the second level of the spectrum of the deterministic component.

$$-\frac{1}{2\sigma^2} = \frac{1}{f_2^2 - f_1^2} \cdot \log\left(\frac{A(f_2)}{B(f_2)} \bigg/ \frac{A(f_1)}{B(f_1)}\right)$$ Expression (5)

In addition, standard deviation can be obtained according to a procedure equal to Expression (5). For example, in Expression (5), standard deviation is computed based on a value obtained by dividing a level ratio $A(f2)/B(f2)$ between the input PDF in the second frequency component and the spectrum of the deterministic component by a level ratio $A(f1)/B(f1)$ in the first frequency component. Similarly, standard deviation may be obtained based on a value obtained by dividing a level ratio $A(f2)/A(f1)$ between the second frequency component in the input PDF and the first frequency component by a level ratio $B(f2)/B(f1)$ between the second frequency component in the deterministic component and the first frequency component.

In this case, a ratio between a level of the second frequency component and a level of the first frequency component in the spectrum of the probability density function with the deterministic component may be given in advance. The standard deviation computing section 120 may store this level ratio on a memory in advance. This level ratio can be determined according to the type of distribution of the deterministic component included in the input PDF in advance. Particularly, when the deterministic component is given with a function of dual Dirac, this level ratio is 1.0.

Moreover, a spectrum of a deterministic component can be obtained based on the above-described D(p-p). A deterministic component is determined by a value of D(p-p) as described above and whether the deterministic component is given by a sine wave, uniform distribution, triangular distribution, or dual Dirac. The deterministic component computing section 150 may compute a deterministic component by being previously supplied with a function corresponding to a sine wave, uniform distribution, triangular distribution, dual Dirac, or the like defining the deterministic component and applying a peak to peak value detected from the peak to peak value detecting section 140 to this function. In this case, the random component computing section 130 computes a random component based on the spectrum of the deterministic component computed from the deterministic component computing section 150.

Moreover, assuming that f1=0 in Expression (5), since the level of the spectrum of the input PDF in f1=0 and the level of the spectrum in the deterministic component are equal to each other, Expression (5) is transformed like Expression (6).

$$-\frac{1}{2\sigma^2} = \frac{1}{f_2^2} \cdot \log\left(\frac{A(f_2)}{B(f_2)}\right)$$ Expression (6)

The standard deviation computing section 120 may compute standard deviation based on Expression (6). That is to say, the standard deviation computing section 120 may compute standard deviation based on a level ratio between any corresponding peaks in the spectrum of the input PDF and the probability density function with the deterministic component. In this case, it is possible to compute standard deviation by simpler measurement and with high precision.

Moreover, the standard deviation computed based on Expression (5) and Expression (6) is standard deviation of Gaussian distribution in a frequency domain. The standard deviation computing section 120 may compute standard deviation σt in a time domain based on standard deviation σf in a frequency domain. Relation between σf and σt is expressed by Expression (7).

$$\sigma_t = \frac{1}{2\pi}\sqrt{2\sigma_f^2}$$ Expression (7)

In this way, it is possible to compute a probability density function in a time domain of a random component.

It is possible to obtain a Gaussian curve in a frequency domain from Expression (2) by means of σf. A Gaussian curve in a time domain of Expression (1) may be directly obtained by performing Fourier transform on the Gaussian curve in the frequency domain.

In other words, a probability density function in a time domain of a random component can be directly obtained from the Gaussian curve in the frequency domain.

FIG. 10 is a view exemplary showing a measurement result by a probability density function separating apparatus 100 described with reference to FIG. 1 and a measurement result by a conventional curve fitting method described in FIG. 2. In the present example, distribution in which a peak to peak value of a deterministic component is 50 ps and a random component is 4.02 ps is used as a probability density function to be measured. Moreover, for a sampling timing in sampling a measuring object, two cases was studied: one case of timing error in sampling and another case of zero timing error in sampling.

As shown in FIG. 10, the probability density function separating apparatus 100 can obtain a measurement result with a smaller error than a conventional curve fitting method in any cases.

Figure 11:
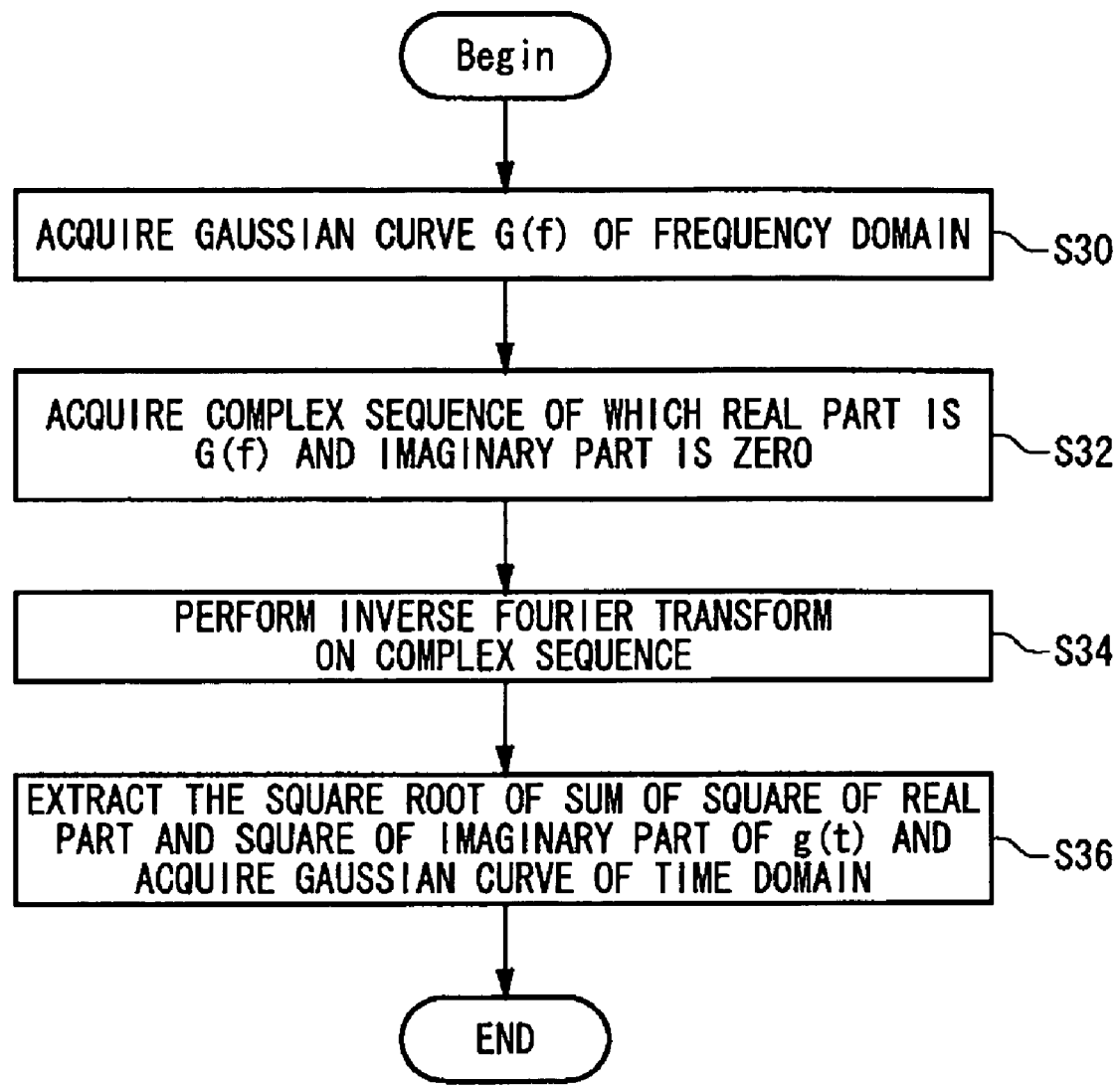
FIG. 11 is a flowchart exemplary showing a method for directly computing a probability density function in a time domain of a random component from a Gaussian curve in a frequency domain.

FIG. 11 is a flowchart exemplary showing a method for directly computing a probability density function in a time domain of a random component from a Gaussian curve in a frequency domain. First, a Gaussian curve G(f) in a frequency domain is acquired by substituting standard deviation σf in a frequency domain for Expression (2) (S30). At this time, if required, in order to distribute a Gaussian curve in a time domain around a mean value μ of the input PDF, a result obtained by multiplying $\exp(j2\pi\mu f)$ by G(f) is used considering time shifting property.

Next, a complex sequence (really, it is noted that it is a real sequence) of which a real part is G(f) and an imaginary part is zero is acquired (S32). Then, a function g(t) in a time domain obtained by performing inverse Fourier transform on the acquired complex sequence is acquired (S34). At this time, since an original signal is a real number, Fourier transform or cosine transform may be performed in place of inverse Fourier transform.

Next, a Gaussian curve in a time domain is acquired by extracting the square root of a sum of a square of a real part and a square of an imaginary part of the g(t) acquired in S34 (S36). In other words, a Gaussian curve in a time domain is acquired by computing a square root of sum of squares of real part and imaginary part of g(t).

By such a process, a Gaussian curve in a time domain can be acquired.

Figure 12:
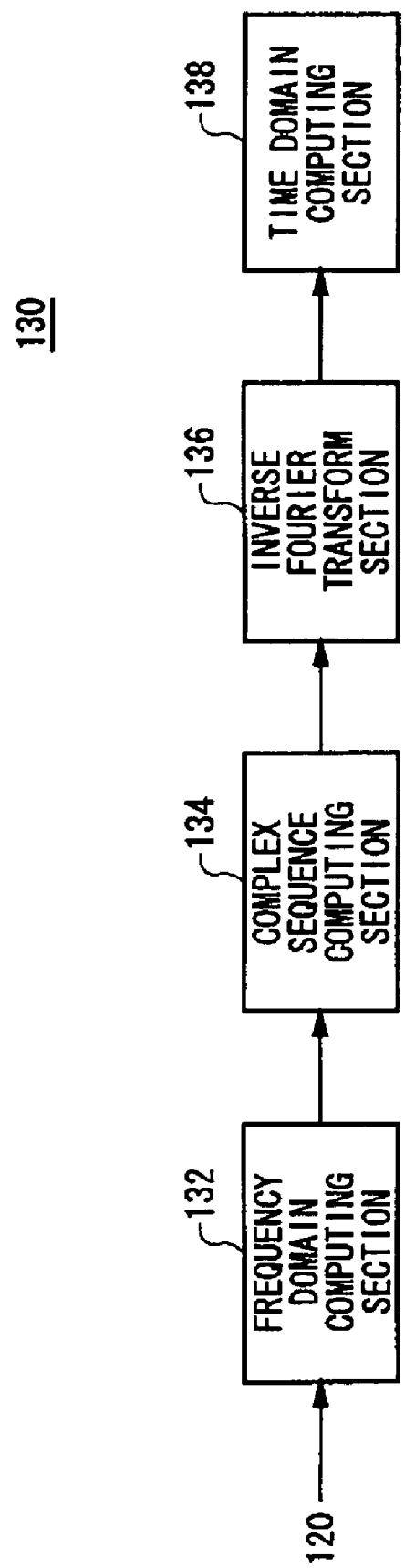
FIG. 12 is a view exemplary showing a configuration of a random component computing section 130.

FIG. 12 is a view exemplary showing a configuration of the random component computing section 130. The random component computing section 130 according to the present example acquires a Gaussian curve in a time domain using a method described in FIG. 11. The random component computing section 130 has a frequency domain computing section 132, a complex sequence computing section 134, an inverse Fourier transform section 136, and a time domain computing section 138.

The frequency domain computing section 132 computes a Gaussian curve G(f) in a frequency domain based on standard deviation of a random component in a frequency domain computed from the standard deviation computing section 120. At this time, the frequency domain computing section 132 may compute a Gaussian curve G(f) in a frequency domain in a manner similar to the step of S30 described in FIG. 11.

The complex sequence computing section 134 computes a complex sequence of which a real part is G(f) and an imaginary part is zero. The inverse Fourier transform section 136 computes a function g(t) in a time domain obtained by performing inverse Fourier transform (or Fourier transform) on this complex sequence. The time domain computing section 138 extracts the square root of sum of squares of real part and imaginary part of the function g(t) in a time domain, and acquires a Gaussian curve in a time domain, that is, a probability density function in a time domain of a random component.

In addition, a process described in FIGS. 11 and 12 is not limited to a process for a probability density function. That is to say, it is possible to suppose a waveform in a time domain from a spectrum in an arbitrary frequency domain by means of a process similar to that described in FIGS. 11 and 12.

In this case, the time domain computing section 138 described in FIG. 12 is supplied with a magnitude spectrum of a measured signal. Then, the time domain computing section 138 computes a waveform in a time domain by transforming the magnitude spectrum into a function in a time domain. When transforming an magnitude spectrum into a function in a time domain, it is possible to obtain a function in this time domain by applying Fourier transform, inverse Fourier transform, cosine transform or the like to this amplitude spectrum.

Then, the time domain computing section 138 can suppose a waveform in a time domain by extracting the square root of sum of squares of real part and imaginary part of this time domain.

In this manner, a computing apparatus for computing a waveform in a time domain from a spectrum in a frequency domain may further include a frequency domain measuring section for detecting a magnitude spectrum of a measured signal in addition to the time domain computing section 138. The frequency domain measuring section supplies the detected magnitude spectrum to the time domain computing section 138. By such a configuration, it is possible to suppose a waveform in a time domain of a measured signal based on only a magnitude spectrum of a measured signal.

As described above, according to the probability density function separating apparatus 100 in the present example, it is possible to separate a random component and a deterministic component from a given probability density function with high precision. For example, in case of a random component, it is possible to compute a random component with high precision based on standard deviation computed in a frequency domain without performing an approximation such as conventional curve fitting. Moreover, in case of a deterministic component, it is possible to detect a value D(p-p) closer to a true value for D(δδ) having an error like a conventional method.

Figure 13:
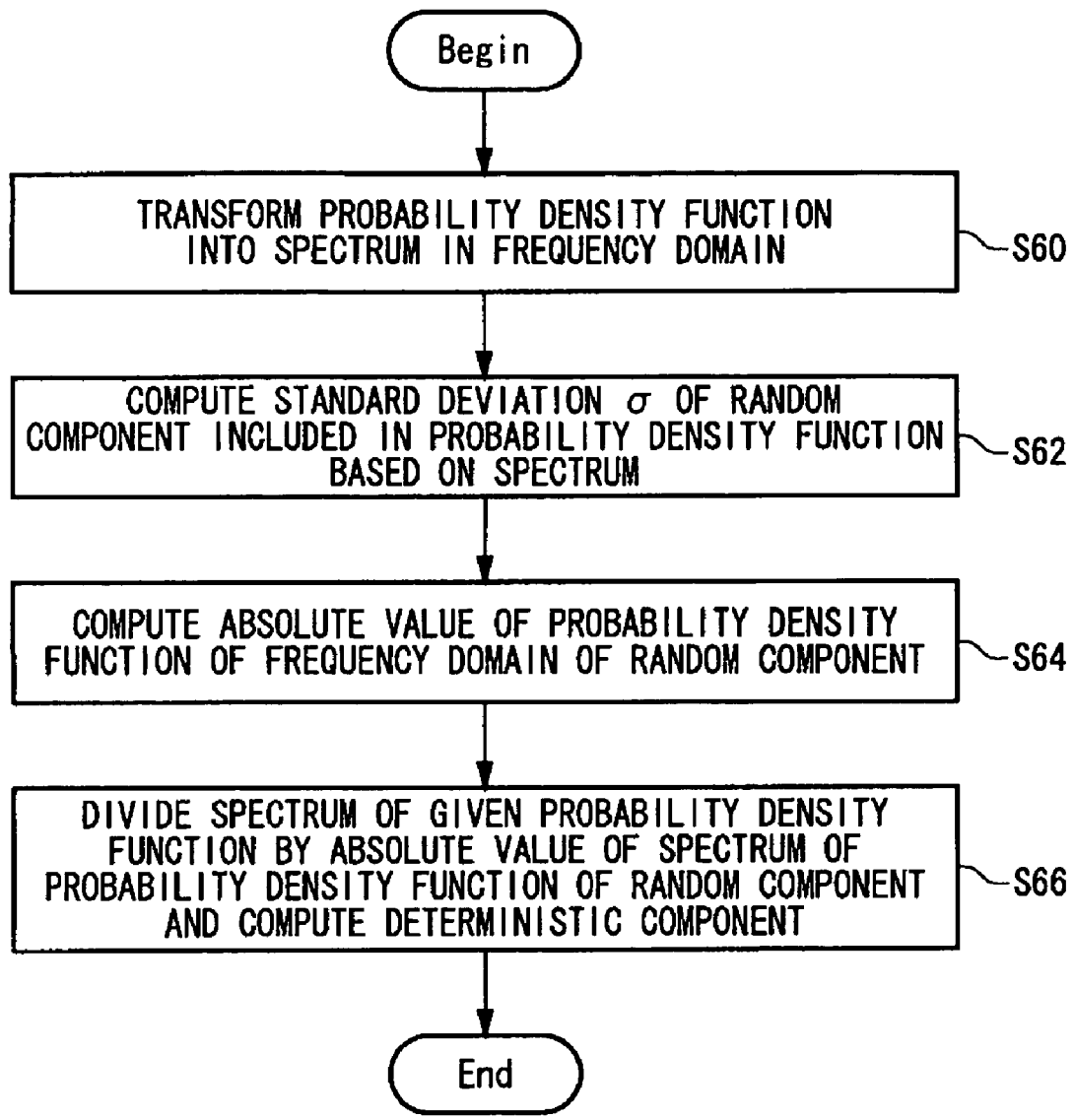
FIG. 13 is a flowchart showing another example of an operation of a probability density function separating apparatus 100.

FIG. 13 is a flowchart showing another example of an operation of the probability density function separating apparatus 100. The probability density function separating apparatus 100 according to the present example may not include the peak to peak value detecting section 140 in regard to a configuration of the probability density function separating apparatus 100 described with reference to FIG. 1.

An operation of the domain transforming section 110 is equal to that of the domain transforming section 110 described with reference to FIG. 1. In other words, the domain transforming section 110 transforms a given probability density function into a spectrum in a frequency domain (S60).

An operation of the standard deviation computing section 120 is equal to that of the standard deviation computing section 120 described with reference to FIG. 1. In other words, the standard deviation computing section 110 computes standard deviation of a random component included in a probability density function based on the spectrum transformed by the domain transforming section 110 (S62).

An operation of the random component computing section 130 is similar to that of the random component computing section 130 described with reference to FIG. 1. The random component computing section 130 in the present example computes an absolute value of a probability density function in a frequency domain with a random component, that is, an amplitude spectrum (Magnitude Spectra) based on the standard deviation computed from the standard deviation computing section 120 (S64).

The deterministic component computing section 150 divides the spectrum transformed by the domain transforming section 110 by the magnitude spectrum computed from the random component computing section 130, and computes a spectrum with a deterministic component (S66).

By such an operation, it is possible to separate a deterministic component and a random component included in a probability density function. Moreover, the deterministic component computing section 150 may perform inverse Fourier transform on a spectrum of the computed deterministic component and transform it into a probability density function in a time domain. Furthermore, the deterministic component computing section 150 may compute a peak to peak value of a probability density function in the time domain.

Figure 14:
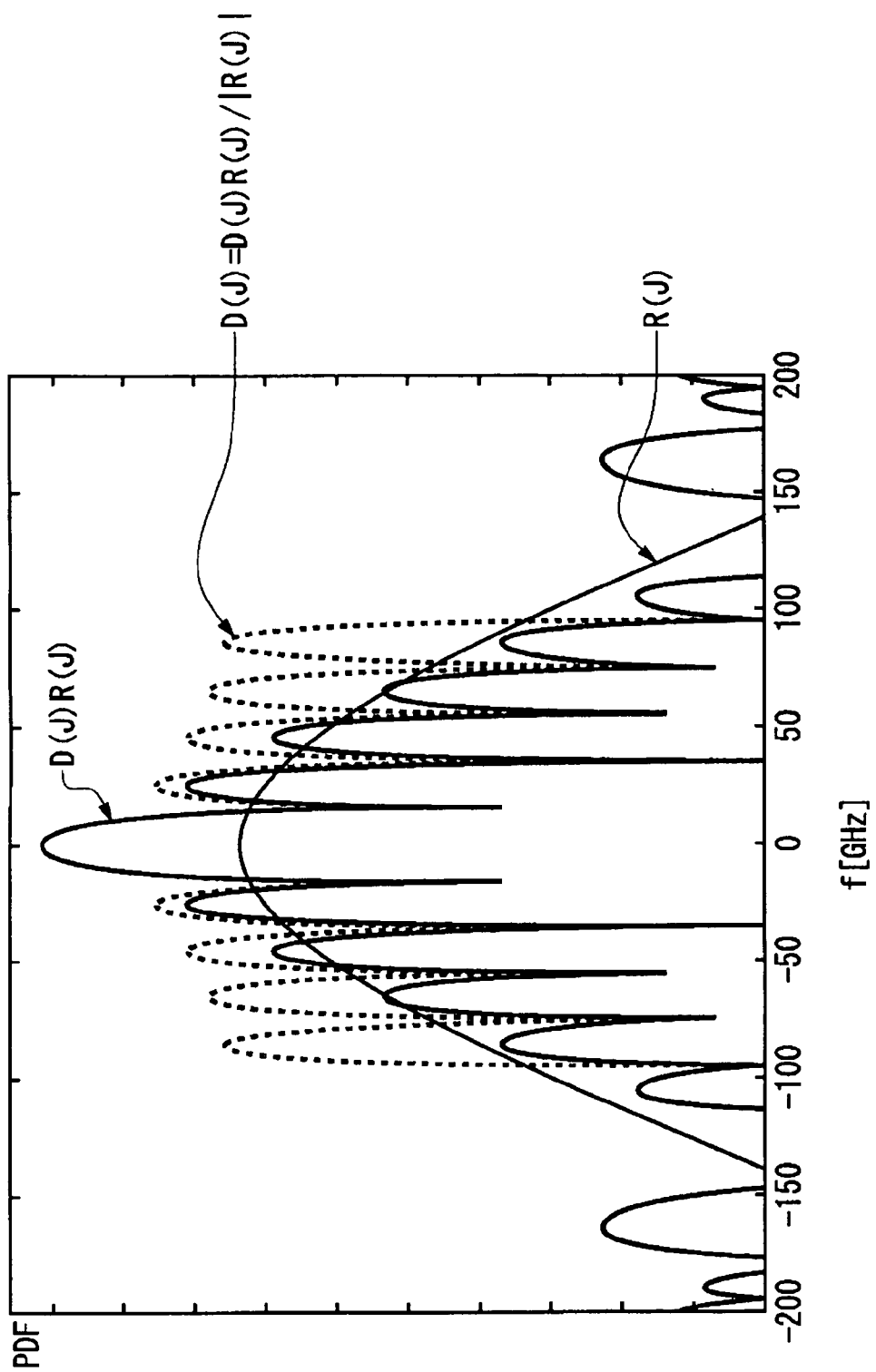
FIG. 14 is a view explaining an operation of a probability density function separating apparatus 100 described in FIG. 13.

FIG. 14 is a view explaining an operation of the probability density function separating apparatus 100 described in FIG. 13. As described above, the domain transforming section 110 outputs a spectrum D(J)R(J) of a probability density function. A spectrum of a deterministic component D(J) is given by dividing the spectrum D(J)R(J) by an amplitude spectrum |R(J)| with a random component.

However, as shown in FIG. 14, an error component of the spectrum D(J)R(J) of a probability density function becomes large as frequency becomes high. For this reason, the deterministic component computing section 150 may compute a probability density function in a time domain with a deterministic component by transforming a spectrum in a predetermined frequency range including frequency of a main lobe into a function in a time domain among the spectra D(J) with the computed deterministic component. Moreover, the deterministic component computing section 150 may extract the predetermined number of side lobes in vicinity of the main lobe from the spectra D(J) with the computed deterministic component and transform the extracted main lobe and side lobe into a function in a time domain.

By such a process, it is possible to reduce an influence of an error in a high-frequency area.

FIG. 15 is a view exemplary showing a measurement result by the probability density function separating apparatus 100 described with reference to FIG. 13 and a measurement result by a conventional curve fitting method described in FIG. 2. In the present example, a probability density function of a signal-edge phase is measured when applying jitter to a predetermined signal. Moreover, in this example, a probability density function is respectively measured when jitter amplitude is 10 mV, 50 mV, and 100 mV.

As shown in FIG. 15, the probability density function separating apparatus 100 can obtain a measurement result with a small error than a conventional curve fitting method when jitter amplitude is large.

Figure 16:
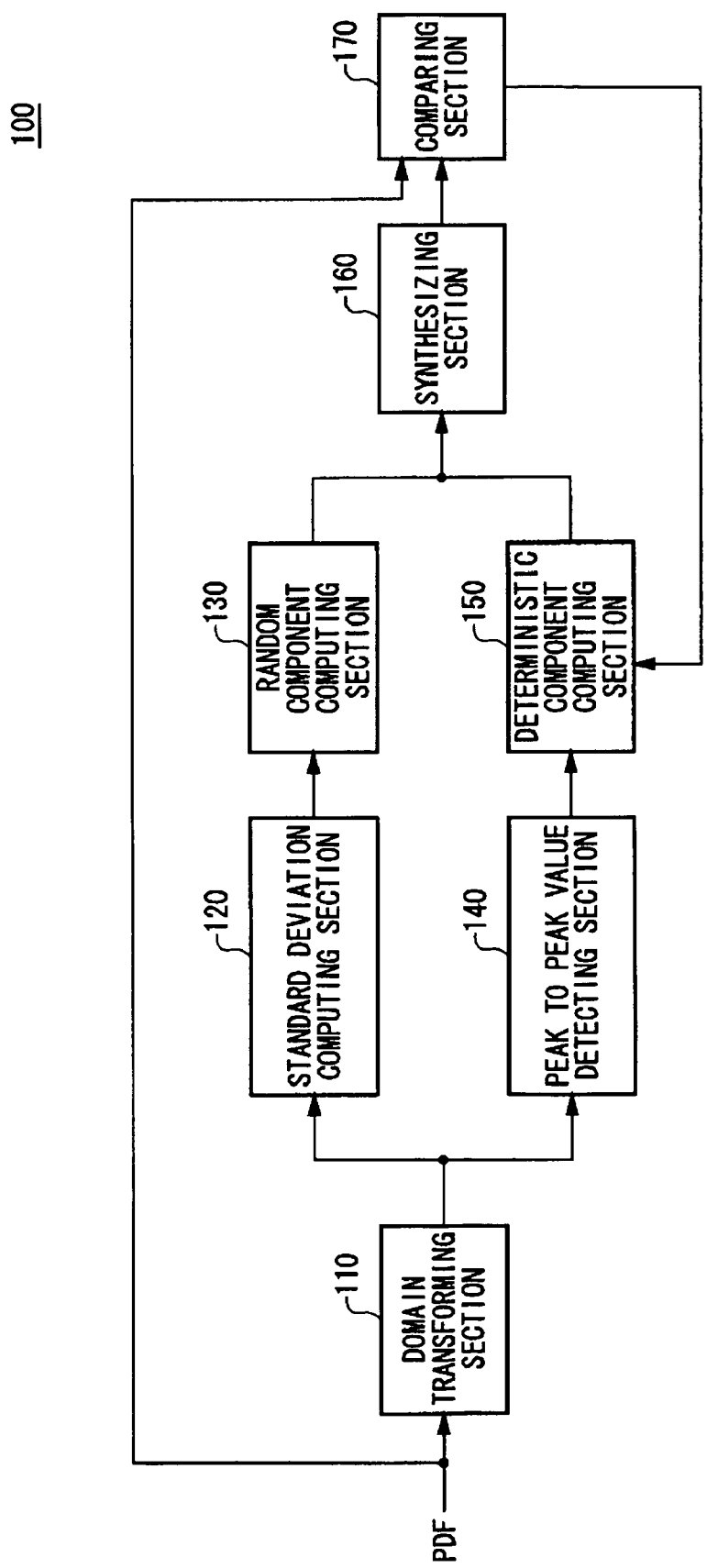
FIG. 16 is a view showing another example of a configuration of a probability density function separating apparatus 100.

FIG. 16 is a view showing another example of a configuration of the probability density function separating apparatus 100. The probability density function separating apparatus 100 according to the present example further includes a synthesizing section 160 and a comparing section 170 in addition to a configuration of the probability density function separating apparatus 100 described with reference to FIG. 1. Other components have a function equal to that of components that have been described using the same symbols in FIG. 1.

The synthesizing section 160 generates a composite probability density function (hereinafter, referred to as a composite PDF) obtained by convolving (convolution integrating) a probability density function of a random component computed from the random component computing section 130 and a probability density function of a deterministic component computed from the deterministic component computing section 150.

The comparing section 170 compares a composite PDF output from the synthesizing section 160 and an input PDF. As described in FIG. 9, the deterministic component computing section 150 is previously supplied with a function of which a peak to peak value is unknown and substitute the peak to peak value detected from the peak to peak value detecting section 140 for the function, in order to compute a probability density function with a deterministic component. At this time, this function is different according to whether a deterministic component is a sine wave, uniform distribution, triangular distribution, or dual Dirac. For this reason, in order to compute a probability density function with a deterministic component based on a peak to peak value, it is preferable to be able to decide which function is a function with a deterministic component.

The deterministic component computing section 150 may be supplied with which function is a function with a deterministic component in advance. Moreover, the deterministic component computing section 150 may be previously supplied with a plurality of functions according to the type of distribution of a deterministic component, substitute the peak to peak value detected from the peak to peak value detecting section 140 for each function, and respectively compute a probability density function for each type of distribution of a deterministic component.

In this case, the synthesizing section 160 respectively synthesizes each probability density function output from the deterministic component computing section 150 and a probability density function output from the random component computing section 130. The comparing section 160 respectively compares the composite PDF each synthesized by the synthesizing section 160 and the input PDF. The comparing section 170 selects a function appropriate as a function showing a deterministic component included in the input PDF based on a comparison result for each composite PDF. For example, the comparing section 170 may select a function in which a difference between the composite PDF and the input PDF becomes smallest.

Then, the deterministic component computing section 150 may output a probability density function with a deterministic component corresponding to the function selected by the comparing section 170 as an appropriate probability density function. By such a process, although a type of distribution of a deterministic component is indefinite, it is possible to select appropriate distribution from distribution of a predetermined type and compute a probability density function with a deterministic component included in an input PDF.

Moreover, the peak to peak value detecting section 140 detects a peak to peak value with predetermined measurement resolution. In this case, the detected peak to peak value includes an error according to measurement resolution. The probability density function separating apparatus 100 in the present example can perform a process reducing this measurement error. Moreover, the probability density function separating apparatus 100 may perform both of selection of a function prescribing the deterministic component and a process reducing a measurement error to be described below.

For example, the deterministic component computing section 150 computes a deterministic component corresponding to each peak to peak value when sequentially changing the peak to peak values using the peak to peak value detected from the peak to peak value detecting section 140 as standard. At this time, the deterministic component computing section 150 may sequentially change the peak to peak values in a range according to measurement resolution. For example, when measurement resolution is 2a and the peak to peak value detected from the peak to peak value detecting section 140 is $2T_0$, the deterministic component computing section 150 may sequentially change the peak to peak values in a range of $2T_0-a$ to $2T_0+a$. At this time, it is preferable that resolution changing a peak to peak value is sufficiently smaller than measurement resolution.

The synthesizing section 160 sequentially generates composite PDF obtained by sequentially synthesizing a probability density function with each deterministic component sequentially output from the deterministic component computing section 150 and a probability density function with a random component. The comparing section 170 compares each composite PDF and the input PDF, and selects either of the peak to peak values as an optimum value based on the comparison result.

By such a process, it is possible to reduce a measurement error caused by measurement resolution.

Figure 17:
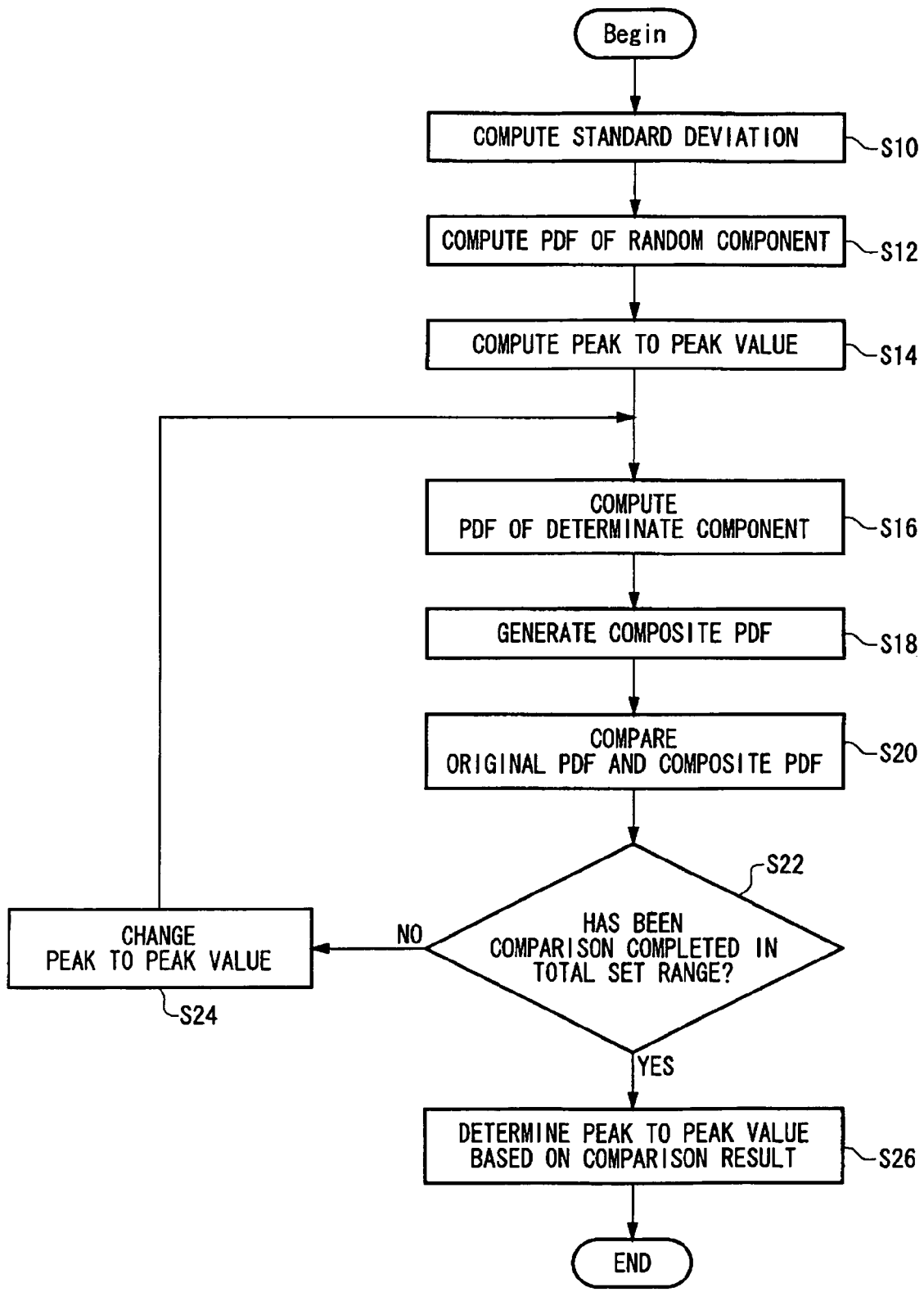
FIG. 17 is a view exemplary showing operations of a probability density function separating apparatus 100 shown in FIG. 16.

FIG. 17 is a view exemplary showing operations of the probability density function separating apparatus 100 shown in FIG. 16. In this example, it will be explained about an operation when reducing the measurement error. First, the domain transforming section 110 transforms the input PDF into a spectrum in a frequency domain. Then, the standard deviation computing section 120 computes standard deviation of a random component included in the input PDF based on this spectrum (S10). Then, the random component computing section 130 computes a probability density function with this random component based on this standard deviation (S12).

Next, the peak to peak value detecting section 140 computes a peak to peak value of a spectrum of the input PDF (S14). Then, the deterministic component computing section 150 computes a probability density function with a deterministic component based on this peak to peak value (S16).

Next, the synthesizing section 160 generates composite PDF made by convolving a probability density function of a random component and a probability density function of a deterministic component (S18). This synthesizing may be performed by convolution integrating probability density functions in each time domain.

Next, the comparing section 170 compares the input PDF and the composite PDF (S20). The comparing section 170 may compute an error between the input PDF and the composite PDF. This error may be root mean square of an error on a time section respectively set. Tail sections on both ends of a probability density function may be designated as the time sections.

Next, the peak to peak value is changed in predetermined entire range, and it is determined whether comparison between the input PDF and the composite PDF has been completed (S22). When there is a range in which the peak to peak value is not changed, the peak to peak value is changed into a value to be compared (S24), and processes of S16 to S20 are repeated.

When the peak to peak value is changed in entire range, a peak to peak value having a small error is determined based on the comparison result in S20 for each peak to peak value (S26).

By such a process, it is possible to reduce a measurement error and determine an optimal peak to peak value. The B(f) of Expression (5) may be recalculated to compute standard deviation of a random component with high precision by means of a probability density function with a deterministic component having this peak to peak value.

Tails on both ends of a probability density function are decided by a random component. On the contrary, it is possible to compare a value of a probability density function with a predetermined threshold value from both ends to a central portion and detect a time width having probability density larger than this threshold value, in order to compute D(p-p).

Figure 18A:
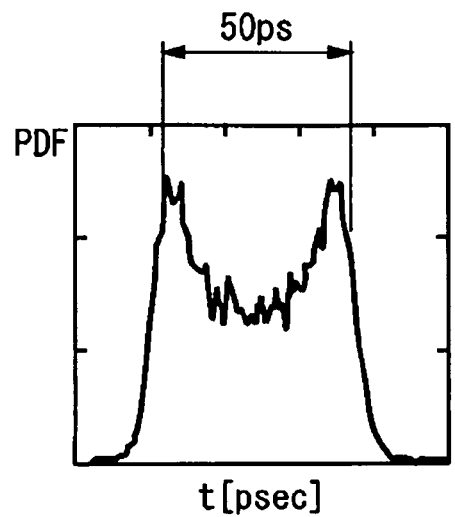
FIG. 18A shows a probability density function with a deterministic component including only a sine wave as a deterministic jitter.

FIG. 18A shows a probability density function with a deterministic component including only a sine wave as a deterministic jitter. An expected value of D(p-p) of a sine wave in the present example is 50 ps.

Figure 18B:
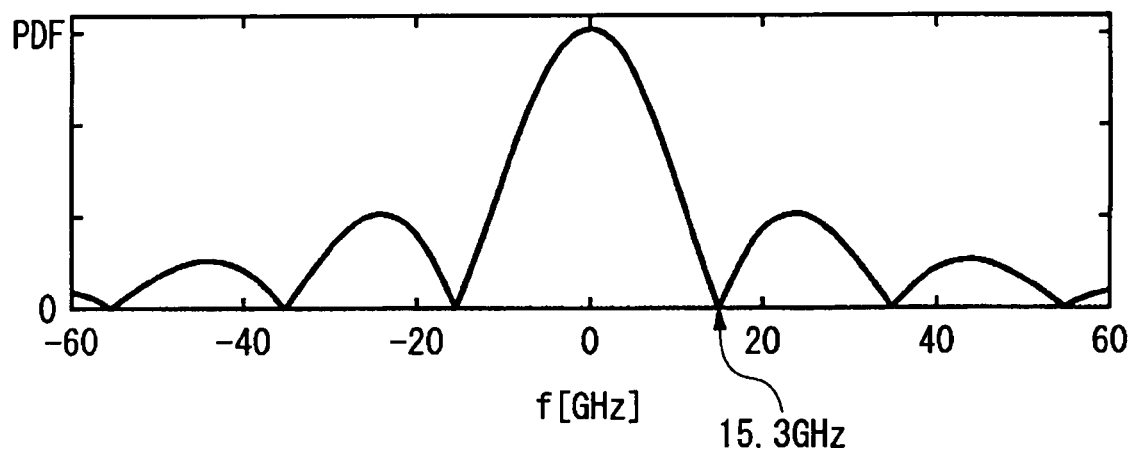
FIG. 18B shows a spectrum obtained by transforming a probability density function shown in FIG. 18A into a frequency domain.

FIG. 18B shows a spectrum obtained by transforming a probability density function shown in FIG. 18A into a frequency domain. Null frequency of this spectrum is 15.3 GHz (0.765/50 ps) of an expected value.

Figure 19A:
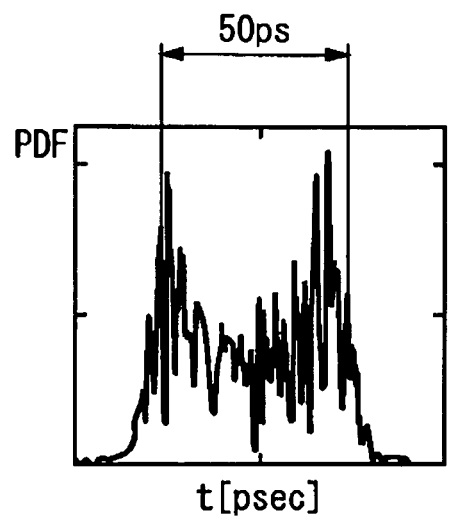
FIG. 19A show a probability density function with a deterministic component including a sine wave and a sine wave of which energy is relatively smaller than that of the sine wave as a deterministic jitter.
Figure 19B:
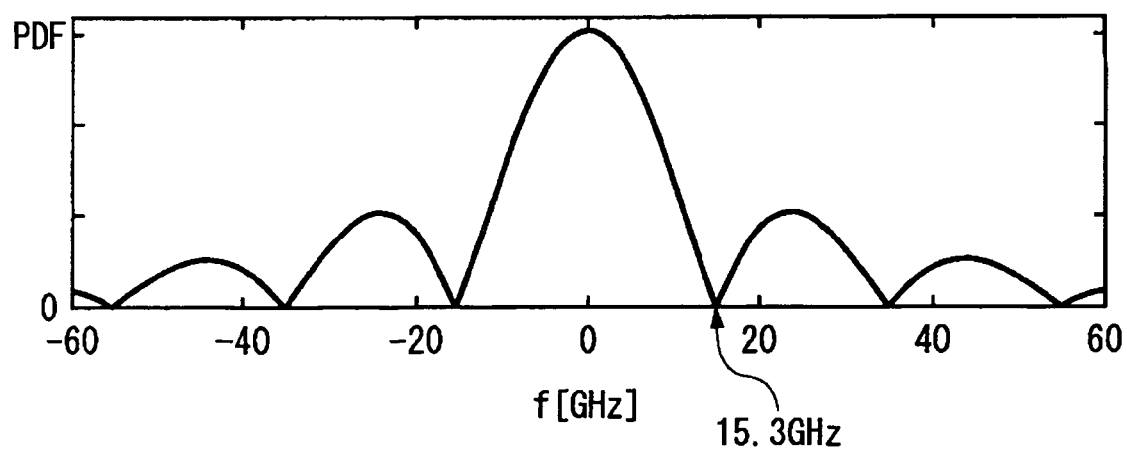
FIG. 19B shows a spectrum obtained by transforming a probability density function shown in FIG. 19A into a frequency domain.

FIG. 19A shows a probability density function with a deterministic component including a sine wave and a sine wave of which energy is relatively smaller than that of the sine wave as a deterministic jitter. In this case, this probability density function is obtained by convolution integrating two sine waves. It is understood that a small sine wave acts on a probability density function as noises. An expected value of D(p-p) of a large sine wave in the present example is 50 ps. FIG. 19B shows a spectrum obtained by transforming a probability density function shown in FIG. 19A into a frequency domain. Null frequency of this spectrum is 15.3 GHz. In other words, it is understood that noises of a probability density function does not act on null frequency. That is to say, according to the present method for detecting D(p-p) based on null frequency, it is possible to reduce an influence of noise of a probability density function to detect D(p-p).

Figure 19C:
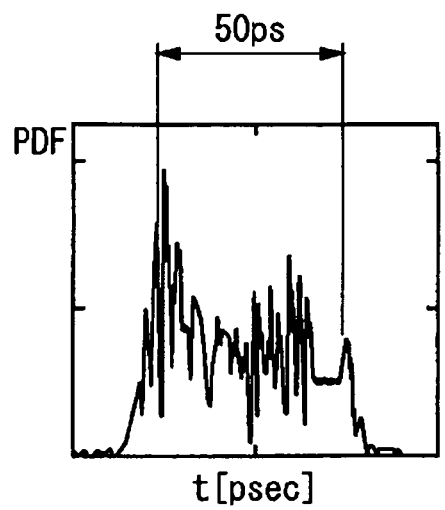
FIG. 19C shows a asymmetric probability density function.
Figure 19D:
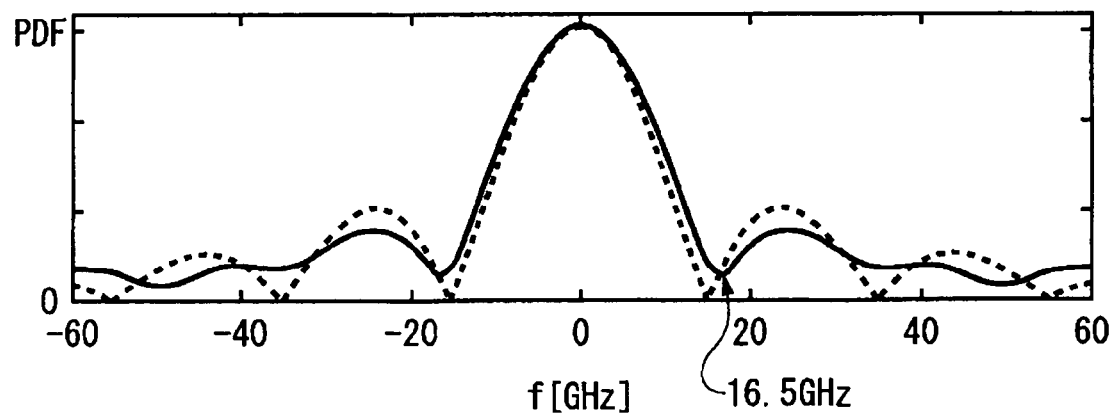
FIG. 19D shows a spectrum obtained by transforming a asymmetric probability density function shown in FIG. 19C into a frequency domain.

FIG. 19C shows a asymmetric probability density function. FIG. 19D shows a spectrum obtained by transforming a asymmetric probability density function shown in FIG. 19C into a frequency domain. In the present example, an expected value of D(p-p) is 50 ps, and null frequency of this spectrum is 16.5 GHz. In other words, a conventional method cannot detect reproducible D(p-p). However, the present method for detecting D(p-p) based on null frequency can detect D(p-p) with an error of 8%.

Figure 20A:
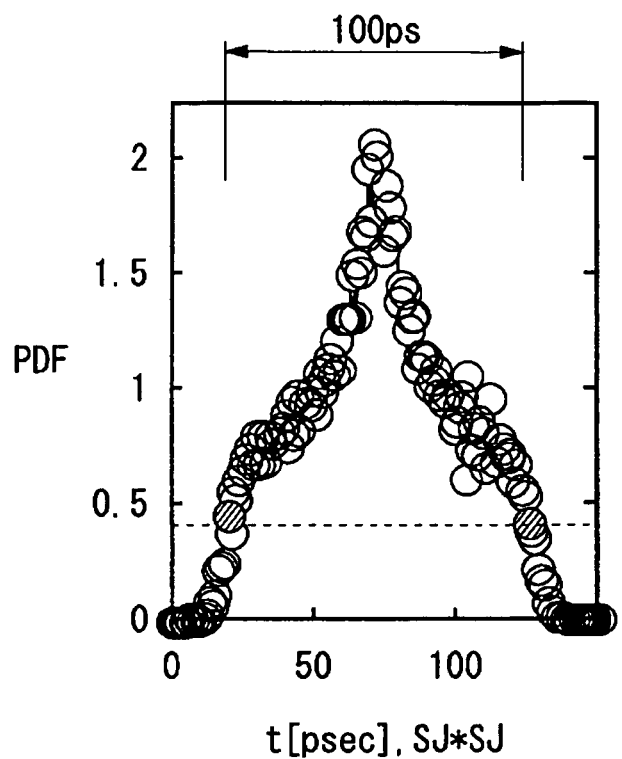
FIG. 20A shows a probability density function with a deterministic component consisting of two sine waves whose energies are equal to each other.

FIG. 20A shows a probability density function with a deterministic component including a sine wave and a sine wave of which energy is equal to that of the sine wave as a deterministic jitter. An expected value of D(p-p) in the present example is 100 ps.

Figure 20B:
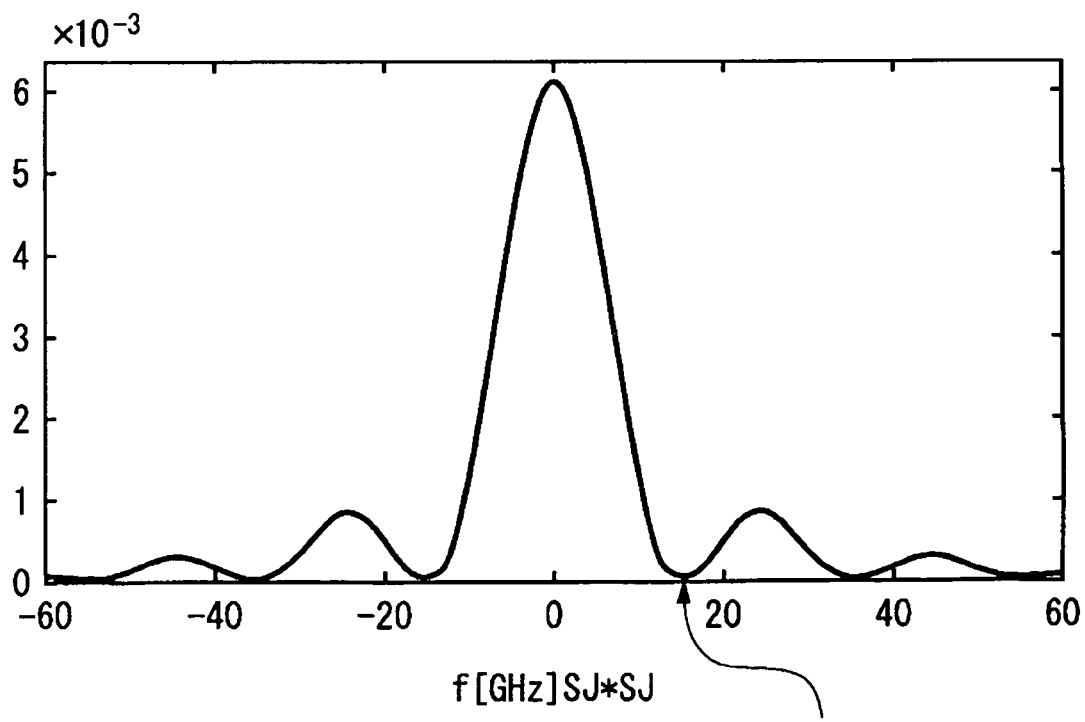
FIG. 20B shows a spectrum obtained by transforming a probability density function shown in FIG. 20A into a frequency domain.

FIG. 20B shows a spectrum obtained by transforming a probability density function shown in FIG. 20A into a frequency domain. Null frequency of this spectrum has an error of about 5 GHz for 10 GHz of an expected value.

Figure 21A:
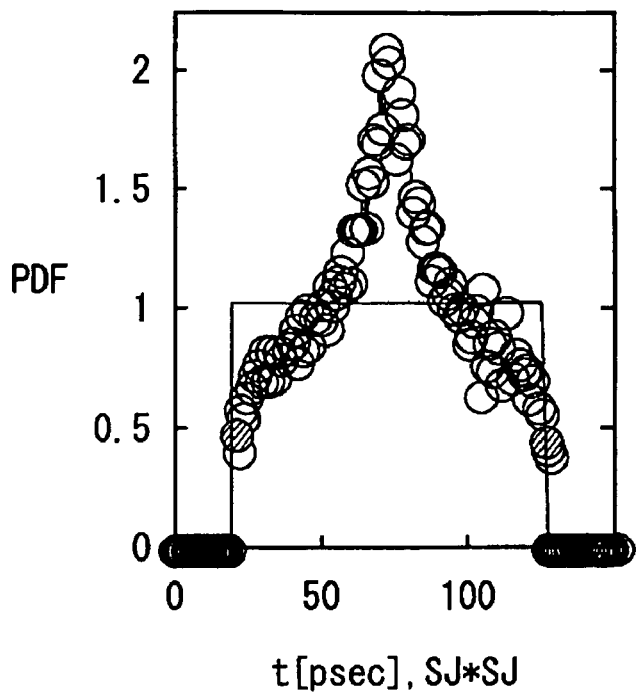
FIG. 21A is a view showing uniform distribution obtained by performing a predetermined threshold process on a probability density function shown in FIG. 20A.

FIG. 21A is a view showing uniform distribution obtained by performing a predetermined threshold process on a probability density function shown in FIG. 20A. In other words, a value larger than a predetermined threshold value is replaced by this threshold value among values of this probability density function and a value smaller than the predetermined threshold value is replaced by zero, in order to show a probability density function transformed into uniform distribution.

Figure 21B:
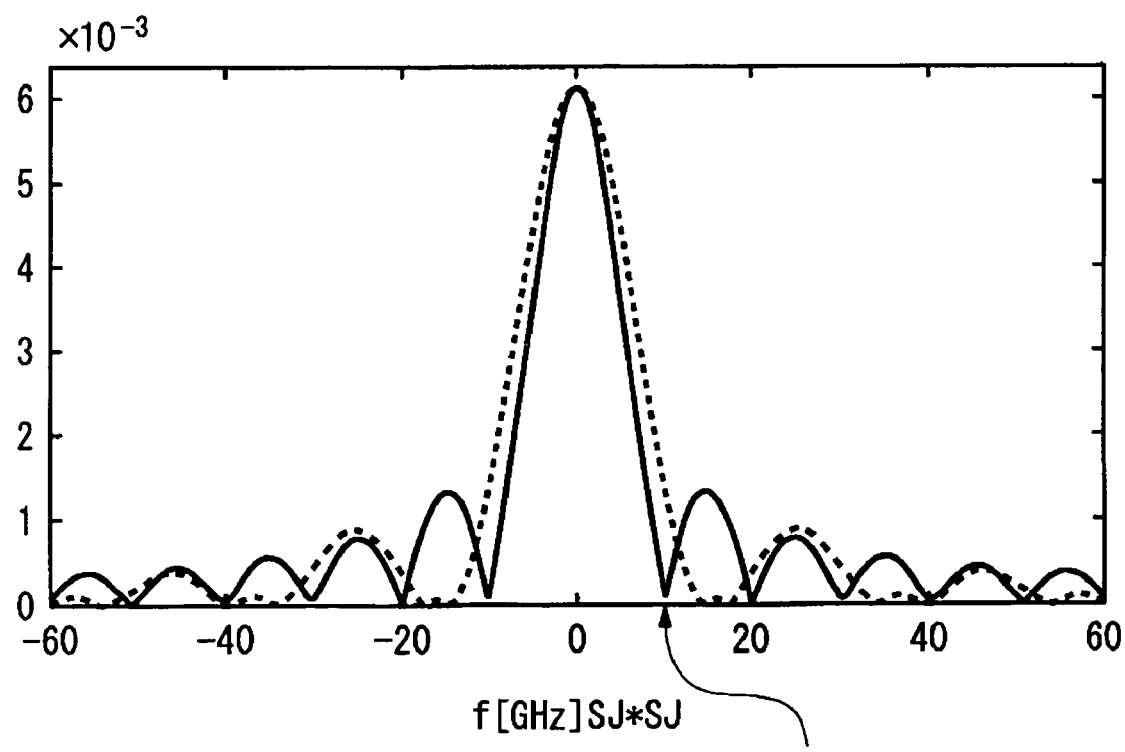
FIG. 21B is a view showing a spectrum obtained by transforming uniform distribution shown in FIG. 21A into a frequency domain.

FIG. 21B is a view showing a spectrum obtained by transforming uniform distribution shown in FIG. 21A into a frequency domain. It is possible to obtain 10.1 GHz substantially equal to an expected value as D(p-p) by performing a threshold process. A threshold value providing D(p-p) substantially identical with an expected value can be determined by, for example, sequentially changing a threshold value to compute D(p-p) for each threshold value and detecting a threshold value of which D(p-p) is not substantially changed.

FIG. 22 shows values of D(p-p) measured by a threshold process and D($\delta\delta$) measured by a conventional method for a probability density function including a plurality of deterministic jitters.

As described in FIGS. 20 and 21, in case of measuring a probability density function made by convolution integrating two sine waves, in a conventional curve fitting method, a result of D($\delta\delta$)=80.5 ps is obtained when an expected value of a peak to peak value of a deterministic component is 100 ps. Correspondingly, in the measurement performing a threshold process, it is possible to obtain D(p-p)=99.0 ps substantially equal to an expected value. Similarly, when measuring a probability density function made by convolution integrating two sine waves of a sine wave and a relatively small sine wave as a deterministic jitter, in the measurement performing a threshold process, it is possible to obtain D(p-p)=49.0 ps substantially equal to an expected value.

Moreover, conventionally, each deterministic component cannot be separated from a probability density function in which a plurality of deterministic components is convolution integrated.

Figure 23B:
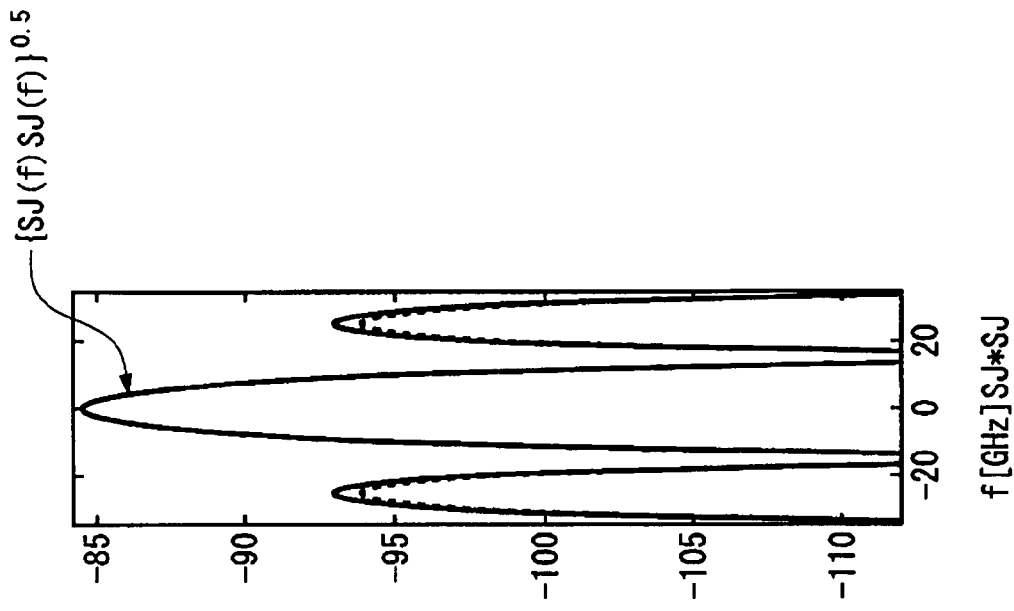
FIG. 23B is a view showing comparison for a main lobe.
Figure 23A:
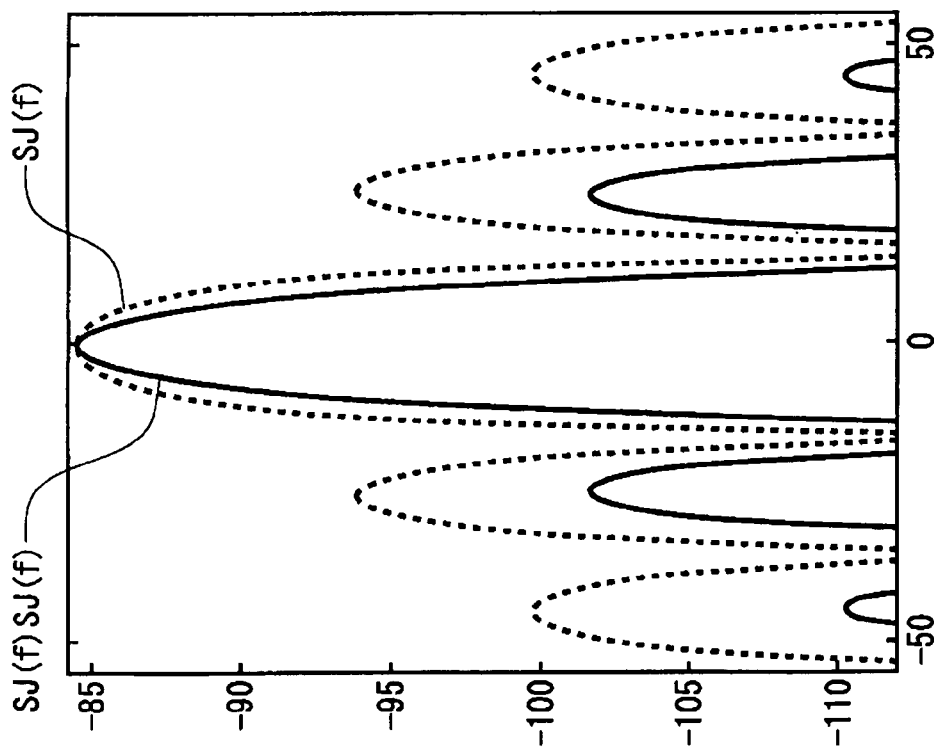
FIG. 23A shows a spectrum of a probability density function with a deterministic component of a sine wave and a spectrum of a probability density function with a deterministic component in which two sine waves are convolution integrated.

FIG. 23A shows a spectrum of a probability density function with a deterministic component of a sine wave and a spectrum of a probability density function with a deterministic component in which two sine waves are convolution integrated. Since a spectrum of a probability density function in which two sine waves are convolution integrated is a square of a spectrum of a probability density function of one sine wave, a level of a main lobe adjacent to 0 Hz changes. In other words, as shown in FIG. 23B, when raising a spectrum of a probability density function in which two sine waves are convolution integrated to 0.5th power, a probability density function of one sine wave and a main lobe are to be identical with each other.

Using the above-described principle, it is possible to obtain the number of deterministic components included in a probability density function.

Figure 24:
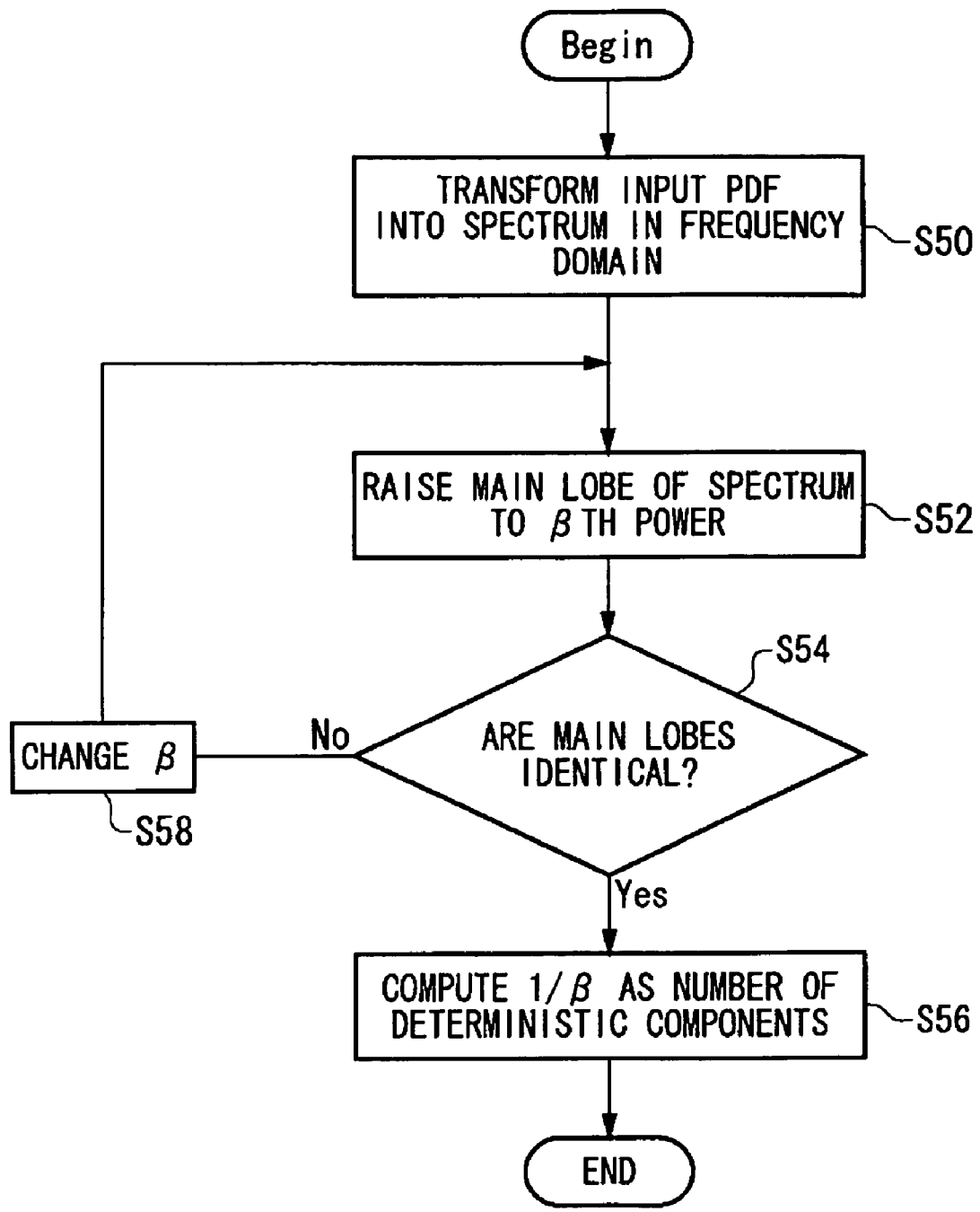
FIG. 24 is a flowchart exemplary showing a method for obtaining the number of deterministic components included in a probability density function.

FIG. 24 is a flowchart exemplary showing a method for obtaining the number of deterministic components included in a probability density function. First, an input PDF is transformed into a spectrum in a frequency domain (S50). The step S50 may be performed by the domain transforming section 110.

Next, a main lobe of a spectrum is raised to βth power (S52). Then, it is decided whether a main lobe of a spectrum of a probability density function with a predetermined deterministic component and β power of the main lobe obtained in S52 are identical with each other (S54). That main lobes are identical with each other may be determined when an error between the main lobes is within a predetermined range. A probability density function with a predetermined deterministic component may be designated by a user. Moreover, as described in reference to FIG. 10, the deterministic component computing section 150 may select a probability density function with a deterministic component out of a previously given plurality of functions.

In S54, when it is determined that the main lobes are not identical with each other, β is changed (S58), and then the processes of S52 and S54 are repeated. Moreover, in S54, when it is determined that the main lobes are identical with each other, the number of deterministic components is computed in S56.

In S56, 1/β is computed as the number of deterministic components. At this time, β is not limited to an integer number. A value of β after the decimal point shows that a deterministic component with the different size is included.

For example, when D(p-p) values of two sine waves described in FIGS. 20 and 21 are 50 ps, the whole value of D(p-p) becomes 100 ps. Then, for example, when performing a threshold process described in FIG. 21, a value substantially equal to 100 ps is measured as D(p-p) of a deterministic jitter.

Furthermore, by a method described in reference to FIG. 24, the number of deterministic components is computed. Since values of D(p-p) of two sine waves are substantially equal, β=0.5 is computed and the number of deterministic components becomes two. From the above-described result, it is possible to compute D(p-p) of each sine wave as 50 ps.

As described above, according to this method, it is possible to estimate the number of deterministic components from a probability density function including a plurality of deterministic components. The number of deterministic components may be computed by the deterministic component computing section 150 according to the method.

Figure 25:
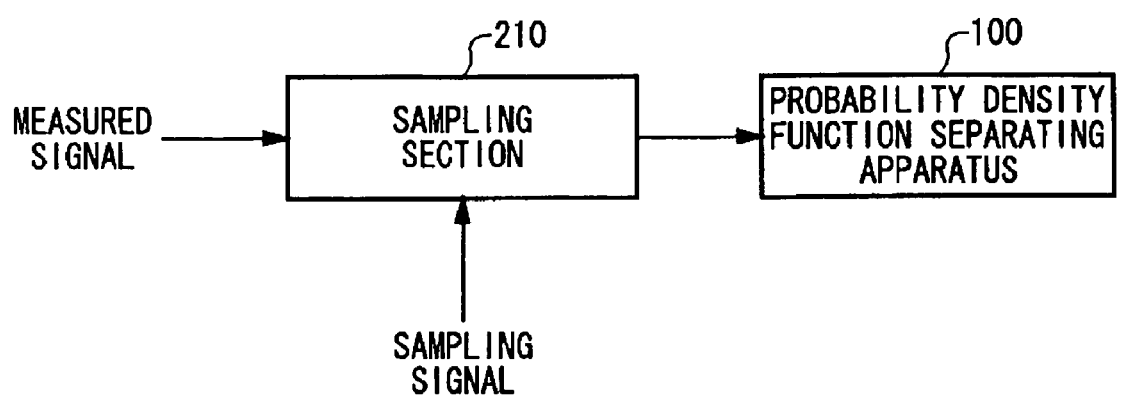
FIG. 25 is a view exemplary showing a configuration of a noise separating apparatus 200 according to an embodiment of the present invention.

FIG. 25 is a view exemplary showing a configuration of a noise separating apparatus 200 according to an embodiment of the present invention. The noise separating apparatus 200 separates a probability density function with a predetermined noise component from a probability density function of a measured signal. For example, the noise separating apparatus 200 separates a random noise component and a deterministic noise component from a probability density function with noises included in the measured signal.

The noise separating apparatus 200 includes a sampling section 210 and the probability density function separating apparatus 100. The probability density function separating apparatus 100 may have the same function and configuration as those of the probability density function separating apparatus 100 described in FIGS. 1 to 24.

The sampling section 210 samples the measured signal according to a given sampling signal, and generates a probability density function of the measured signal. For example, the sampling section 210 may generate a probability density function with jitter included in the measured signal, or generate a probability density function with amplitude noises of the measured signal.

Figure 26:
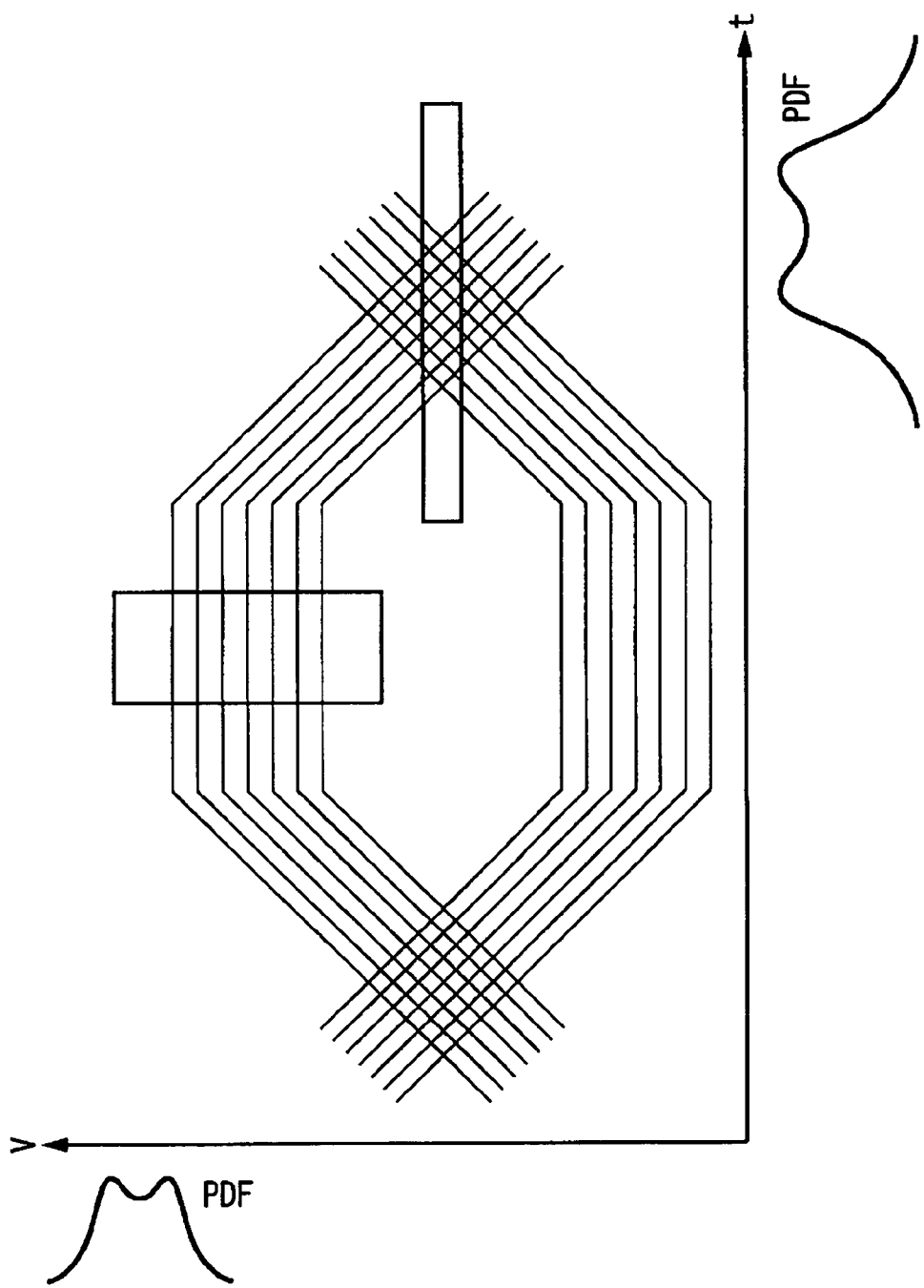
FIG. 26 is a view exemplary showing a probability density function of a measured signal generated from a sampling section 210.

FIG. 26 is a view exemplary showing a probability density function of a measured signal generated from the sampling section 210. The sampling section 210 according to the present example outputs a probability density function of a measured signal as described in FIG. 25. FIG. 26 shows an eye diagram of the measured signal assuming that a horizontal axis is a time and a vertical axis is a level of the measured signal. The sampling section 210 may acquire this eye diagram.

When generating a probability density function with jitter included in the measured signal, the sampling section 210 computes a probability by which an edge of the measured signal exists for each time. For example, the sampling section 210 may sample the measured signal by multiple times for each of relative timings for the measured signal in a transition timing of the measured signal. Then, a probability by which an edge exists at each of the relative timings may be acquired based on a sampling result.

Moreover, when generating a probability density function of amplitude noises in a measured signal, the sampling section 210 acquires a probability by which the measured signal is likely to have a particular amplitude value. For example, the sampling section 210 acquires an amplitude value of the measured signal at the generally same relative timing to the measured signal in a stationary timing of the measured signal.

When the sampling section 210 is a comparator for comparing a reference voltage and a level of the measured signal, the sampling section 210 may change this reference voltage and sample the measured signal for each reference voltage by multiple times.

For each amplitude value, the sampling section 210 acquires a probability based on a sampling result.

The probability density function separating apparatus 100 separates a random component and a deterministic component from a probability density function provided from the sampling section 210. For example, when this probability density function is a probability density function of jitter in a measured signal, the probability density function separating apparatus 100 can separate a random jitter from a deterministic jitter in the measured signal with high precision.

Moreover, when this probability density function is a probability density function of amplitude noises in a measured signal, the probability density function separating apparatus 100 can separate a random component from a deterministic component in amplitude noises of the measured signal with high precision.

For this reason, according to the noise separating apparatus 200 in the present example, it is possible to separate a noises component of a measured signal with high precision and thus analyze the measured signal with high precision.

Moreover, the noise separating apparatus 200 can also separate a random component from a deterministic component in noises of a sampling signal given to the sampling section 210.

For example, the sampling section 210 has a comparator or an ADC for converting a level of a measured signal into a digital value according to the sampling signal.

When an analog sinusoidal jitter or amplitude noise is given as a measured signal, a probability density function of digital data output from the comparator or the ADC in the sampling section 210 shows a characteristic that both ends sharply attenuated as shown in FIG. 2. However, when internal noises occur in a sampling signal and measurement errors occur in digital data, this probability density function becomes a composite component of a random component and a deterministic component.

The sampling section 210 generates a probability density function of the measured signal based on a result obtained by sampling the measured signal with small noises. Then, the probability density function separating apparatus 100 separates a random component and a deterministic component included in this probability density function. In this way, it is possible to measure noises of a sampling signal with high precision.

Moreover, the noise separating apparatus 200 can be also used for a test of the ADC. That is to say, it is possible to separate a deterministic component caused by a code error of the ADC.

Figure 27:
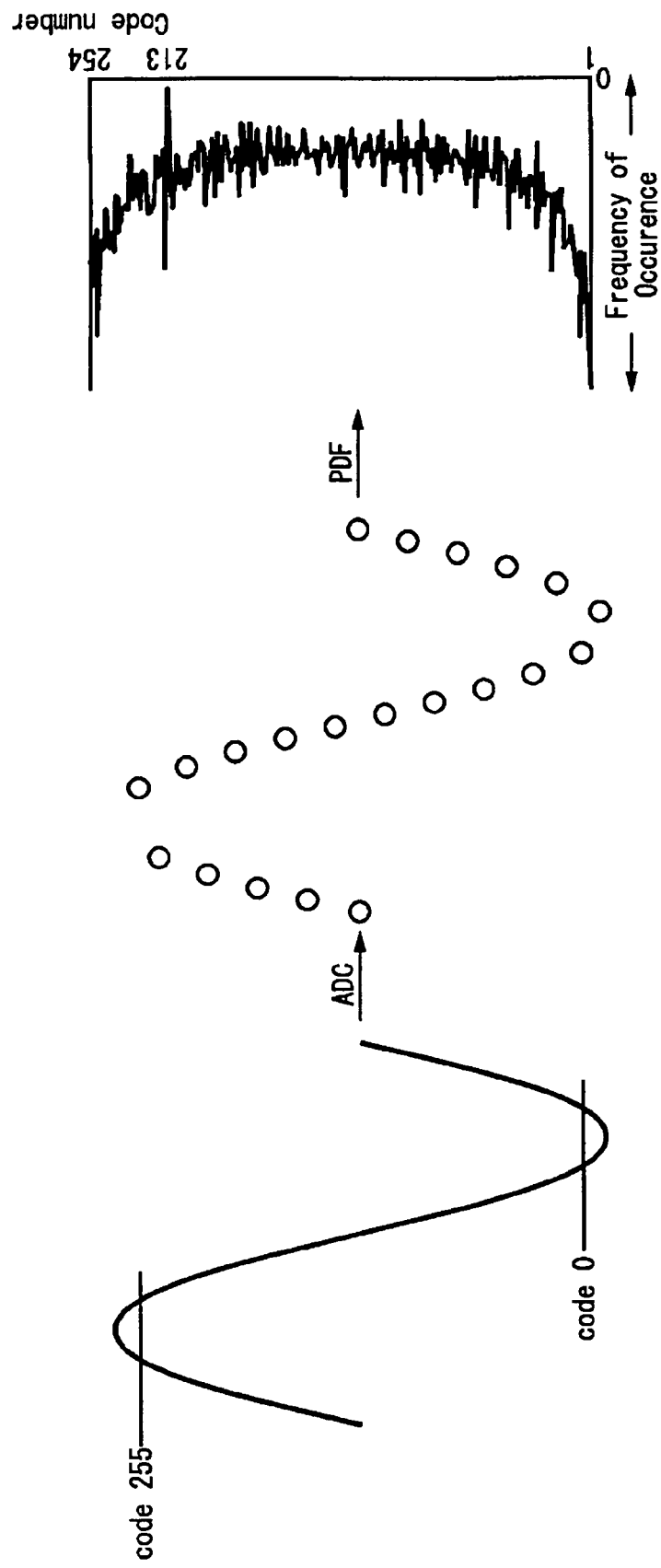
FIG. 27 is a view explaining a deterministic component by a code error of ADC.

FIG. 27 is a view showing probability density of each code of an ADC when the ADC samples a sine wave without noises. Here, a code of the ADC is a code corresponding to each digital value output from the ADC. The ADC determines which code corresponds to a level of a signal to be input, and outputs a digital value according to this code.

In the present example, the ADC has codes of 0 to 255. Here, it will be described, for example, about when an error occurs in the 213th code and a level corresponding to this code cannot be detected. In this case, as shown in FIG. 27, probability density of the code 213 deteriorates and probability density of a code (a code 214 in the present example) adjacent to the code 213 rises. The reason is that the code 214 detects a level of a sine wave to be originally detected by the code 213.

A probability density function shown in FIG. 27 includes a deterministic component by a sine wave to be input and a deterministic component caused by a code error of the ADC. As described in reference to FIG. 24, the probability density function separating apparatus 100 can separate these deterministic components.

Figure 28:
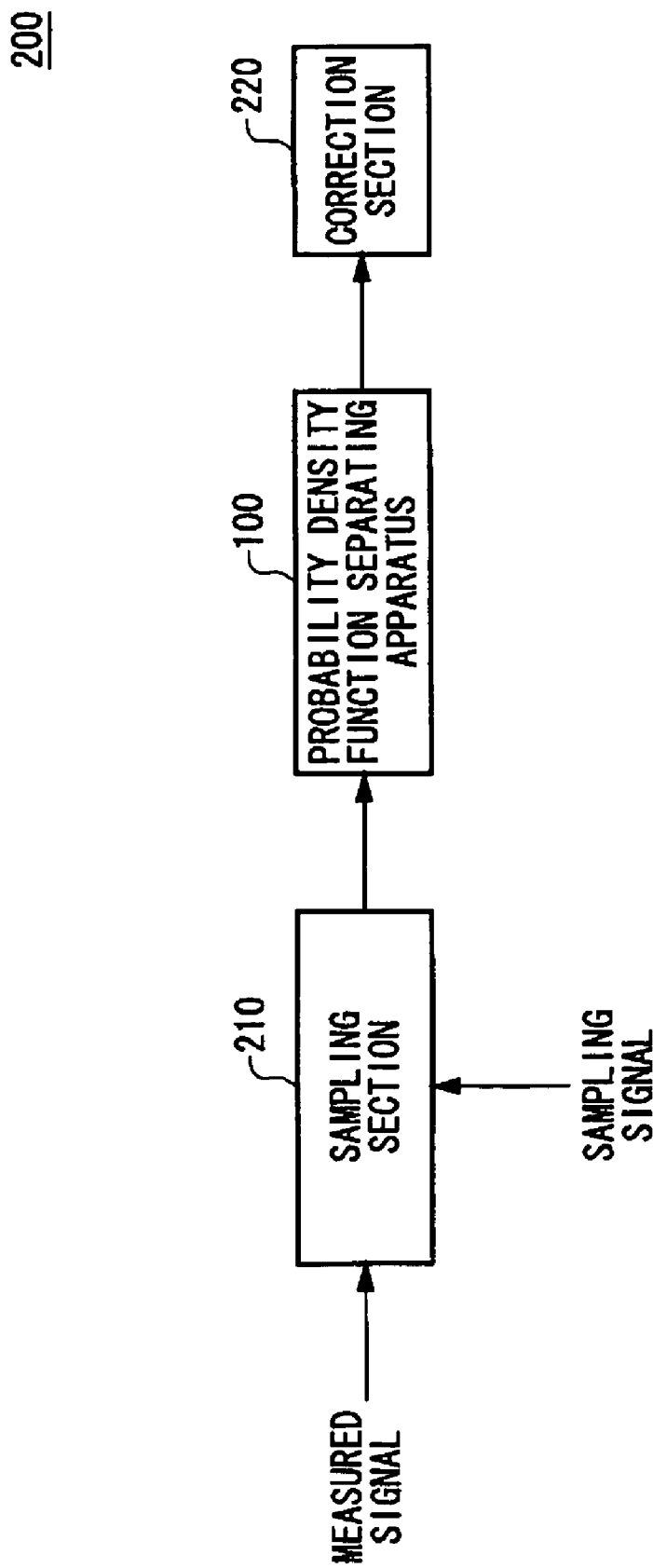
FIG. 28 is a view showing another example of a configuration of a noise separating apparatus 200.

FIG. 28 is a view showing another example of a configuration of the noise separating apparatus 200. The noise separating apparatus 200 in the present example further includes a correction section 220 in addition to a configuration of the noise separating apparatus 200 described with reference to FIG. 25. The noise separating apparatus 200 in the present example reduces an influence by internal noises of the above-described sampling signal to separate a deterministic component and a random component from a probability density function of a measured signal.

For example, when reducing an influence by noises of a sampling signal, the sampling section 210 first functions as a sampling signal measuring section that computes a probability density function of a sampling signal itself as described above. At this time, it is preferable that the sampling section 210 is supplied with a reference signal with small noises.

Moreover, the sampling section 210 functions as a measured signal measuring section that computes a probability density function of a measurement signal to be measured. At this time, the sampling section 210 may perform an operation similar to that of the sampling section 210 described in FIG. 20.

The probability density function separating apparatus 100 separates a random component and a deterministic component from each of a probability density function of a measured signal and a probability density function of a timing signal.

Then, the correction section 220 separates a random component from a deterministic component in the measured signal with higher precision by correcting a parameter of the probability density function of the measured signal based on the probability density function of the timing signal.

For example, the correction section 220 may correct a random component according to the measured signal by subtracting energy of a random component according to the timing signal from energy of a random component according to the measured signal. Moreover, the correction section 220 may correct a deterministic component according to the measured signal by subtracting a deterministic component according to the timing signal from a deterministic component according to the measured signal.

By such a process, it is possible to separate a random component from a deterministic component according to a measured signal with high precision.

Figure 29:
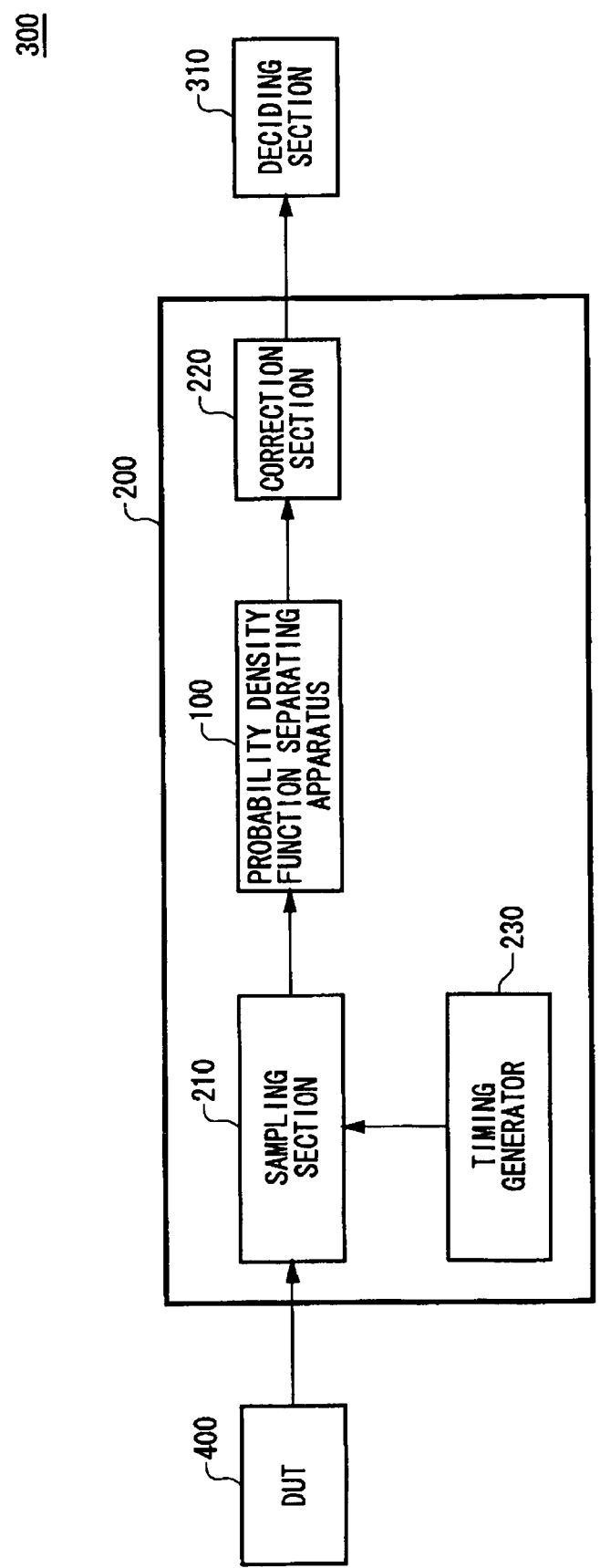
FIG. 29 is a view exemplary showing a configuration of a testing apparatus 300 according to an embodiment of the present invention.

FIG. 29 is a view exemplary showing a configuration of a testing apparatus 300 according to an embodiment of the present invention. The testing apparatus 300 is an apparatus for testing a device under test 400 and includes a noise separating apparatus 200 and a deciding section 310.

The noise separating apparatus 200 has a configuration substantially equal to that of the noise separating apparatus 200 described in FIGS. 25 to 28 and measures a measured signal output from the device under test 400. In the present example, the noise separating apparatus 200 has a configuration substantially equal to that of the noise separating apparatus 200 shown in FIG. 28. The noise separating apparatus 200 may have a timing generator 230 for generating a timing signal as shown in FIG. 28. The other components are equal to components with the same symbol described in reference to FIGS. 25 to 28.

The deciding section 310 decides the good or bad of the device under test 400 based on a random noise component and a deterministic noise component separated from the noise separating apparatus 200. For example, the deciding section 310 may decide the good or bad of the device under test 400 based on whether standard deviation of the random noise component is within a predetermined range. Moreover, the deciding section 310 may decide the good or bad of the device under test 400 based on whether a peak to peak value of the deterministic noise component is within a predetermined range. The deciding section 310 may compute total jitter from the standard deviation of the random noise component and the peak to peak value of the deterministic noise component, and decide the good or bad of the device under test 400. The deciding section 310 may compute total jitter, for example, given by $14*\sigma+D(p\text{-}p)$.

According to the testing apparatus 300 in the present example, since a probability density function of a measured signal can be separated with high precision, it is possible to decide the good or bad of the device under test 400 with high precision. Moreover, the testing apparatus 300 may further include a pattern generating section that inputs a test signal into the device under test 400 and outputs a predetermined output signal.

FIG. 30 is a view exemplary showing a measurement result of jitter by the jitter separating apparatus 200 and a measurement result of jitter by a conventional method. As shown in FIG. 30, the jitter separating apparatus 200 can obtain a measurement result with precision more preferable than a conventional method in any measurement result of a random jitter and a deterministic jitter, about when only a random jitter is included in a measured signal, when a random jitter and sine wave jitter (a deterministic jitter) are included in a measured signal, and when noises are included in a sampling signal.

Figure 31:
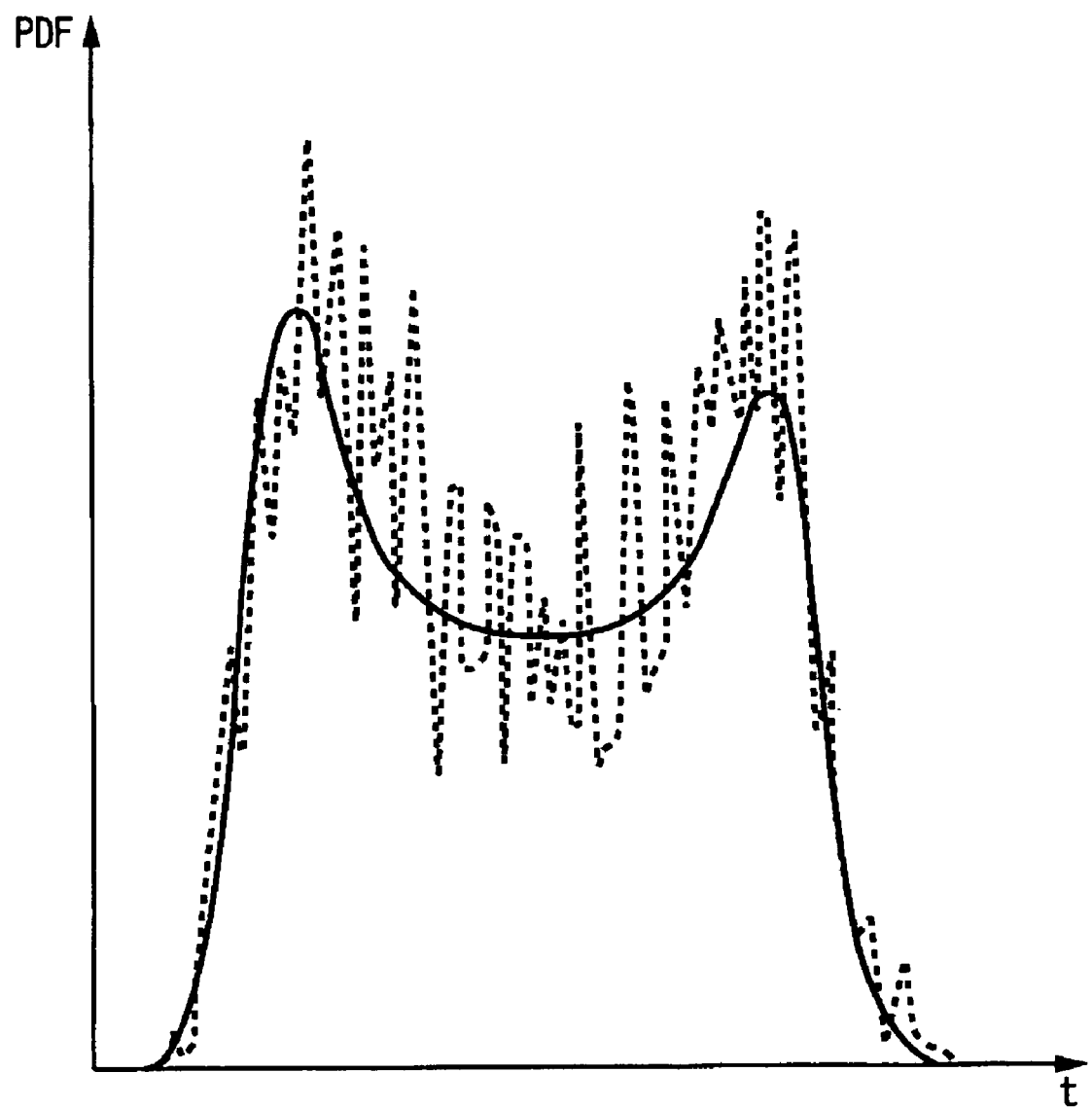
FIG. 31 is a view showing a conventional measurement result described in FIG. 30.

FIG. 31 is a view showing a conventional measurement result described in FIG. 30. As described above, according to a conventional measuring method, tail portions of an input PDF shown with a wavy line in FIG. 31 is curve fitted. As a result, random components as shown with a solid line in FIG. 31 is detected. Moreover, an interval between two peaks of this random components is detected as a deterministic component. When using such a measuring method, since curve-fitting approximation is used, each component cannot be measured with high precision. For this reason, a measurement result has gross errors with respect to an expected value as shown in FIG. 30.

Moreover, this method cannot separate a deterministic component caused by the above-described error in sampling signal and a deterministic component caused by a code error of an ADC. For this reason, for example, when a sampling error occurs as shown in FIG. 30, it is not possible to perform measurement with high precision.

Figure 32:
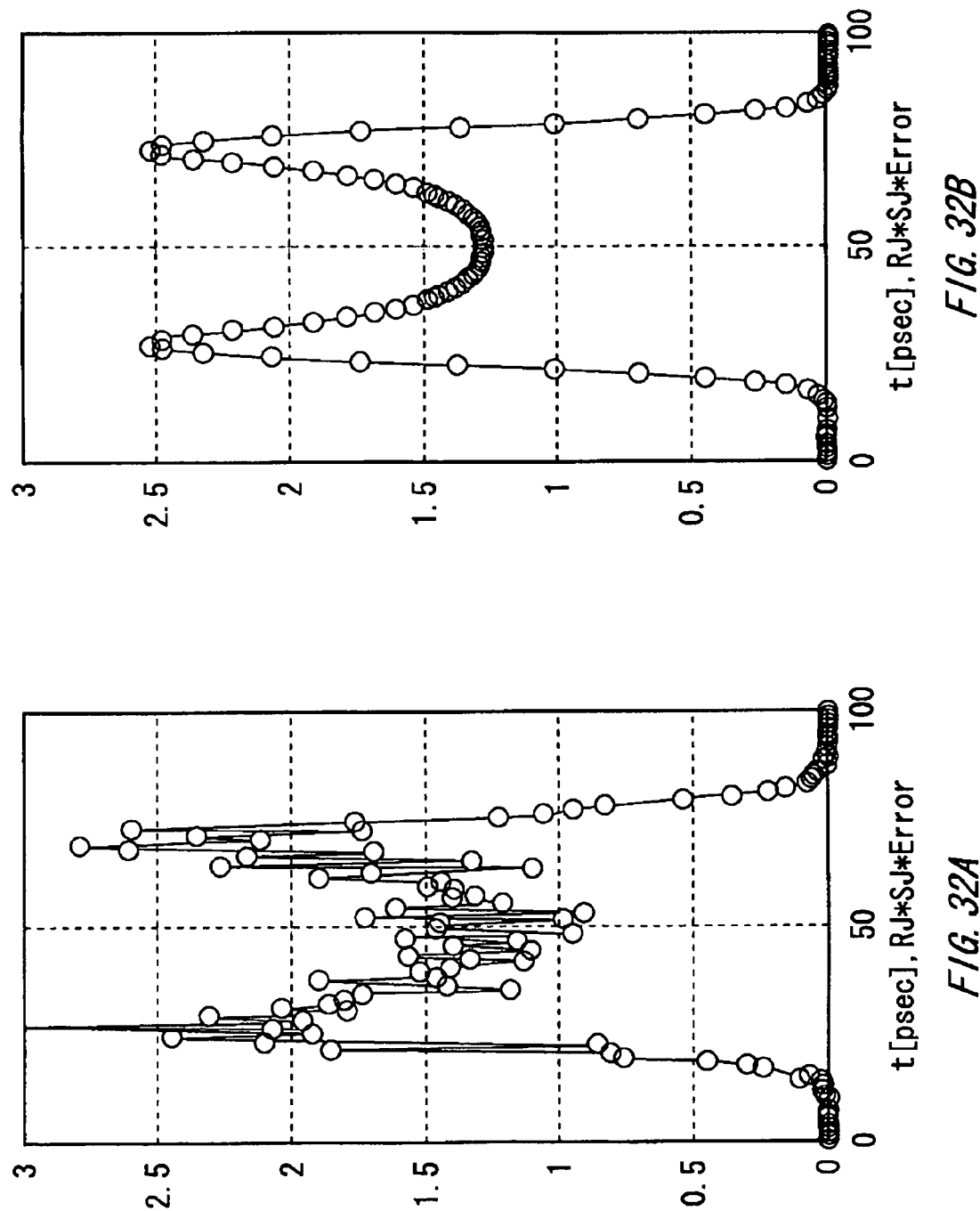
FIG. 32 is a view showing a measurement result by the present invention described in FIG. 30.

FIGS. 32A and 32B are views showing a measurement result by the present invention described in FIG. 30. FIG. 32A shows an input PDF and FIG. 32B shows a probability density function obtained by convolving a deterministic component and a random component separated using the probability density function separating apparatus 100. The probability density function separating apparatus 100 can separate a random component from a deterministic component in the input PDF with high precision as described above. For this reason, as shown in FIG. 30, it is possible to obtain a measurement result with a small error for an expected value. Furthermore, since the present invention can separate a plurality of deterministic components, it is possible to separate, for example, a deterministic component of a sinusoid and a deterministic component caused by timing errors in a sampling signal. As a result, it is possible to perform measurement with higher precision.

Figure 33:
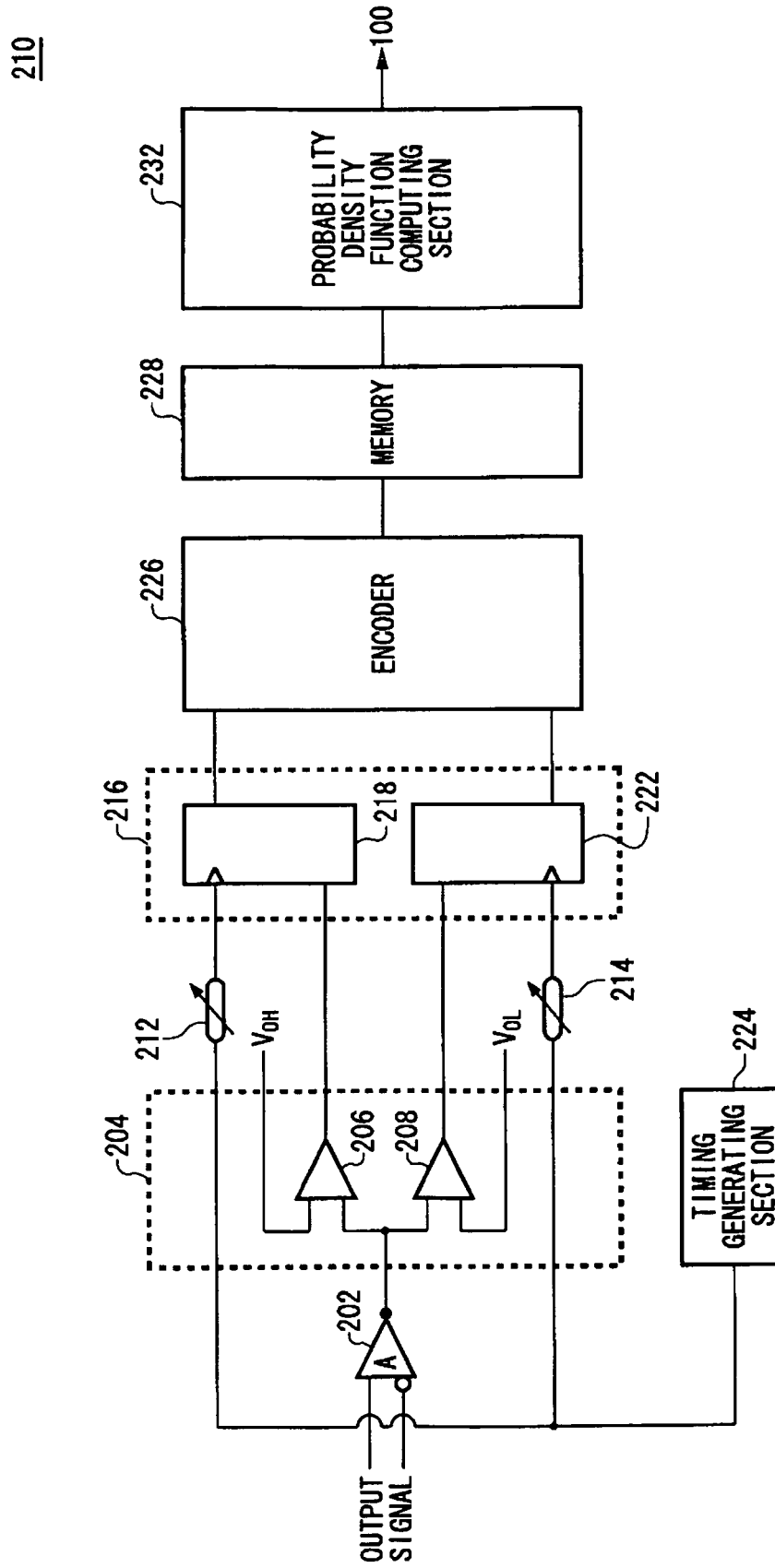
FIG. 33 is a view exemplary showing a configuration of a sampling section 210 described in FIG. 29.

FIG. 33 is a view exemplary showing a configuration of the sampling section 210 described in FIG. 29. The sampling section 210 has an amplifier 202, a level comparing section 204, a variable delay circuit 212, a variable delay circuit 214, a timing comparing section 216, an encoder 226, a memory 228, and a probability density function computing section 232.

The amplifier 202 receives an output signal from the device under test 400, amplifies the signal at a predetermined amplification gain, and outputs the amplified signal. The level comparing section 204 compares a level of the output signal and a given reference value, and outputs a comparison result. In the present example, the level comparing section 204 has a comparator 206 and a comparator 208. The comparator 206 is supplied with a reference value of a High level. Moreover, the comparator 208 is supplied with a reference value of a Low level.

The timing comparing section 216 samples the comparison result output from the level comparing section 204 according to a given timing signal, and converts it into digital data. In the present example, the timing comparing section 216 has a flip-flop 218 and a flip-flop 222.

The flip-flop 218 receives the timing signal output from the timing generating section 224 via the variable delay circuit 212. Moreover, the flip-flop 218 samples the comparison result output from the comparator 206 according to this timing signal.

The flip-flop 222 receives the timing signal output from the timing generating section 224 via the variable delay circuit 214. Moreover, the flip-flop 222 samples the comparison result output from the comparator 208 according to this timing signal.

In the present example, the level comparing section 204 has two comparators 206 and 208. However, the level comparing section 204 may output a comparison result by one comparator, or may output a comparison result by three or more comparators. In other words, the level comparing section 204 may output a comparison result with multiple values. The timing comparing section 216 may have flip-flops according to the number of comparators belonging to the level comparing section 204.

The variable delay circuits 212 and 214 delay and output a timing signal. The variable delay circuits 212 and 214 adjust a phase of the timing signal to a predetermined phase to supply it to the timing comparing section 216.

The encoder 226 encodes the digital data output from the timing comparing section 216. For example, the encoder 226 may generate digital data with multiple values based on each of the digital data output from the flip-flop 218 and the flip-flop 222. The memory 228 stores the digital data generated from the encoder 226.

The probability density function computing section 232 computes a probability density function of the output signal based on the digital data stored on the memory 228. For example, the probability density function computing section 232 may generate a probability density function with a jitter described in FIG. 26, or may generate a probability density function with an amplitude degradation component described in FIG. 26.

When generating a probability density function with a jitter, the timing generating section 224 generates a timing signal of which a phase for the output signal is sequentially changed. The phase of the timing signal may be adjusted by changing a delay amount in the variable delay circuits 212 and 214. Moreover, the level comparing section 204 is supplied with a reference value.

The timing comparing section 216 samples a logical value of the output signal according to a timing signal of which a phase for the output signal is sequentially changed. The probability density function computing section 232 compares a sampled value sequence stored on the memory 228 and a given expected value sequence.

Moreover, the probability density function computing section 232 detects a phase of the output signal based on this comparison result. For example, the probability density function computing section 232 may detect a phase of an edge of the output signal based on this comparison result. Moreover, the probability density function computing section 232 may detect a timing at which a logical value of the output signal is changed. At this time, although consecutive data in the output sequence show the identical logical value, the probability density function computing section 232 can detect a boundary timing of each data section in the output signal.

Moreover, the timing comparing section 216 and the probability density function computing section 232 perform comparison between the logical value of the output sequence and the expected value at each phase of the timing signal for multiple times, and obtains an error count value. A probability by which the logical value of the output signal is generated at each phase can be computed from this error count value. In other words, it is possible to generate a probability density function with a jitter. For example, the timing comparing section 216 and the probability density function computing section 232 perform comparison between the logical value of the output sequence and the expected value at each phase of the timing signal for multiple times. Then, a probability density function may be obtained by computing a difference between error count values of adjacent phases of the corresponding timing signals.

Next, it will be described about when a probability density function with an amplitude degradation component in an output signal is generated. In this case, the timing generating section 224 generates a timing signal substantially synchronized with the output signal. In other words, an edge of the timing signal has a constant phase for the output signal. Moreover, the level comparing section 204 is sequentially supplied with different reference values.

The timing comparing section 216 samples the comparison result according to the timing signal synchronized with the output signal. In other words, the timing comparing section 216 detects a comparison result between a level of the output signal at an edge timing of the timing signal and a reference value. It is possible to generate a probability density function with an amplitude degradation component in the output signal by detecting this comparison result for each reference value for multiple times.

The probability density function computing section 232 supplies the generated probability density function to the probability density function separating apparatus 100. By such a configuration, it is possible to separate a noise component from an output signal with high precision and thus test the device under test 400 with high precision. For example, in case of testing a random jitter included in an output signal from the device under test 400, when a deterministic jitter occurs in a timing signal, the good or bad of the device under test 400 cannot be decided with high precision. However, according to the testing apparatus 300 in the present example, it is possible to simultaneously separate a component of a deterministic jitter caused by a timing signal and detect a component of a random jitter in an output signal.

FIG. 34 is a view exemplary showing a measurement result by the testing apparatus 300 described with reference to FIG. 33 and a measurement result by a conventional curve fitting method described in FIG. 2. In FIG. 2 shows an error between each measurement result and a measurement result to be expected.

In addition, the measurement result by a conventional method in the present example has been quoted from the following document: G. Hansel, K. Stieglbauer, "Implementation of an Economic Jitter Compliance Test for a Multi-Gigabit Device on ATE", in Proc. IEEE int. Test Conf., Charlotte, N.C., Oct. 26-28, 2004, pp. 1303-1311.

Moreover, in measurement of the present example, a random component and a deterministic component in a probability density function of jitter in an output signal from the device under test 400 have been separated from each other. Moreover, the measurement result by the conventional method corresponds to a case of including a large sinusoidal component with amplitude of about 40 ps and a case including a small sinusoidal component with amplitude of about 5 ps as a deterministic component.

As shown in FIG. 34, the testing apparatus 300 can obtain a measurement result with a smaller error than that of a conventional curve fitting method in any case.

Figure 35:
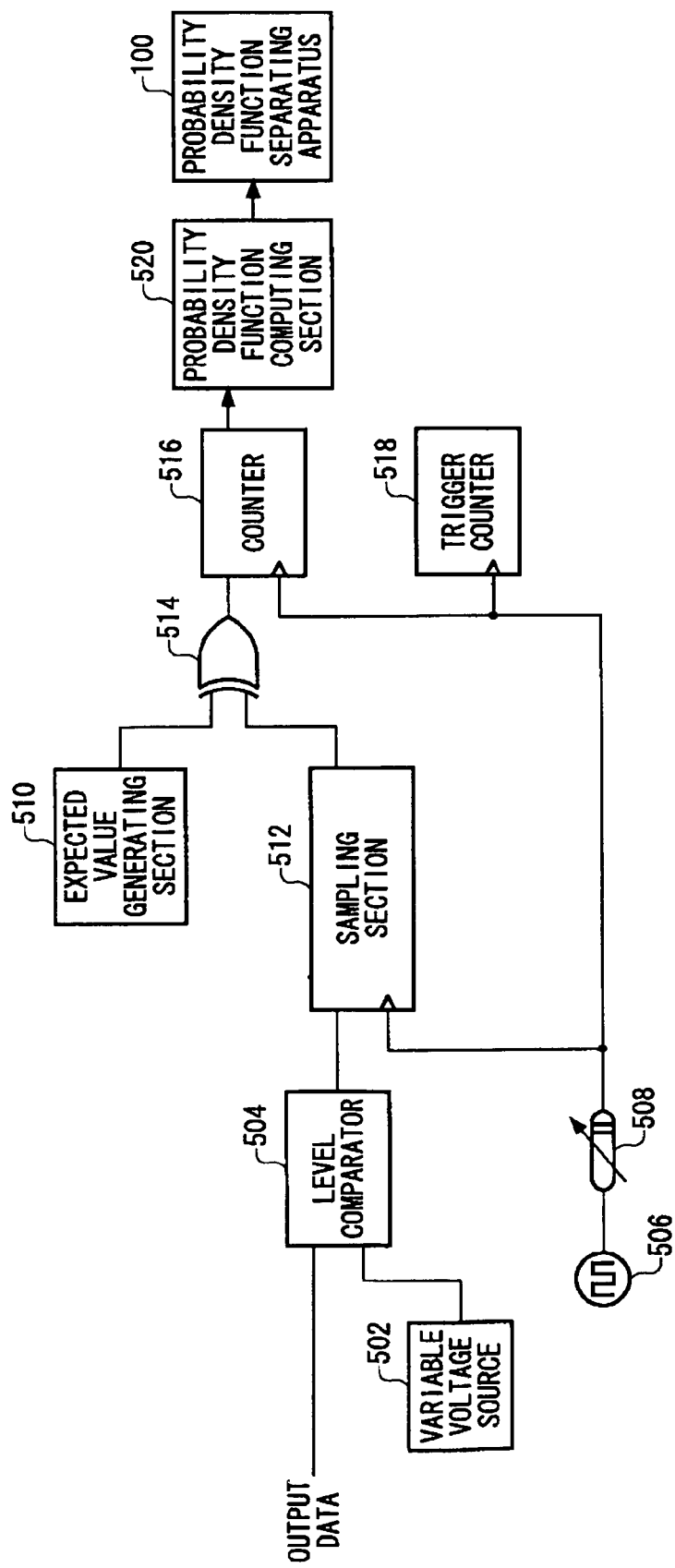
FIG. 35 is a view exemplary showing a configuration of a bit error rate measuring apparatus 500 according to an embodiment of the present invention.

FIG. 35 is a view exemplary showing a configuration of a bit error rate measuring apparatus 500 according to an embodiment of the present invention. The bit error rate measuring apparatus 500 is an apparatus for measuring a bit error rate of output data provided from the device under test 400 or the like, and includes a variable voltage source 502, a level comparator 504, an expected value generating section 510, a sampling section 512, an expected value comparing section 514, a timing generating section 506, a variable delay circuit 508, a counter 516, a trigger counter 518, a probability density function computing section 520, and a probability density function separating apparatus 100.

The level comparator 504 compares a level of output data and a given reference value, and outputs comparison data. For example, the level comparator 504 outputs comparison data showing a magnitude relation between a level of output data and the given reference value with a binary logical value. The variable voltage source 502 generates this reference value. The sampling section 512 samples a data value output from the level comparator 504 according to a given timing signal.

The timing generating section 506 generates a timing signal, and supplies the generated signal to the sampling section 512 via the variable delay circuit 508. The timing generating section 506 may generate a timing signal with a period substantially equal to that of the output data. The variable delay circuit 508 adjusts the timing signal to a predetermined phase.

The expected value generating section 510 generates an expected value that the data value output from the sampling section 512 should have. The expected value comparing section 514 compares the data value output from the sampling section 512 and the expected value output from the expected value generating section 510. The expected value comparing section 514 may output, for example, an exclusive OR of this data value and this expected value.

The counter 516 counts the number of times by which a comparison result in the expected value comparing section 514 shows a predetermined logical value. For example, the counter counts the number of times by which the exclusive OR output from the expected value comparing section 514 is one. Moreover, the trigger counter 518 counts pulses of the timing signal.

By such a configuration, it is possible to count the number of erroneous timings by which a data value of output data at a particular phase of timing signal is different form expected value. Moreover, similarly to the testing apparatus 300 described in FIG. 33, an error count value is obtained for each phase of a timing signal by sequentially changing a phase of the timing signal. The probability density function computing section 520 may compute a probability density function of a jitter in output data by computing a difference between adjacent error count values.

In addition, similarly to the testing apparatus 300 described in FIG. 33, although consecutive data in an output sequence show the identical logical value, the probability density function computing section 520 can detect a boundary timing of each data section in output data.

Moreover, similarly to the testing apparatus 300 described in FIG. 33, the probability density function computing section 520 can compute a probability density function of an amplitude degradation component of output data by sequentially changing the reference value generated from the variable voltage source 502. In this case, a phase of a timing signal for capturing output data is substantially constantly controlled.

The probability density function separating apparatus 100 is equal to the probability density function separating apparatus 100 described with reference to FIG. 29. That is to say, a deterministic component and a random component in a given probability density function are separated from each other.

By such a configuration, it is possible to generate a probability density function of given output data and simultaneously separate a deterministic component and a random component. In other words, it is possible to simultaneously separate and analyze a bit error caused by a deterministic component from a bit error caused by a random component.

Figure 36:
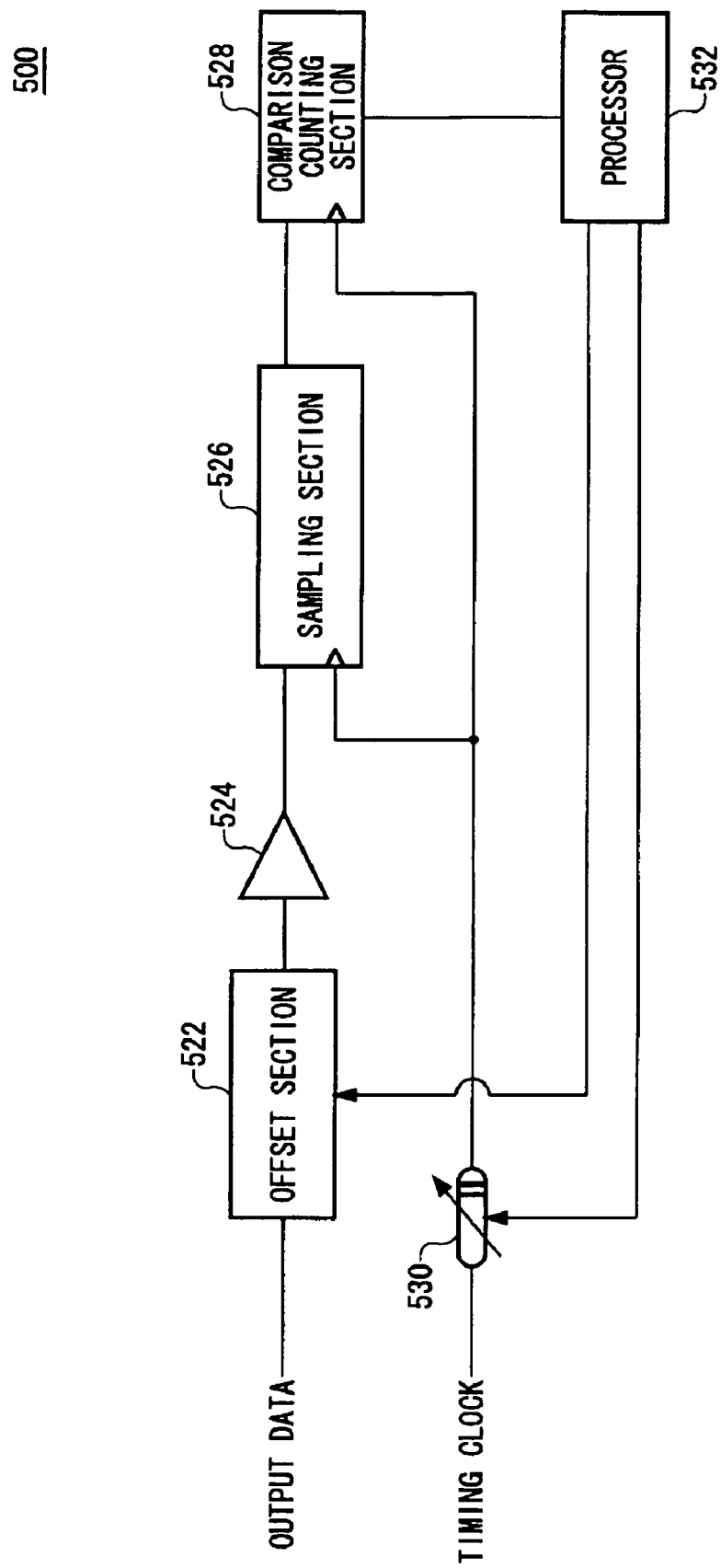
FIG. 36 is a view showing another example of a configuration of a bit error rate measuring apparatus 500.

FIG. 36 is a view showing another example of a configuration of the bit error rate measuring apparatus 500. The bit error rate measuring apparatus 500 in the present example includes an offset section 522, an amplifier 524, a sampling section 526, a comparison counting section 528, a variable delay circuit 530, and a processor 532.

The offset section 522 adds a predetermined offset voltage to a waveform of output data. The amplifier 524 outputs a signal output from the offset section 522 at a predetermined amplification factor.

The sampling section 526 samples a data value of the signal output from the amplifier 524 according to a given timing clock. A timing clock may be, e.g., a recovered clock generated from output data. The variable delay circuit 530 adjusts a timing clock to a predetermined phase.

The comparison counting section 528 compares a data value output from the sampling section 526 and a given expected value, and counts a comparison result. The comparison counting section 528 may have a function equal to that of the expected value comparing section 514 and the counter 516 described in FIG. 35.

The processor 532 controls the offset section 522 and the variable delay circuit 530. For example, the processor adjusts an offset voltage to a predetermined level and controls a delay amount in the variable delay circuit 530. By such a configuration, it is possible to compute a probability by which a data value of output data corresponding to a phase of a timing clock is different from the expected value.

Moreover, the processor 532 functions as the probability density function computing section 520 and the probability density function separating apparatus 100 described in FIG. 35. Similarly to the testing apparatus 300 described in FIG. 33, the processor 532 can compute a probability density function of a jitter in output data by sequentially changing a phase of a timing clock. For example, it is possible to can change a phase of a timing clock by changing a delay amount in the variable delay circuit 530.

Here, a jitter in output data may be a timing jitter at a boundary of each data section in output data. Although consecutive data in an output signal show the identical logical value, the probability density function computing section 520 can detect a boundary timing of each data section in output signal.

Moreover, it is possible to perform measurement equal to a case when changing a reference value described in FIG. 35 by sequentially changing an offset voltage added by the offset section 522. In this case, the processor 532 can compute a probability density function with an amplitude degradation component of output data. In this case, a phase of a timing clock for output data is substantially constantly controlled.

The probability density function separating apparatus 100 is equal to the probability density function separating apparatus 100 described with reference to FIG. 29. That is to say, a deterministic component and a random component in a given probability density function are separated from each other.

By such a configuration, it is also possible to generate a probability density function of given output data and separate a deterministic component from a random component in this probability density function. In other words, it is possible to simultaneously separate and analyze a bit error caused by a deterministic component and a bit error caused by a random component.

Figure 37:
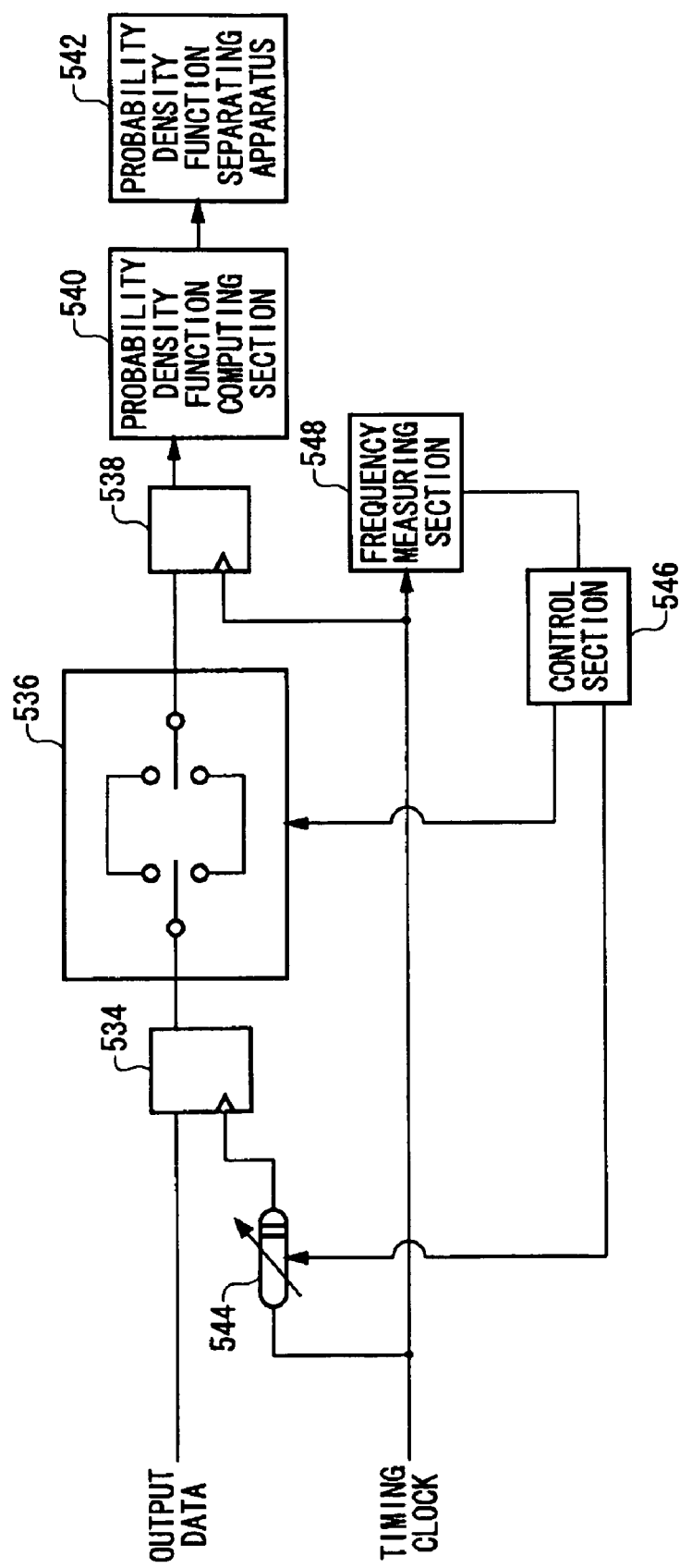
FIG. 37 is a view showing another example of a configuration of a bit error rate measuring apparatus 500.

FIG. 37 is a view showing another example of a configuration of the bit error rate measuring apparatus 500. The bit error rate measuring apparatus 500 in the present example includes a flip-flop 534, a switch section 536, a flip-flop 538, a frequency measuring section 548, a control section 546, a probability density function computing section 540, and a probability density function separating apparatus 542.

The flip-flop 534 samples a data value of output data according to a given timing clock.

The switch section 536 selects one path from a plurality of paths having path length different from one another, and delays and outputs the data value output from the flip-flop 534 in a fixed delay amount according to the selected path. The latch section 538 latches the data value of which a phase is adjusted by the switch section 536 according to a given timing clock.

In other words, the bit error rate measuring apparatus 500 shown in FIG. 36 adjusts a relative phase of a sampling clock for output data by adjusting a phase of a timing clock. However, the bit error rate measuring apparatus 500 in the present example adjusts a relative phase of a sampling clock for output data by adjusting a phase of the output data.

As shown in FIG. 36, if a timing of a clock is controlled in a large range by means of a variable delay circuit, the variable delay element will output incomplete or partial clocks when delay setting changes are made. The bit error rate measuring apparatus 500 in the present example can reduce a delay range of the variable delay circuit 544 and thus reduce the generation of incomplete clocks.

The frequency measuring section 548 measures frequency of a timing clock. The control section 546 generates a first control signal controlling a delay amount in the variable delay circuit 544 and a second control signal controlling a delay amount in the switch section 536 based on frequency of a timing clock to be expected and a relative phase of a sampling clock to be set.

The probability density function computing section 540 computes a probability density function of output data based on a data value sequentially latched in the latch section 538. For example, similarly to the bit error rate measuring apparatus 500 described in FIG. 36, it is possible to compute a probability density function with a jitter of output data by sequentially changing a relative phase of a timing clock for the output data. Moreover, similarly to the bit error rate measuring apparatus 500 described in FIG. 36, in the present example, the bit error rate measuring apparatus 500 may further include means for computing a probability density function with an amplitude degradation component.

The probability density function separating apparatus 542 is equal to the probability density function separating apparatus 100 described with reference to FIG. 29. That is to say, a deterministic component and a random component are separated from a given probability density function.

By such a configuration, it is also possible to generate a probability density function of given output data and separate a deterministic component from a random component in this probability density function. In other words, it is possible to simultaneously separate and analyze a bit error caused by a deterministic component and a bit error caused by a random component.

In addition, a configuration of the bit error rate measuring apparatus 500 is not limited to the configurations described in FIGS. 35 to 37. It is possible to simultaneously separate and measure a random component and a deterministic component of a probability density function corresponding to a bit error rate by adding a probability density function separating apparatus and a probability density function computing section to a configuration of a conventional bit error rate measuring apparatus.

Figure 38:
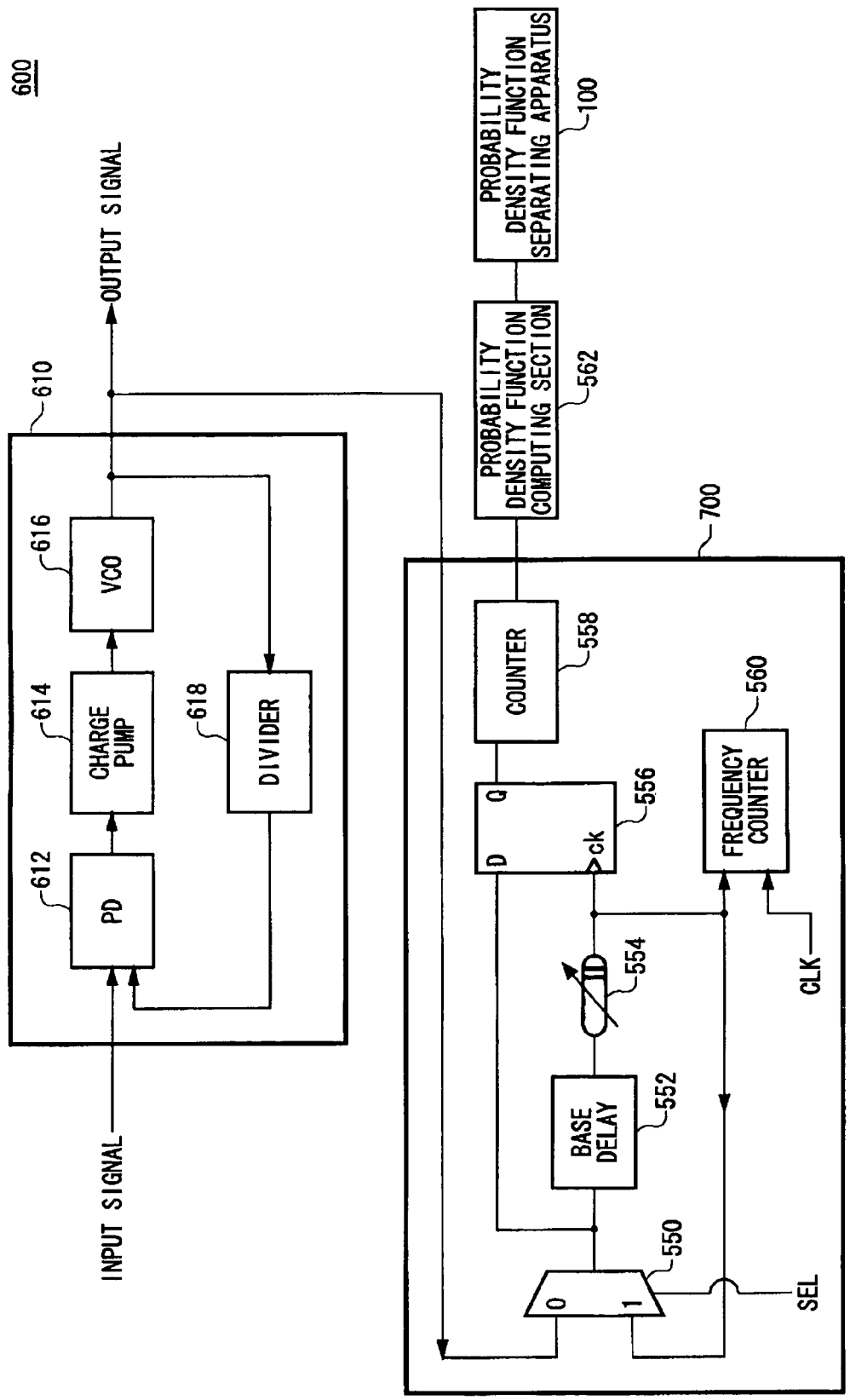
FIG. 38 is a view exemplary showing a configuration of an electronic device 600 according to an embodiment of the present invention.

FIG. 38 is a view exemplary showing a configuration of an electronic device 600 according to an embodiment of the present invention. The electronic device 600 may be a semiconductor chip for generating a predetermined signal. The electronic device 600 includes an operation circuit 610, a measurement circuit 700, a probability density function computing section 562, and a probability density function separating apparatus 100.

The operation circuit 610 outputs a predetermined signal according to a given input signal. In the present example, the operation circuit 610 is a PLL circuit having a phase comparator 612, a charge pump 614, a voltage controlled oscillator 616, and a divider 618. In addition, the operation circuit 610 is not limited to the PLL circuit.

The measurement circuit 700 has a selector 550, a base delay 552, a variable delay circuit 554, a flip-flop 556, a counter 558, and a frequency counter 560.

The selector 550 selects and outputs either of an output signal from the operation circuit 610 or a round loop signal output from the variable delay circuit 554. The base delay 552 delays the signal output from the selector 550 in a predetermined delay amount. Moreover, the variable delay circuit 554 delays the signal output from the base delay 552 in a set delay amount.

The flip-flop 556 samples a signal output from the selector 550 according to a signal output from the variable delay circuit 554. The flip-flop 556 can sample the signal output from the selector 550 at a desired phase by controlling a delay amount in the variable delay circuit 554.

The counter 558 counts the number of times by which data output from the flip-flop 556 show a predetermined logical value. When the selector 550 selects an output signal from the operation circuit 610, it is possible to obtain an existing probability of an edge at each phase of the output signal from the operation circuit 610 by changing a delay amount in the variable delay circuit 554.

The probability density function computing section 562 computes a probability density function of an output signal based on the counted result output from the counter 558. The probability density function computing section 562 may compute a probability density function in an operation similar to that of the probability density function computing section 232 described in FIG. 33.

The probability density function separating apparatus 100 separates a predetermined component from a probability density function computed from the probability density function computing section 562. The probability density function separating apparatus 100 may have the same or similar function and configuration as or to those of the probability density function separating apparatus 100 described with reference to FIGS. 1 to 27. Moreover, the probability density function separating apparatus 100 in the present example may include a part of a configuration of the probability density function separating apparatus 100 described with reference to FIGS. 1 to 27. For example, the probability density function separating apparatus 100 may output standard deviation of a random component or a peak to peak value of a deterministic component detected from the standard deviation computing section 120 or the peak to peak value detecting section 140 to an external apparatus, without including the random component computing section 130 or the deterministic component computing section 150 described in FIG. 1.

By such a configuration, it is possible to separate a predetermined component from a probability density function of a signal output from the operation circuit 610 by a circuit provided in a chip including the operation circuit 610. It is possible to obtain standard deviation of a random component of a signal output from the operation circuit 610 with high precision without receiving an influence of a deterministic component depending on the base delay 552 and the variable delay circuit 554. In this way, it is possible to easily perform analysis of the operation circuit 610.

Moreover, when the selector 550 selects an output signal from the variable delay circuit 554, the output signal from the variable delay circuit 554 is input into the base delay 552 by round looping. The frequency counter 560 measures frequency of a pulse signal by counting pulse signals transmitting this loop within a predetermined period. Since this frequency varies with a delay amount set in the variable delay circuit 554, a delay amount in the variable delay circuit 554 can be measured by measuring this frequency.

Figure 39:
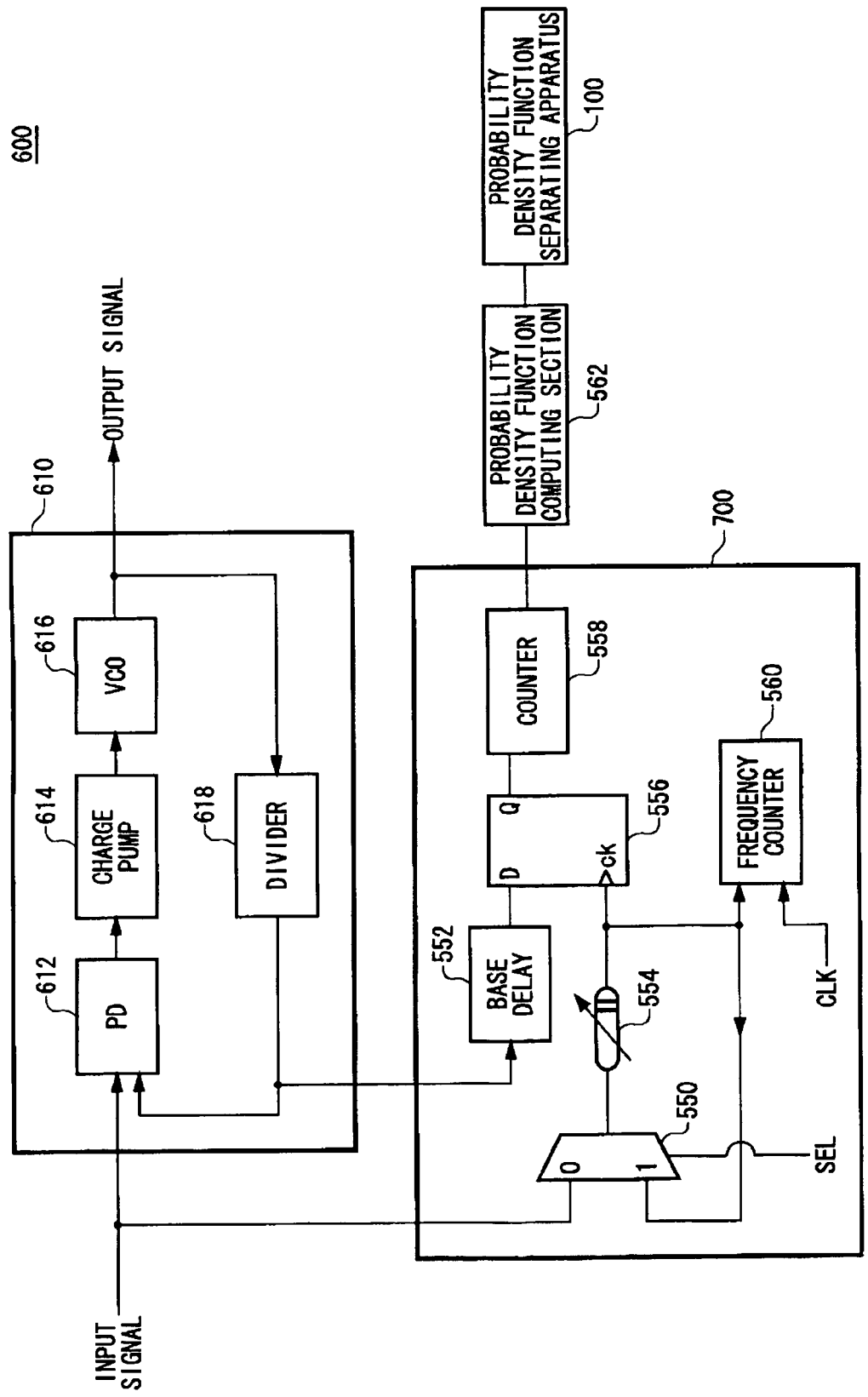
FIG. 39 is a view showing another example of a configuration of an electronic device 600.

FIG. 39 is a view showing another example of a configuration of the electronic device 600. The electronic device 600 in the present example includes the same components as those of the electronic device 600 described in FIG. 38. However, connection relation between components is different.

In the present example, the selector 550 receives an input signal being split from the input into the operation circuit 610. The selector 550 selects and outputs either of this input signal or an output signal from the variable delay circuit 554.

Moreover, the base delay 552 is provided between the operation circuit 610 and the flip-flop 556. In the present example, the base delay 552 delays a signal output from the divider 618, and inputs it into the flip-flop 556.

By such a configuration, similarly to the electronic device 600 described in FIG. 38, it is possible to compute a probability density function of a signal generated from the operation circuit 610. Moreover, it is possible to separate a predetermined component from this probability density function. It is possible to obtain standard deviation of a random component of a signal output from the operation circuit 610 with high precision, without receiving an influence of a deterministic component depending on the base delay 552 and the variable delay circuit 554.

In addition, a configuration of the measurement circuit 700 is not limited to a configuration described in FIG. 38 or 39. The measurement circuit 700 can adopt various configurations. For example, the measurement circuit 700 may have a configuration similar to that of the testing apparatus 300 described in FIG. 33, or may have a configuration similar to that of the bit error rate measuring apparatus 500 described in FIGS. 35 to 37.

Moreover, the probability density function separating apparatus 100 described above may input a high-purity signal into a circuit to be measured and compute a probability density function of a signal output from the circuit to be measured. A high-purity signal is, e.g., a signal of which a noise component is sufficiently small for a signal component.

Moreover, the probability density function separating apparatus 100 may input a signal of which a component such as jitter or amplitude degradation is known into a circuit to be measured. That is to say, a signal of which a random component of a probability density function is known may be input into a circuit to be measured. In this case, the probability density function separating apparatus 100 may separate the random component of the probability density function of the signal output from the circuit to be measured. Then, the random component generated in the circuit to be measured may be computed by comparing a random component of an input signal and a random component of an output signal.

Any probability density function separating apparatus 100 included in the testing apparatus 200, the bit error rate measuring apparatus 500, or the electronic device 600 may have this function.

Figure 40:
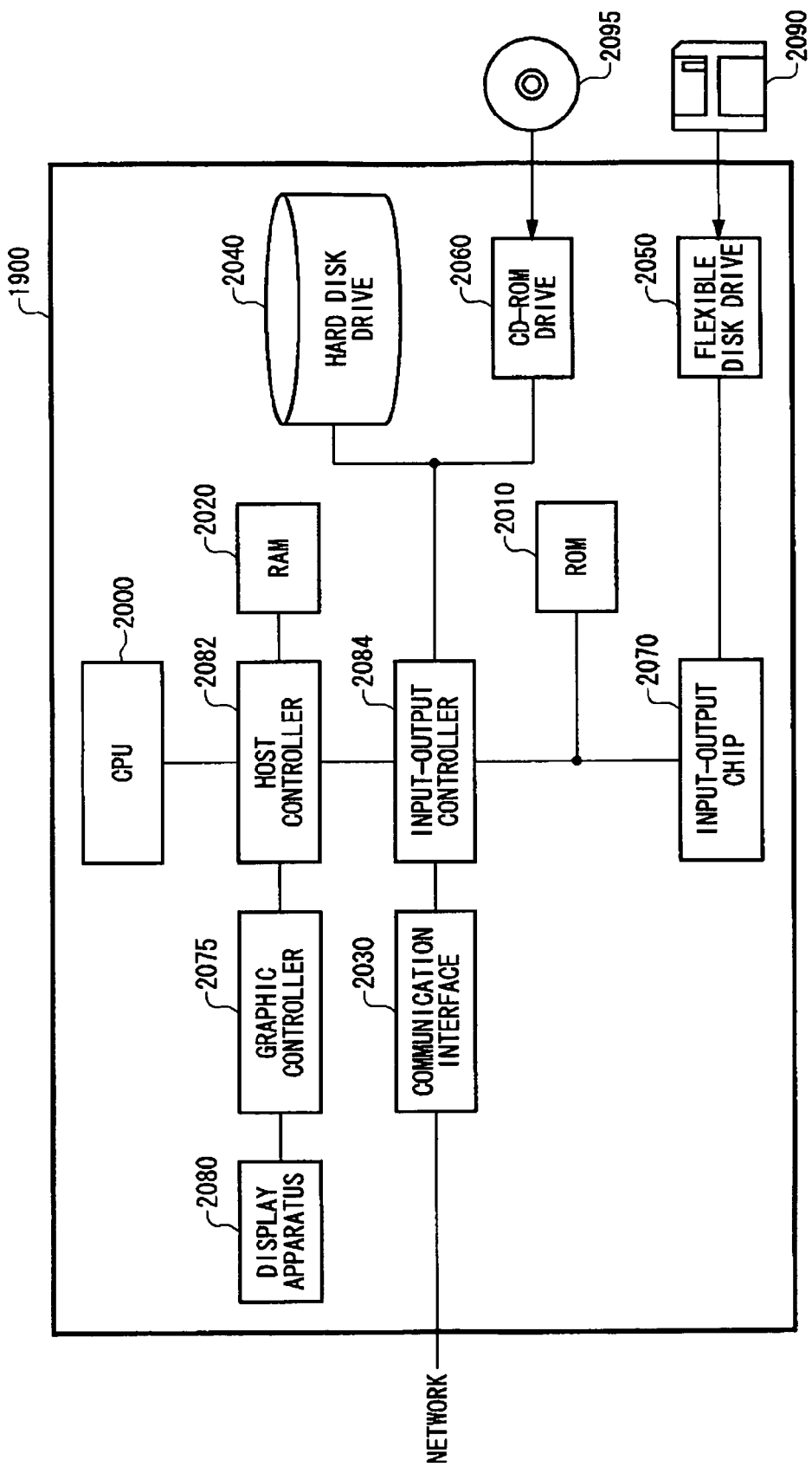
FIG. 40 is a view exemplary showing a hardware configuration of a computer 1900 according to the present embodiment.

FIG. 40 is a view exemplary showing a hardware configuration of a computer 1900 according to the present embodiment. The computer 1900 functions as the probability density function separating apparatus 100, the jitter separating apparatus 200, the computing apparatus, the testing apparatus 300, or the bit error rate measuring apparatus 500 described in FIGS. 1 to 39, based on a given program. For example, when the computer 1900 functions as the probability density function separating apparatus 100, the program may make the computer 1900 function as each component of the probability density function separating apparatus 100 described with reference to FIGS. 1 to 24. Moreover, when the computer 1900 functions as the noise separating apparatus 200, the program may make the computer 1900 function as each component of the noise separating apparatus 200 described with reference to FIGS. 25 to 32.

Moreover, when the computer 1900 functions as the computing apparatus, the program may make the computer 1900 function as a computing apparatus including the time domain computing section 138 described in FIGS. 11 and 12. For example, when the computer 1900 functions as the computing apparatus that directly computes a probability density function in a time domain of a random component from a Gaussian curve in a frequency domain, the program may make the computer 1900 function as each component of the random component computing section 130 described in FIG. 9. Moreover, when the computer 1900 functions as the computing apparatus that computes a waveform in a time domain from a spectrum in an arbitrary frequency domain, the program may make the computer 1900 function as the time domain computing section 138 and the frequency domain measuring section described with reference to FIG. 12.

Moreover, this program may make the computer 1900 function as the probability density function computing section and the probability density function separating apparatus 100 described in FIGS. 33 to 39.

The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are interconnected by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 that access the RAM 2020 at high transfer rate. The CPU 2000 operates based on a program stored on the ROM 2010 and the RAM 2020, and controls each section. The graphic controller 2075 acquires image data to be generated by the CPU 2000 on a frame buffer provided in the RAM 2020, and displays the data on the display apparatus 2080. Alternatively, the graphic controller 2075 may include therein a frame buffer for storing image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with other apparatuses via network. The hard disk drive 2040 stores a program and data to be used by the CPU 2000 within the computer 1900. The CD-ROM drive 2060 reads a program or data from a CD-ROM 2095, and provides it to the hard disk drive 2040 via the RAM 2020.

Moreover, the ROM 2010 and the flexible disk drive 2050 and the input-output chip 2070 that are a comparatively low-speed input-output apparatus are connected to the input-output controller 2084. The ROM 2010 stores a boot program to be executed by the computer 1900 on starting and a program or the like dependent on hardware of the computer 1900. The flexible disk drive 2050 reads a program or data from a flexible disk 2090, and provides it to the hard disk drive 2040 via the RAM 2020. The input-output chip 2070 connects a various types of input-output apparatuses via the flexible disk drive 2050 and a parallel port, a serial port, a keyboard port, a mouse port, or the like.

A program provided to the hard disk drive 2040 via the RAM 2020 is stored on the flexible disk 2090, the CD-ROM 2095, or a recording medium such as an IC card, to be provided by a user. A program is read from a recording medium, is installed in the hard disk drive 2040 within the computer 1900 via the RAM 2020, and is executed in the CPU 2000.

This program is installed in the computer 1900. This program works on the CPU 2000 or the like, and makes the computer 1900 functions as the probability density function separating apparatus 100, the noise separating apparatus 200, the computing apparatus, the testing apparatus 300, or the bit error rate measuring apparatus 500, that are previously described.

A program described above may be stored on an outside recording medium. A recording medium can include an optical recording medium such as DVD and CD, a magneto-optical recording medium such as MO, a tape medium, a semiconductor memory such as an IC card in addition to the flexible disk 2090 and the CD-ROM 2095. Moreover, a storage device such as a hard disk or a RAM provided in a server system connected to a private communication network and Internet may be used as a recording medium, and a program may be provided to the computer 1900 via a network.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to separate a random component and a deterministic component from a given probability density function with high precision.

What is claimed is:

1. A probability density function separating apparatus that separates a predetermined component in a given probability density function, comprising:
   a domain transforming section configured and arranged to receive the probability density function and transform the probability density function into a spectrum in a frequency domain; and
   a deterministic component computing section that multiplies a multiplier coefficient according to a type of distribution of a deterministic component included in the given probability density function by a first null frequency of the spectrum in the frequency domain to thereby compute a peak to peak value of the probability density function with the deterministic component.

2. The probability density function separating apparatus as claimed in claim 1, wherein the probability density function separating apparatus is configured to previously store the multiplier coefficient for every type of distribution of the deterministic component and compute the peak to peak value by means of the multiplier coefficient corresponding to the reported type of distribution of the deterministic component.

3. The probability density function separating apparatus as claimed in claim 1, further comprising a standard deviation computing section that computes standard deviation of a random component included in the probability density function based on the spectrum.

4. The probability density function separating apparatus as claimed in claim 3, wherein the standard deviation computing section computes the standard deviation based on a magnitude of a predetermined frequency component of the spectrum.

5. The probability density function separating apparatus as claimed in claim 4, wherein the standard deviation computing section computes the standard deviation based on a ratio between a magnitude of a first frequency component and a magnitude of a second frequency component of the spectrum.

6. The probability density function separating apparatus as claimed in claim 5, wherein the standard deviation computing section calculates a value obtained by dividing the ratio between the magnitude of the first frequency component and the magnitude of the second frequency component of the spectrum by a ratio between a magnitude of the first frequency component and a magnitude of the second frequency component of a spectrum of the deterministic component, and computes the standard deviation based on this value.

7. The probability density function separating apparatus as claimed in any one of claims 3 to 6, further comprising a random component computing section that computes a probability density function of a random component based on the standard deviation.

8. The probability density function separating apparatus as claimed in claim 7, wherein
the deterministic component computing section comprises:
a candidate value computing section that previously stores the multiplier coefficient every type of distribution of the deterministic component and computes each peak to peak value when each multiplier coefficient is used;
a candidate function computing section that respectively computes a probability density function with the deterministic component based on each peak to peak value computed from the candidate value computing section;
a synthesizing section that respectively generates composite probability density functions made by respectively synthesizing each probability density function with the deterministic component computed from the candidate function computing section and the probability density function with the random component computed from the random component computing section; and
a selecting section that compares each composite probability density function generated from the synthesizing section with the given probability density function and selects one peak to peak value from the plurality of peak to peak values computed from the candidate value computing section based on the comparison result.

9. The probability density function separating apparatus as claimed in claim 1, wherein the deterministic component computing section detects the first null frequency of the spectrum based on a peak of a waveform obtained by second-order differentiating the spectrum output from the domain transforming section by frequency.

10. A probability density function separating apparatus that separates a predetermined component from a given probability density function, comprising:
a domain transforming section that is supplied with the probability density function and transforms the probability density function into a spectrum in a frequency domain;
a standard deviation computing section that computes standard deviation of a random component included in the probability density function based on the spectrum;
a random component computing section that computes an absolute value (Magnitude Spectra) of a probability density function in a frequency domain with a random component based on the standard deviation; and
a deterministic component computing section that divides the spectrum transformed by the domain transforming section by the absolute value of the probability density function in the frequency domain with the random component computed from the random component computing section and computes a deterministic component included in the given probability density function.

11. The probability density function separating apparatus as claimed in claim 10, wherein the deterministic component computing section divides the spectrum transformed by the domain transforming section by the absolute value of the probability density function in the frequency domain with the random component computed from the random component computing section and transforms a spectrum in a predetermined frequency range into a function in a time domain among the division results, in order to compute a probability density function in a time domain with the deterministic component.

12. A probability density function separating method for separating a predetermined component from a given probability density function, comprising:
a domain transforming step of being supplied with the probability density function and transforming the probability density function into a spectrum in a frequency domain; and
a deterministic component computing step of multiplying a multiplier coefficient according to a type of distribution of a deterministic component included in the given probability density function by a first null frequency of the spectrum in the frequency domain to thereby compute a peak to peak value of the probability density function with the deterministic component.

13. The probability density function separating method as claimed in claim 12, further comprising a standard deviation computing step of computing standard deviation of a random component included in the probability density function based on the spectrum.

14. A probability density function separating method for separating a predetermined component from a given probability density function, comprising:
a domain transforming step of being supplied with the probability density function and transforming the probability density function into a spectrum in a frequency domain;
a standard deviation computing step of computing standard deviation of a random component included in the probability density function based on the spectrum;
a random component computing step of computing an absolute value (Magnitude Spectra) of a probability density function in a frequency domain with a random component based on the standard deviation; and
a deterministic component computing step of dividing the spectrum transformed in the domain transforming step by the absolute value of the probability density function in the frequency domain with the random component computed in the random component computing step and computing a deterministic component included in the given probability density function.

15. A program which when executed by a computer causes it to function as a probability density function separating apparatus that separates a predetermined component from a given probability density function, the program making the computer function as:
a domain transforming section that is supplied with the probability density function and transforms the probability density function into a spectrum in a frequency domain; and
a deterministic component computing section that multiplies a multiplier coefficient according to a type of distribution of a deterministic component included in the given probability density function by a first null frequency of the spectrum in the frequency domain to thereby compute a peak to peak value of the probability density function with the deterministic component.

16. The program as claimed in claim 15, the program further making the computer function as a standard deviation computing section that computes standard deviation of a random component included in the probability density function based on the spectrum.

17. The program as claimed in claim 16, the program making the computer function as the standard deviation computing section that calculates a value obtained by dividing a ratio between a magnitude of the first frequency component and a magnitude of the second frequency component of the spectrum by a ratio between a magnitude of the first frequency component and a magnitude of the second frequency component of a spectrum of the deterministic component and computes the standard deviation based on this value.

18. A program making a computer function as a probability density function separating apparatus that separates a predetermined component from a given probability density function, the program making the computer function as:
a domain transforming section that is supplied with the probability density function and transforms the probability density function into a spectrum in a frequency domain;
a standard deviation computing section that computes standard deviation of a random component included in the probability density function based on the spectrum;
a random component computing section that computes an absolute value (Magnitude Spectra) of a probability density function in a frequency domain with a random component based on the standard deviation; and
a deterministic component computing section that divides the spectrum transformed by the domain transforming section by the absolute value of the probability density function in the frequency domain with the random component computed from the random component computing section and computes a deterministic component included in the given probability density function.

19. A testing apparatus that tests a device under test, comprising:
a level comparing section that compares a level of an output signal output from the device under test with a given reference value and outputs a comparison result;
a timing comparing section that samples the comparison result according to a given timing signal and converts the sampled result into digital data;
a probability density function computing section that computes a probability density function of the output signal based on the digital data; and
a probability density function separating apparatus that separates a predetermined component from the probability density function, wherein
the probability density function separating apparatus comprises:
a domain transforming section that is supplied with the probability density function and transforms the probability density function into a spectrum in a frequency domain; and
a deterministic component computing section that multiplies a multiplier coefficient according to a type of distribution of a deterministic component included in the given probability density function by a first null frequency of the spectrum in the frequency domain to thereby compute a peak to peak value of the probability density function with the deterministic component.

20. The testing apparatus as claimed in claim 19, wherein the probability density function separating apparatus further comprises a standard deviation computing section that computes standard deviation of a random component included in the probability density function based on the spectrum.

21. The testing apparatus as claimed in claim 20, wherein the standard deviation computing section calculates a value obtained by dividing a ratio between a magnitude of the first frequency component and a magnitude of the second frequency component of the spectrum by a ratio between a magnitude of the first frequency component and a magnitude of the second frequency component of a spectrum of the deterministic component and computes the standard deviation based on this value.

22. The testing apparatus as claimed in claim 19, wherein the level comparing section is supplied with the reference value with a constant value,
the timing comparing section samples the comparison result according to the timing signal of which a phase for the output signal is sequentially changed, and
the probability density function computing section computes a probability density function with a jitter component included in the output signal based on the digital data.

23. The testing apparatus as claimed in claim 19, wherein the level comparing section is sequentially supplied with the different reference values,
the timing comparing section samples the comparison result according to the timing signal substantially synchronized with the output signal, and
the probability density function computing section computes a probability density function with an amplitude degradation component of the output signal based on the digital data.

24. A bit error rate measuring apparatus that measures a bit error rate of output data from a device under test, comprising:
a sampling section that samples a data value of the output data according to a given timing signal;
an expected value comparing section that compares a sampling result by the sampling section with a given expected value;
a probability density function computing section that computes a probability density function of the output data based on the comparison result by the expected value comparing section; and
a probability density function separating apparatus that separates a predetermined component from the probability density function, wherein
the probability density function separating apparatus comprises:
a domain transforming section that is supplied with the probability density function and transforms the probability density function into a spectrum in a frequency domain; and
a deterministic component computing section that multiplies a multiplier coefficient according to a type of distribution of a deterministic component included in the given probability density function by a first null frequency of the spectrum in the frequency domain and thereby computes a peak to peak value of the probability density function with the deterministic component.

25. The bit error rate measuring apparatus as claimed in claim 24, wherein the probability density function separating apparatus further comprises a standard deviation computing section that computes standard deviation of a random component included in the probability density function based on the spectrum.

26. A testing apparatus that tests a device under test, comprising:
- a level comparing section that compares a level of an output signal output from the device under test with a given reference value and outputs a comparison result;
- a timing comparing section that samples the comparison result according to a given timing signal and converts the sampled result into digital data;
- a probability density function computing section that computes a probability density function of the output signal based on the digital data; and
- a probability density function separating apparatus that separates a predetermined component from the probability density function, wherein the probability density function separating apparatus comprises:
- a domain transforming section that is supplied with the probability density function and transforms the probability density function into a spectrum in a frequency domain;
- a standard deviation computing section that computes standard deviation of a random component included in the probability density function based on the spectrum;
- a random component computing section that computes an absolute value of a probability density function in a frequency domain with a random component based on the standard deviation; and
- a deterministic component computing section that divides the spectrum transformed by the domain transforming section by the absolute value of the probability density function in the frequency domain with the random component computed from the random component computing section and computes a deterministic component included in the given probability density function.

27. A bit error rate measuring apparatus that measures a bit error rate of output data from a device under test, comprising:
- a sampling section that samples a data value of the output data according to a given timing signal;
- an expected value comparing section that compares the sampling result by the sampling section with a given expected value;
- a probability density function computing section that computes a probability density function of the output data based on the comparison result by the expected value comparing section; and
- a probability density function separating apparatus that separates a predetermined component from the probability density function, wherein the probability density function separating apparatus comprises:
- a domain transforming section that is supplied with the probability density function and transforms the probability density function into a spectrum in a frequency domain;
- a standard deviation computing section that computes standard deviation of a random component included in the probability density function based on the spectrum;
- a random component computing section that computes an absolute value of a probability density function in a frequency domain with a random component based on the standard deviation; and
- a deterministic component computing section that divides the spectrum transformed by the domain transforming section by the absolute value of the probability density function in the frequency domain with the random component computed from the random component computing section and computes a deterministic component included in the given probability density function.

28. An electronic device that generates a predetermined signal, comprising:
- an operation circuit that generates the predetermined signal to output it;
- a probability density function computing section that measures the predetermined signal and computes a probability density function of the predetermined signal; and
- a probability density function separating apparatus that separates a predetermined component from the probability density function, wherein the probability density function separating apparatus comprises:
- a domain transforming section that is supplied with the probability density function and transforms the probability density function into a spectrum in a frequency domain; and
- a deterministic component computing section that multiplies a multiplier coefficient according to a type of distribution of a deterministic component included in the given probability density function by a first null frequency of the spectrum in the frequency domain to thereby compute a peak to peak value of the probability density function with the deterministic component.

29. The electronic device as claimed in claim 28, wherein the probability density function separating apparatus further comprises a standard deviation computing section that computes standard deviation of a random component included in the probability density function based on the spectrum.

* * * * *